(12) United States Patent
Moon et al.

(10) Patent No.: US 11,348,979 B2
(45) Date of Patent: May 31, 2022

(54) DISPLAY DEVICE

(71) Applicant: Samsung Display Co., Ltd., Yongin-si (KR)

(72) Inventors: Joong-Soo Moon, Hwaseong-si (KR);
Kwang-Min Kim, Seoul (KR);
Yangwan Kim, Hwaseong-si (KR);
Keunsoo Lee, Hwaseong-si (KR);
Youngjin Cho, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/792,264

(22) Filed: Feb. 16, 2020

(65) Prior Publication Data

US 2020/0295092 A1    Sep. 17, 2020

(30) Foreign Application Priority Data

Mar. 12, 2019  (KR) .................. 10-2019-0028412
Dec. 17, 2019  (KR) .................. 10-2019-0169084

(51) Int. Cl.
*G06F 3/044* (2006.01)
*H01L 27/32* (2006.01)
*H01L 51/50* (2006.01)

(52) U.S. Cl.
CPC .......... *H01L 27/323* (2013.01); *G06F 3/0443* (2019.05); *H01L 27/3276* (2013.01);
(Continued)

(58) Field of Classification Search
CPC .... G09G 3/2074; G09G 3/3607; G09G 3/364; G09G 2300/0439–0465; H01L 27/3276; H01L 51/5036; H01L 27/323; H01L 27/32–3297; H01L 27/3211–3218; G06F 2203/04112; G06F 3/0412; G06F 3/0446;
(Continued)

(56) References Cited

U.S. PATENT DOCUMENTS 9,971,467 B2    5/2018  Park et al.
10,114,491 B1 *  10/2018  Han ....................... G06F 3/0443
(Continued)

FOREIGN PATENT DOCUMENTS

CN    109659341 A  *  4/2019
EP    3441858         2/2019
(Continued)

OTHER PUBLICATIONS

Extended European Search Report dated Aug. 6, 2020 in European Patent Application 20161203.3.

*Primary Examiner* — Amr A Awad
*Assistant Examiner* — Aaron Midkiff
(74) *Attorney, Agent, or Firm* — H.C. Park & Associates, PLC

(57) ABSTRACT

A display device may include a display panel and an input sensor. Mesh lines of the input sensor may include first mesh lines extending in a first direction and second mesh lines extending in a second direction crossing the first direction. The first mesh lines and the second mesh lines may cross each other at a plurality of cross points. In a unit region of the sensing electrode, first cutting points may be defined in the first mesh lines and the second mesh lines, and second cutting points may be defined in the first mesh lines and the second mesh lines.

24 Claims, 37 Drawing Sheets

(52) U.S. Cl.
CPC ................................ *H01L 51/5036* (2013.01);
*G06F 2203/04111* (2013.01); *G06F 2203/04112* (2013.01)

(58) Field of Classification Search
CPC ......... G06F 3/0448; G06F 2203/04103; G06F 2203/04111; G06F 3/0443; G06F 3/0445; G06F 3/0444; G06F 2203/04107
See application file for complete search history.

(56) References Cited

U.S. PATENT DOCUMENTS

| | | | |
|---|---|---|---|
| 2013/0234917 A1* | 9/2013 | Lee | H01L 27/3218 345/82 |
| 2016/0117031 A1* | 4/2016 | Han | G06F 3/0443 345/174 |
| 2017/0139509 A1* | 5/2017 | Nishioka | G06F 3/0445 |
| 2017/0336907 A1 | 11/2017 | Jeong et al. | |
| 2018/0190723 A1* | 7/2018 | Han | H01L 27/323 |
| 2019/0050104 A1 | 2/2019 | Na et al. | |
| 2019/0051711 A1 | 2/2019 | Lee et al. | |
| 2019/0179466 A1* | 6/2019 | Kim | G06F 3/0416 |
| 2019/0346972 A1* | 11/2019 | Wang | G06F 3/0443 |
| 2020/0194506 A1* | 6/2020 | Li | G06F 3/0446 |

FOREIGN PATENT DOCUMENTS

| | | |
|---|---|---|
| KR | 10-2018-0000040 | 1/2018 |
| KR | 10-2018-0128672 | 12/2018 |
| KR | 10-2018-0134800 | 12/2018 |

\* cited by examiner

DISPLAY DEVICE

CROSS-REFERENCE TO RELATED APPLICATIONS

This application claims priority from and the benefit of Korean Patent Application No. 10-2019-0028412, filed on Mar. 12, 2019, and Korean Patent Application No. 10-2019-0169084, filed on Dec. 17, 2019, which are hereby incorporated by reference for all purposes as if fully set forth herein.

BACKGROUND

Field

Exemplary embodiments of the invention relate generally to a display device, and more specifically, to a display device including an input sensor.

Discussion of the Background

Various display devices are being developed for use in multimedia devices, such as televisions, mobile phones, tablet computers, navigation systems, and gaming machines. A keyboard or a mouse is used as an input device of the display device. In addition, an input sensor, such as a touch panel is also used as the input device of the display devices.

The above information disclosed in this Background section is only for understanding of the background of the inventive concepts, and, therefore, it may contain information that does not constitute prior art.

SUMMARY

Devices constructed according to exemplary embodiments of the invention are capable of providing a display device including an input sensor having reduced visibility variation in response to viewing angle.

Additional features of the inventive concepts will be set forth in the description which follows, and in part will be apparent from the description, or may be learned by practice of the inventive concepts.

According to one or more exemplary embodiments of the invention, a display device includes: a display panel including a plurality of emission regions including first color emission regions, second color emission regions, and third color emission regions; and an input sensor disposed on the display panel, the input sensor including a sensing electrode including mesh lines defining a plurality of mesh openings, the mesh lines including: first mesh lines extending in a first direction; second mesh lines extending in a second direction crossing the first direction, the second mesh lines crossing the first mesh lines at a plurality of cross points; and a plurality of cutting points from which a portion of the mesh line is removed, the plurality of cutting points including: first cutting points disposed between the first color emission regions and the third color emission regions; and second cutting points disposed between the second color emission regions and the third color emission regions, wherein the plurality of mesh openings include first mesh openings corresponding to the first color emission regions, second mesh openings corresponding to the second color emission regions, and third mesh openings corresponding to the third color emission regions, and wherein, in a unit region of the sensing electrode, the first cutting points are defined in the first mesh lines and the second mesh lines and the second cutting points are defined in the first mesh lines and the second mesh lines.

In the unit region of the sensing electrode, a number of the first cutting points defined in the first mesh lines may be equal to a number of the first cutting points defined in the second mesh lines.

The plurality of emission regions may include: an nth emission row extending in a third direction; an (n+1)-th emission row extending in the third direction; an (n+2)-th emission row extending in the third direction; and an (n+3)-th emission row extending in the third direction, where n may be a natural number, wherein the nth emission row, the (n+1)-th emission row, the (n+2)-th emission row, and the (n+3)-th emission row may be arranged in a fourth direction crossing the third direction, wherein in the n-th emission row, the first color emission regions and the second color emission regions may be alternately disposed in a third direction, in the (n+2)-th emission row, the first color emission regions and the second color emission regions may be alternately disposed in the third direction, an order of the emission regions disposed in the n-th emission row may be different from an order of the emission regions disposed in the (n+2)-th emission row, and the third color emission regions may be disposed in each of the (n+1)-th emission row and the (n+3)-th emission row.

The emission regions of the n-th emission row and the emission regions of the (n+1)-th emission row may be disposed in a staggered manner with respect to each other, the emission regions of the (n+2)-th emission row and the emission regions of the (n+3)-th emission row may be disposed in a staggered manner with respect to each other, the emission regions of the n-th emission row and the emission regions of the (n+2)-th emission row may be disposed in a staggered manner with respect to each other, and the emission regions of the (n+1)-th emission row and the emission regions of the (n+3)-th emission row may be disposed to correspond to each other.

The third color emission regions may include first-shaped emission regions and second-shaped emission regions, which have a shape different from the first-shaped emission regions, in the (n+1)-th emission row, the first-shaped emission regions and the second-shaped emission regions may be alternately disposed in the third direction, in the (n+3)-th emission row, the first-shaped emission regions and the second-shaped emission regions may be alternately disposed in the third direction, and a disposition order of the emission regions of the (n+1)-th emission row may be different from a disposition order of the emission regions of the (n+3)-th emission row.

The unit region of the sensing electrode may be divided into a first sub-region, a second sub-region, a third sub-region, and a fourth sub-region, wherein each of the first sub-region, the second sub-region, the third sub-region, and the fourth sub-region may include emission regions, which may be arranged to form a k-by-k matrix, wherein the k-by-k matrix may be defined based on the first direction and the second direction, and wherein the k may be a natural number coprime to 4.

The third color emission region may be disposed at a center of the first sub-region and the second sub-region, wherein the first color emission region may be disposed at a center of the third sub-region, and wherein the second color emission region may be disposed at a center of the fourth sub-region.

The first sub-region and the second sub-region may be disposed to face each other in the third or fourth direction, wherein, in the first sub-region, the first cutting points may be defined in the second mesh lines and the second cutting points may be defined in the first mesh lines, and wherein, in the second sub-regions, the first cutting points may be defined in the first mesh lines and the second cutting points may be defined in the second mesh lines.

In the third sub-region, the first cutting points may be defined in the first mesh lines and the second mesh lines, and wherein, in the fourth sub-region, the second cutting points may be defined in the first mesh lines and the second mesh lines.

The number k may be 3, and wherein the number of the cutting points defined in each of the first sub-region, the second sub-region, the third sub-region, and the fourth sub-region, may be 4.

The number k may be 5, and wherein the number of the cutting points defined in each of the first sub-region, the second sub-region, the third sub-region, and the fourth sub-region, may be 12 or 16.

A first area of the first color emission regions may be larger than a second area of the second color emission regions and a third area of the third color emission regions in plan view, and wherein the second area of the second color emission regions may be larger than the third area of the third color emission regions in the plan view.

The third color emission regions may include first-shaped emission regions and second-shaped emission regions, the second-shaped emission regions having a shape different from the first-shaped emission regions.

The first-shaped emission regions and the second-shaped emission regions have substantially the same area in plan view.

The first mesh openings have an area larger than the second mesh openings and the third mesh openings in the plan view, and the second mesh openings have an area larger than the third mesh openings in the plan view.

The input sensor may further include an auxiliary electrode disposed inside the sensing electrode in a plan view, the auxiliary electrode being electrically disconnected to the sensing electrode.

The input sensor may be disposed directly on the display panel.

According to one or more exemplary embodiments of the invention, a display panel includes: a plurality of emission rows extending in a first direction and arranged in a second direction crossing the first direction, the plurality of emission rows including: first color emission regions; second color emission regions; and third color emission regions; and an input sensor disposed on the display panel, the input sensor including a sensing electrode including: first mesh lines extending in the first direction; second mesh lines extending in the second direction, the second mesh line crossing the first mesh lines at a plurality of cross points, defining a plurality of mesh openings; and a plurality of cutting points defined in the first and second mesh lines, from which a portion of the first or second mesh line is removed, the plurality of cutting points including: first cutting points disposed between the first color emission region and the third color emission regions; and second cutting points disposed between the second color emission region and the third color emission regions, wherein the plurality of mesh openings includes: first mesh openings corresponding to the first color emission regions; second mesh openings corresponding to the second color emission regions; and third mesh openings corresponding to the third color emission regions, wherein the sensing electrode is divided into a plurality of unit regions, and wherein, in each of the plurality of unit regions, the first cutting points is defined in the first mesh lines and the second mesh lines and the second cutting points may be defined in the first mesh lines and the second mesh lines.

The plurality of emission rows may include: an odd-numbered emission row; and an even-numbered emission row, in the odd-numbered emission row, the first color emission regions and the third color emission regions may be alternately disposed, and in the even-numbered emission row, the second color emission regions and the third color emission regions may be alternately disposed.

The third color emission regions of the odd-numbered emission row and the third color emission regions of the even-numbered emission row may be disposed in a staggered manner with respect to each other.

The third color emission regions of the odd-numbered emission row and the third color emission regions of the even-numbered emission row have shapes different from each other.

The sensing electrode may extend in a third direction crossing the first direction and the second direction.

According to one or more exemplary embodiments of the invention, a display device includes: a display panel; and an input sensor disposed on the display panel, the input sensor including a sensing electrode including first mesh lines and second mesh lines respectively extending in a first direction and a second direction crossing the first direction, wherein the first mesh lines and the second mesh lines cross each other at a plurality of cross points, defining a plurality of mesh openings, wherein the plurality of mesh openings includes: first mesh openings; second mesh openings having areas different from the first mesh openings; and third mesh openings having areas different from the first mesh openings and the second mesh openings, wherein the first mesh lines and the second mesh lines include a plurality of cutting points defined by removing a portion of the first or second mesh line, wherein the plurality of cutting points includes: first cutting points disposed between the first mesh openings and the third mesh openings; and second cutting points disposed between the second mesh openings and the third mesh openings, and wherein, in a unit region of the sensing electrode, the first cutting points may be defined in the first mesh lines and the second mesh lines and the second cutting points may be defined in the first mesh lines and the second mesh lines.

According to one or more exemplary embodiments of the invention, a display device includes: a display panel including a plurality of emission rows extending in a first direction and arranged in a second direction crossing the first direction, the plurality of emission rows including: first color emission regions; second color emission regions; and third color emission regions; and an input sensor disposed on the display panel, the input sensor including a sensing electrode including: first mesh lines extending in the first direction; second mesh lines extending in the second direction, the second mesh lines crossing the first mesh lines at a plurality of cross points, defining a plurality of mesh openings; and a plurality of cutting points defined in the first mesh lines and the second mesh lines, from which a portion of the first or second mesh line may be removed, the plurality of cutting points including: first cutting points disposed between the first color emission region and the third color emission regions; and second cutting points disposed between the second color emission region and the third color emission regions, wherein the plurality of mesh openings includes: first mesh openings corresponding to the first color emission regions; second mesh openings corresponding to the second color emission regions; and third mesh openings corresponding to the third color emission regions, wherein the sensing electrode includes a first unit region and a second unit region, the first unit region and the second unit region having the same area in a plan view, and wherein, in each of the first unit region and the second unit region, the first cutting points may be defined in the first mesh lines and the second mesh lines, and the second cutting points may be defined in the first mesh lines and the second mesh lines.

The sensing electrode may extend in the first direction or the second direction.

The sensing electrode may be provided in plural, and a border line between two adjacent sensing electrodes of the plurality of sensing electrodes may extend in a direction substantially crossing the first direction and the second direction.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
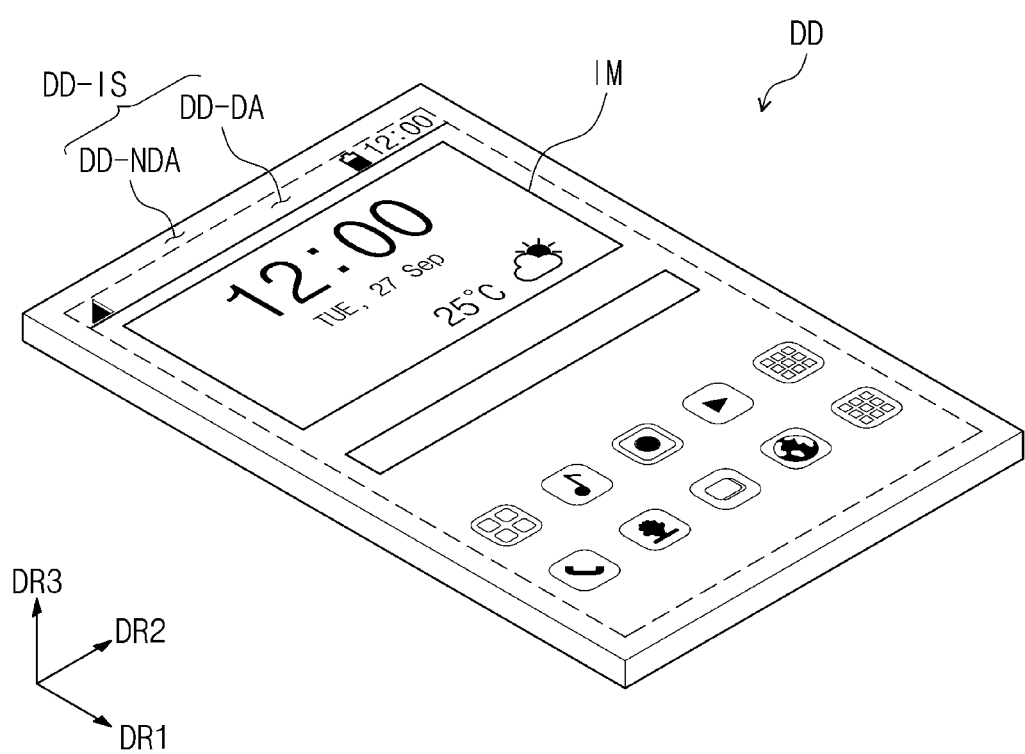
FIG. 1 is a perspective view illustrating a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. Furthermore, the first and second crossing directions CDR1 and CDR2 may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view illustrating a display device DD according to an exemplary embodiment. As shown in FIG. 1, the display device DD may include a display surface DD-IS, which is used to display an image IM. The display surface DD-IS may be defined to be parallel to a first direction axis DR1 and a second direction axis DR2. A direction normal to the display surface DD-IS (i.e., a thickness direction of the display device DD) will be referred to as a third direction axis DR3.

In the following description, the third direction axis DR3 may be used to differentiate a front or top surface of each element from a back or bottom surface. However, directions indicated by the first to third direction axes DR1, DR2, and DR3 may be just an example. Hereinafter, first to third directions may be directions indicated by the first to third direction axes DR1, DR2, and DR3, respectively, and will be identified with the same reference numbers.

In FIG. 1, the display device DD is illustrated to have a flat display surface DD-IS, but the exemplary embodiments are not limited thereto. The display surface DD-IS of the display device DD may have a curved or three-dimensional shape. In the case where the display device DD has the three-dimensional display surface DD-IS, the display surface DD-IS may include a plurality of display regions that are oriented in different directions. For example, the display device DD may have a display surface that is shaped like that of a polygonal pillar.

In the exemplary embodiment, the display device DD may be a rigid display device. However, the exemplary embodiments are not limited thereto, and in an exemplary embodiment, the display device DD may be a flexible display device. The flexible display device may include a foldable display device or a bendable display device with a bendable portion.

In the exemplary embodiment, the display device DD, which can be used for a cellphone terminal, is exemplarily illustrated. Although not shown, the cellphone terminal may further include an electronic module, a camera module, a power module, and so forth, which are mounted on a mainboard and are provided in a bracket or case, along with the display device DD. The display device DD may be used for large-sized electronic devices (e.g., television sets and monitors) or small- or medium-sized electronic devices (e.g., tablets, car navigation systems, game machines, and smart watches).

As shown in FIG. 1, the display surface DD-IS may include an image region DD-DA, which is used to display the image IM, and a bezel region DD-NDA, which is adjacent to the image region DD-DA. The bezel region DD-NDA may not be used to display an image. As an example of the image IM, icon images are shown in FIG. 1.

As shown in FIG. 1, the image region DD-DA may be substantially a rectangular or tetragonal shape. The expression "substantially rectangular or tetragonal shape" may refer to not only a rectangle shape in the mathematical context but also a rectangular or tetragonal shape whose vertex or corner has a rounded or curved shape, not a sharp shape.

The bezel region DD-NDA may enclose the image region DD-DA. However, the exemplary embodiments are not limited thereto, and in an exemplary embodiment, the image region DD-DA and the bezel region DD-NDA may be designed to have other shapes. The bezel region DD-NDA may be disposed near only one of sides of the image region DD-DA. The bezel region DD-NDA may not be exposed to the outside, depending on the connection structure between the display device DD and other elements of an electronic device.

FIGS. 2A, 2B, 2C, and 2D are sectional views each illustrating the display device DD according to an exemplary embodiment. FIGS. 2A, 2B, 2C, and 2D illustrate cross sections, which are parallel to a plane defined by the second direction axis DR2 and the third direction axis DR3. To provide better understanding of a stacking structure of the display device DD, the display device DD is illustrated in a simplified manner in FIGS. 2A, 2B, 2C, and 2D.

In an exemplary embodiment, the display device DD may include a display panel, an input sensor, an anti-reflector, and a window. At least two elements of the display panel, the input sensor, the anti-reflector, and the window may be formed by a successive process or may be combined with each other by an adhesive member. An adhesive member ADS may be a transparent adhesive member, such as a pressure sensitive adhesive (PSA) film, an optically clear adhesive (OCA) film, or an optically clear resin (OCR) film. In various embodiments to be described below, the adhesive member may be a typical adhesive material or a typical gluing agent. In an exemplary embodiment, the anti-reflector and the window may be replaced with other elements or may be omitted.

In FIGS. 2A, 2B, 2C, and 2D, if an element (e.g., one of the input sensor, the anti-reflector, and the window) is formed on another element through a successive process, the element will be referred to as a "layer". If an element (e.g., one of the input sensor, the anti-reflector, and the window) is combined with another element by an adhesive member, the element will be referred to as a "panel". The element described with the term "panel" may include a base layer (e.g., a synthetic resin film, a composite film, or a glass substrate) providing a base surface, whereas the element described with the term "layer" may not have the base layer. In other words, the element described with the term "layer" may be placed on a base surface that is provided by another element. Hereinafter, the input sensor, the anti-reflector, and the window may be referred to as an input-sensing panel ISP, an anti-reflection panel RPP, and a window panel WP or an input sensing layer ISL, an anti-reflection layer RPL, and a window layer WL, according to the presence or absence of the base layer.

Figure 2A:
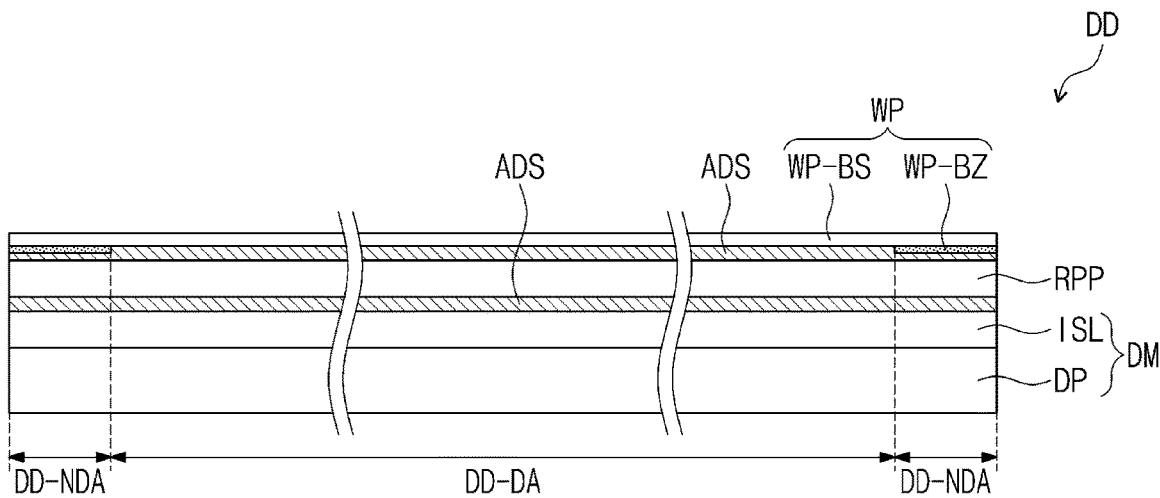
FIGS. 2A, 2B, 2C, and 2D are sectional views each illustrating a display device according to an exemplary embodiment.

As shown in FIG. 2A, the display device DD may include a display panel DP, an input sensing layer ISL, an anti-reflection panel RPP, and a window panel WP. The input sensing layer ISL may be directly disposed on the display panel DP. In the present specification, the expression "an element B may be directly disposed on an element A" means that any adhesive layer/member is not disposed between the elements A and B. In this case, the element B may be formed on a base surface, which is provided by the element A, through a successive process, after the formation of the element A.

The display panel DP and the input sensing layer ISL, which is directly disposed on the display panel DP, may be defined to as a display module DM. The adhesive member ADS may be disposed between the display module DM and the anti-reflection panel RPP and between the anti-reflection panel RPP and the window panel WP.

The display panel DP may generate an image, and the input sensing layer ISL may obtain information on coordinates of an external input (e.g., a touch event). Although not shown, the display module DM may further include a protection member disposed on a bottom surface of the display panel DP. The protection member and the display panel DP may be combined to each other by an adhesive member. The display devices DD, which will be described with reference to FIGS. 2B, 2C, and 2D, may also include the protection member.

According to an exemplary embodiment, the display panel DP may be a light-emitting type display panel, but the exemplary embodiments are not limited to a specific type of the display panel DP. For example, the display panel DP may be an organic light emitting display panel or a quantum dot light-emitting display panel. An emission layer of the organic light emitting display panel may be formed of or include an organic light emitting material. An emission layer of the quantum dot light-emitting display panel may include quantum dots and/or quantum rods. For the sake of simplicity, the description that follows will refer to an example in which the display panel DP is the organic light emitting display panel.

The anti-reflection panel RPP may reduce reflectance of an external light that is incident from an outer space to the window panel WP. In an exemplary embodiment, the anti-reflection panel RPP may include a phase retarder and a polarizer. The phase retarder may be of a film type or a liquid crystal coating type and may include a λ/2 phase retarder and/or a λ/4 phase retarder. The polarizer may also be of a film type or a liquid crystal coating type. The polarizer of the film type may include an elongated synthetic resin film, whereas the polarizer of the liquid crystal coating type may include liquid crystals arranged with a specific orientation. The phase retarder and the polarizer may further include a protection film. At least one of the phase retarder, the polarizer, or the protection film thereof may be defined as a base layer of the anti-reflection panel RPP.

In an exemplary embodiment, the anti-reflection panel RPP may include color filters. The color filters may have a specific orientation or arrangement. The arrangement of the color filters may be determined in consideration of colors of lights to be emitted from pixels in the display panel DP. The anti-reflection panel RPP may further include a black matrix adjacent to the color filters.

In an exemplary embodiment, the anti-reflection panel RPP may include a destructive interference structure. For example, the destructive interference structure may include a first reflection layer and a second reflection layer, which are provided on different layers. The first reflection layer and the second reflection layer may be configured to allow a first reflection light and a second reflection light, which are respectively reflected by them, to destructively interfere with each other, and this may make it possible to reduce reflectance of the external light.

In an exemplary embodiment, the window panel WP may include a base layer WP-BS and a light-blocking pattern WP-BZ. The base layer WP-BS may include a glass substrate and/or a synthetic resin film. The base layer WP-BS may not be limited to a single-layered structure. The base layer WP-BS may include two or more films that are combined to each other by an adhesive member.

The light-blocking pattern WP-BZ may be partially overlapped with the base layer WP-BS. The light-blocking pattern WP-BZ may be disposed on a rear surface of the base layer WP-BS to substantially define the bezel region DD-NDA of the display device DD. A region, on which the light-blocking pattern WP-BZ is not disposed, may define the image region DD-DA of the display device DD. If only the window panel WP is considered, a region, on which the light-blocking pattern WP-BZ is disposed, may be defined as a light-blocking region of the window panel WP, and a region, on which the light-blocking pattern WP-BZ is not disposed, may be defined as a transmission region of the window panel WP.

Figure 2B:
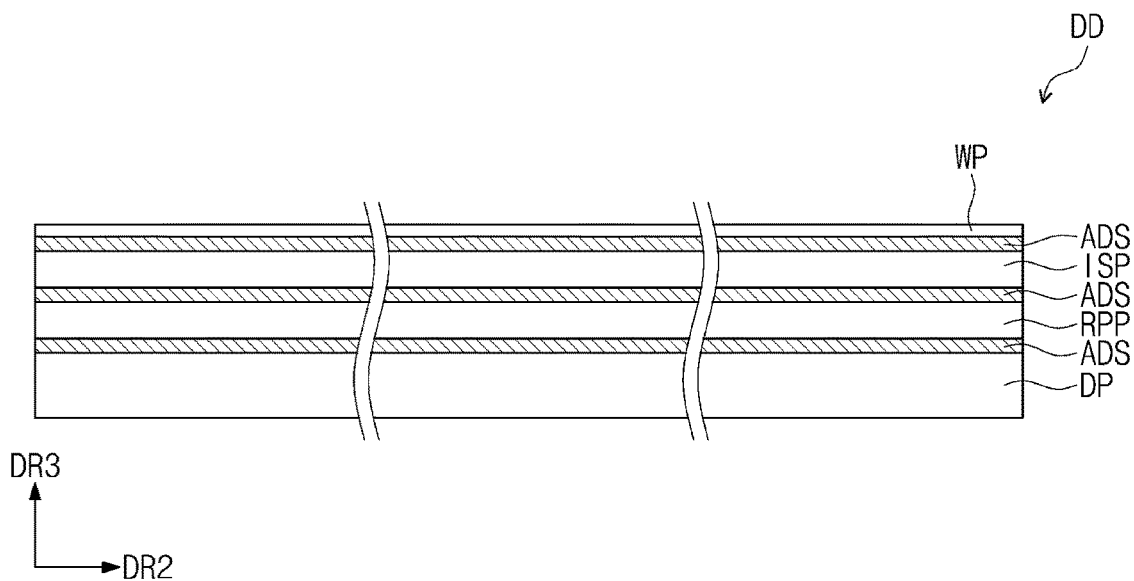
Figure 2C:
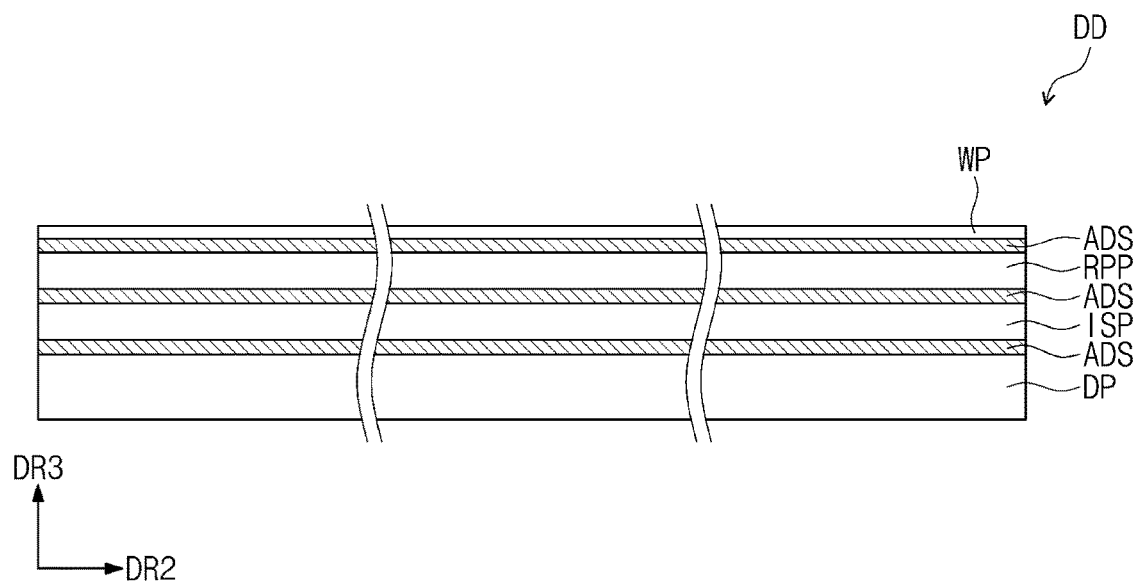
Figure 2D:
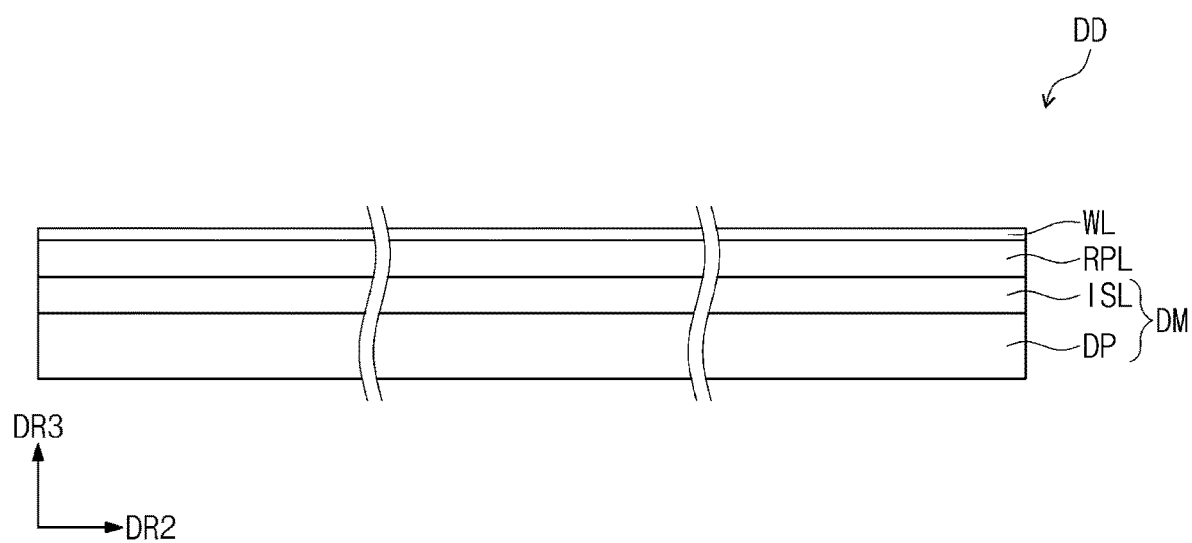

The light-blocking pattern WP-BZ may have a multi-layered structure. The multi-layered structure may include a multi-chromatic color layer and a mono-chromatic light-blocking layer (e.g., of black). The multi-chromatic color layer and the mono-chromatic light-blocking layer may be formed by one of deposition, printing, and coating processes. Although not shown, the window panel WP may further include a functional coating layer provided on the front surface of the base layer WP-BS. The functional coating layer may include an anti-fingerprint layer, an anti-reflection layer, a hard coating layer, and so forth. In FIGS. 2B, 2C, and 2D, the window panel WP and the window layer WL are illustrated in a simplified manner (e.g., without distinction of the base layer WP-BS and the light-blocking pattern WP-BZ).

As shown in FIGS. 2B and 2C, the display device DD may include the display panel DP, the input-sensing panel ISP, the anti-reflection panel RPP, and the window panel WP. A stacking order of the input-sensing panel ISP and the anti-reflection panel RPP may be changed.

As shown in FIG. 2D, the display device DD may include the display panel DP, the input sensing layer ISL, the anti-reflection layer RPL, and the window layer WL. In the display device DD of FIG. 2D, the adhesive member ADS may be omitted, and the input sensing layer ISL, the anti-reflection layer RPL, and the window layer WL may be formed on the base surface, which is provided by the display panel DP, by a successive process, when compared with the display device DD shown in FIG. 2A. A stacking order of the input sensing layer ISL and the anti-reflection layer RPL may be changed.

Figure 3A:
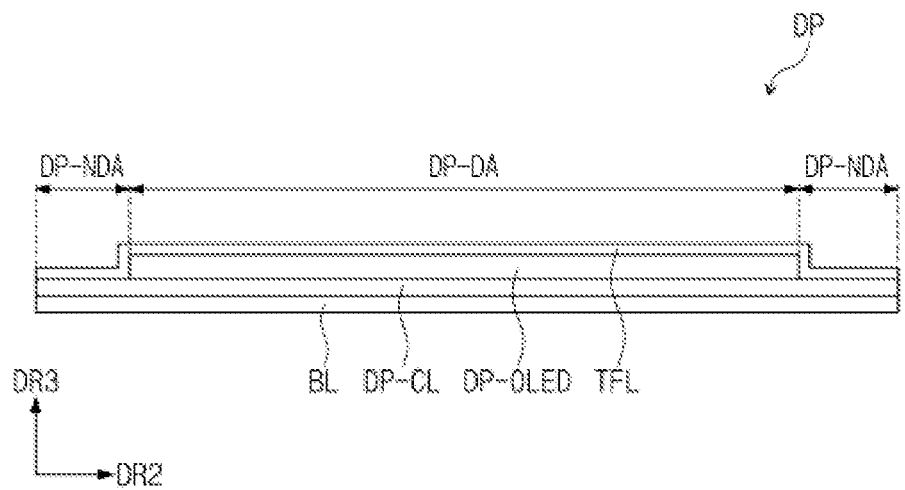
FIGS. 3A and 3B are sectional views each illustrating a display panel according to an exemplary embodiment.
Figure 3B:
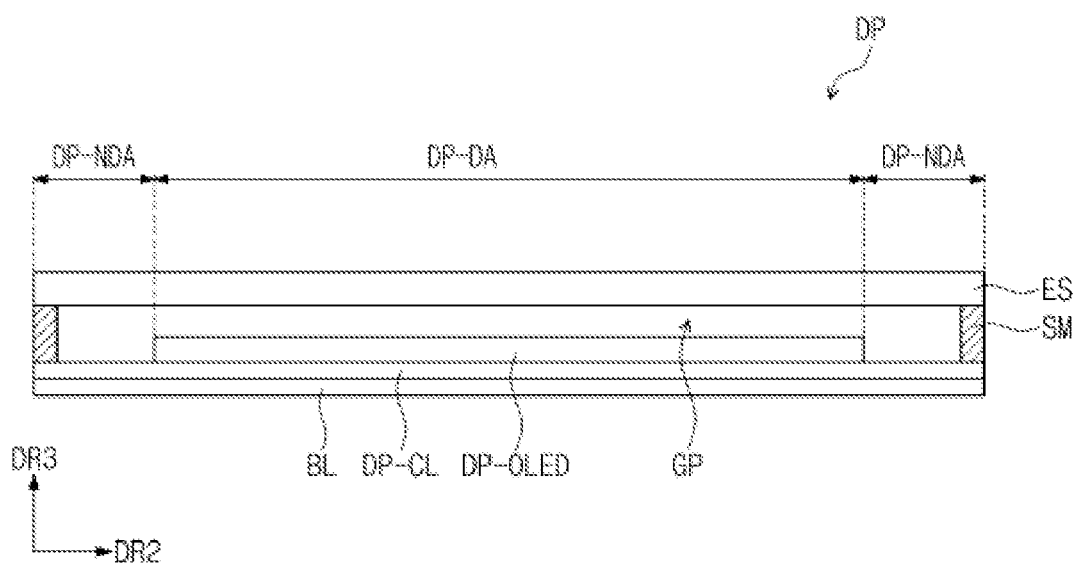

FIGS. 3A and 3B are sectional views each illustrating the display panel DP according to an exemplary embodiment.

As shown in FIG. 3A, the display panel DP may include a base layer BL, and a circuit device layer DP-CL, a display element layer DP-OLED, and an upper insulating layer TFL disposed on the base layer BL. A display region DP-DA and a non-display region DP-NDA, which correspond to the image region DD-DA and the bezel region DD-NDA shown in FIG. 1, may be defined in the display panel DP. In the present specification, an expression "a region/portion corresponds to another region/portion" may mean that they are overlapped with each other, but the expression does not mean that they have the same area and/or the same shape.

The base layer BL may include at least one synthetic resin film. The base layer BL may include a glass substrate, a metal substrate, a substrate made of an organic/inorganic composite material, or the like.

The circuit device layer DP-CL may include at least one insulating layer and a circuit device. The insulating layer may include at least one inorganic layer and at least one organic layer. The circuit device may include signal lines, a driving circuit of pixel, and so forth. This will be described in more detail below.

The display element layer DP-OLED may include at least one organic light emitting diodes. The display element layer DP-OLED may further include an organic layer, such as a pixel definition layer.

The upper insulating layer TFL may include a plurality of thin films. Some of the thin films may be disposed to improve optical efficiency, and others may be disposed to protect the organic light emitting diodes. The upper insulating layer TFL will be described in more detail below.

As shown in FIG. 3B, the display panel DP may include the base layer BL, the circuit device layer DP-CL, the display element layer DP-OLED, an encapsulation substrate ES, and a sealant SM. Here, the circuit device layer DP-CL, the display element layer DP-OLED, and the encapsulation substrate ES may be disposed on the base layer BL, and the base layer BL and the encapsulation substrate ES may be combined by the sealant SM. The encapsulation substrate ES may be spaced apart from the display element layer DP-OLED with a gap GP interposed therebetween.

The base layer BL and the encapsulation substrate ES may include a synthetic resin substrate, a glass substrate, a metal substrate, a substrate made of an organic/inorganic composite material, or the like. The sealant SM may include an organic adhesive member, a frit, or the like. In the exemplary embodiment, the sealant SM may be in contact with the circuit device layer DP-CL, but the exemplary embodiments are not limited thereto. A portion of the circuit device layer DP-CL may be removed, and the sealant SM may be in contact with the base layer BL.

Figure 4:
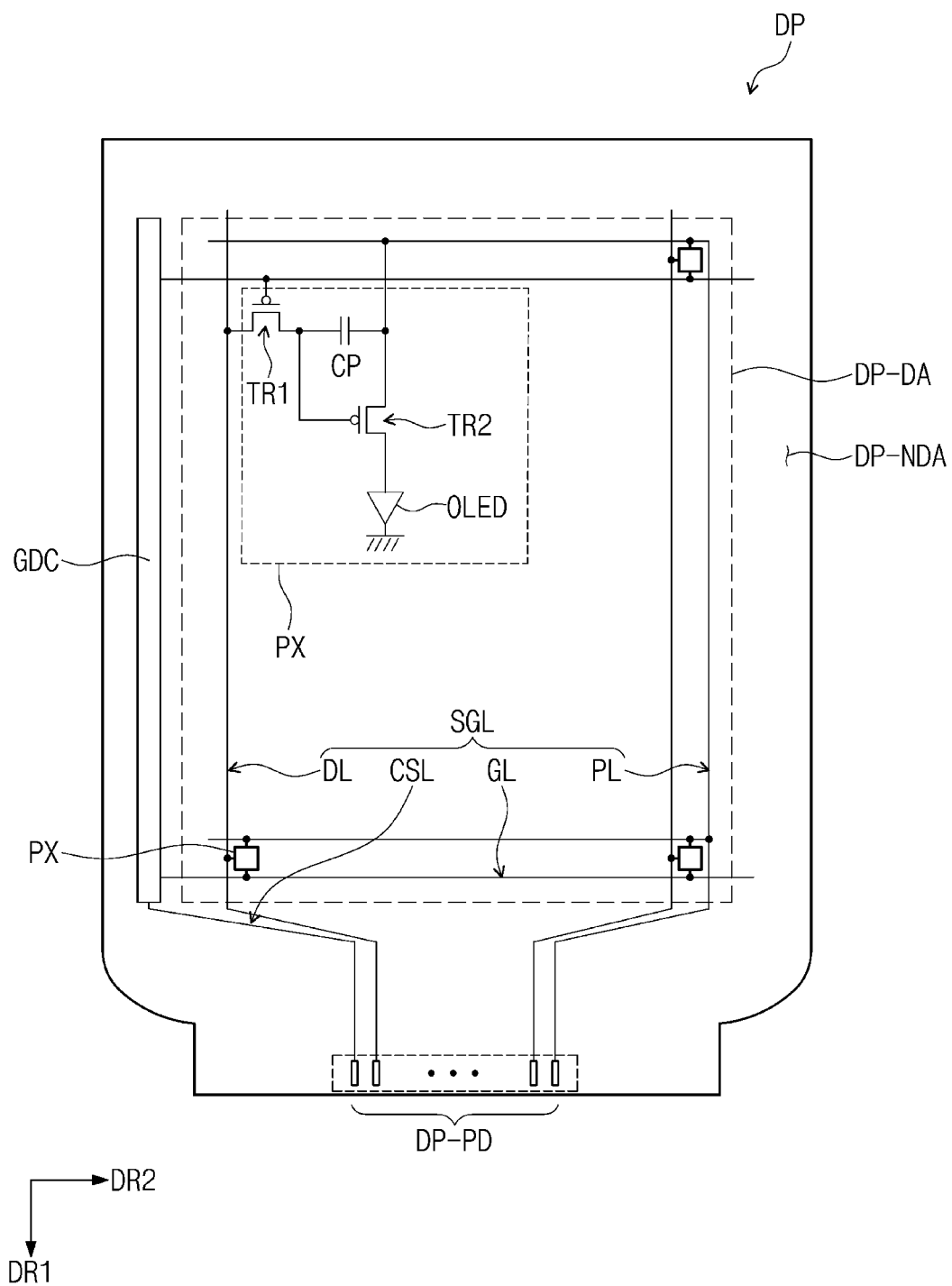
FIG. 4 is a plan view illustrating a display panel according to an exemplary embodiment.
Figure 5A:
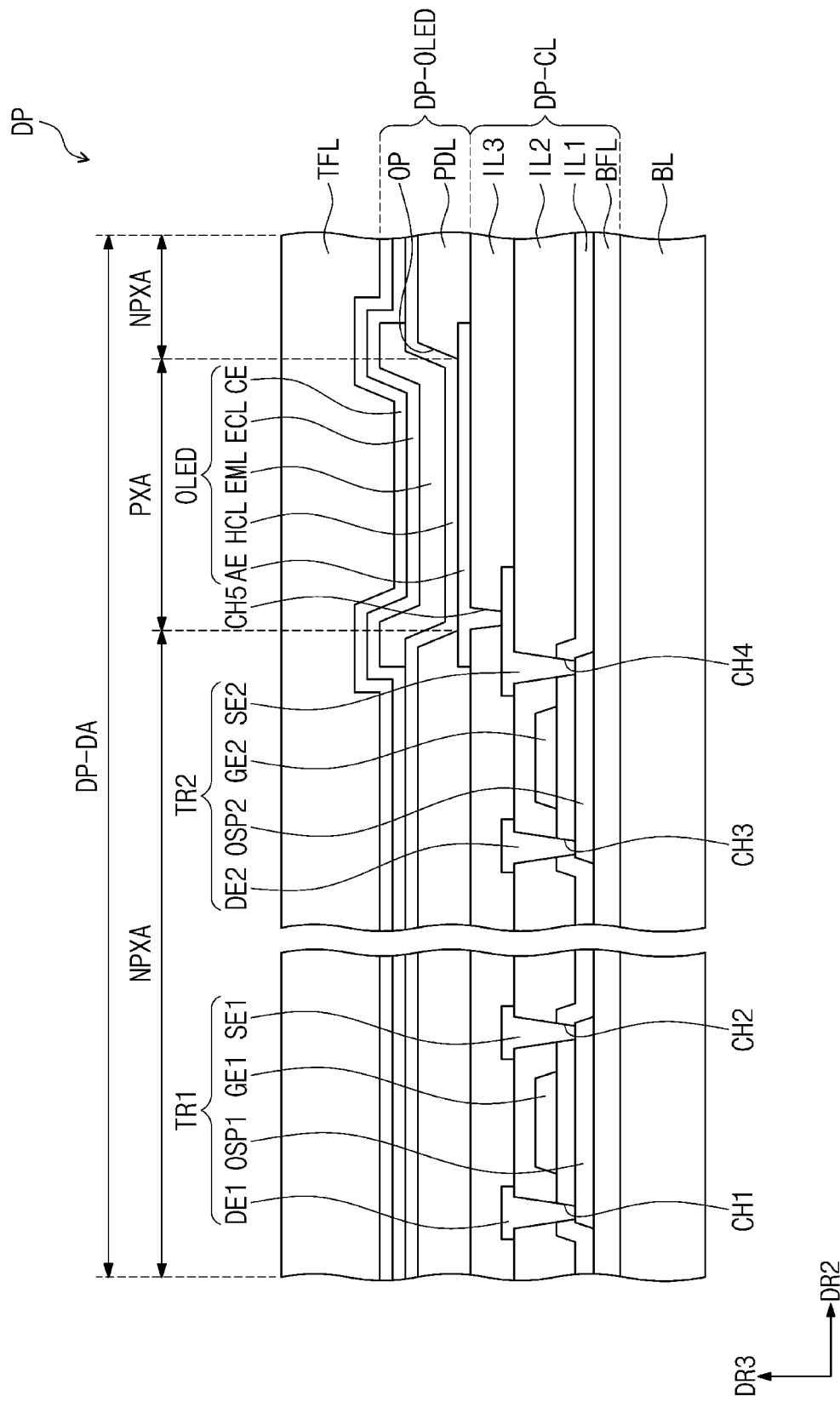
FIG. 5A is an enlarged sectional view of a display panel according to an exemplary embodiment.
Figure 5B:
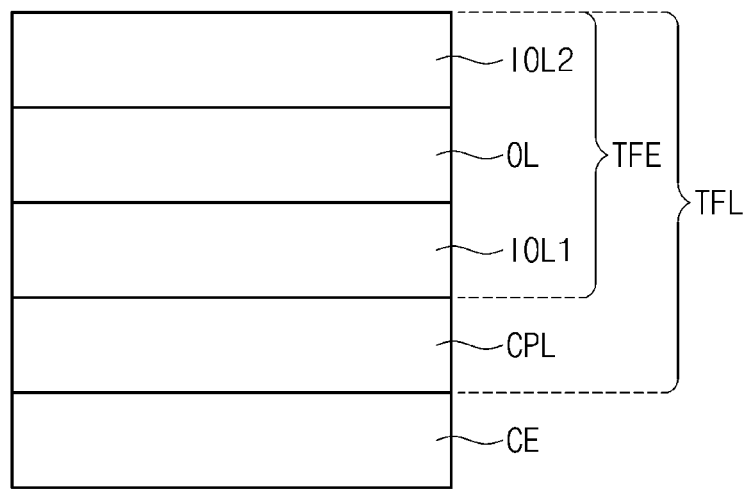
FIG. 5B is an enlarged sectional view of an upper insulating layer according to an exemplary embodiment.

FIG. 4 is a plan view illustrating the display panel DP according to an exemplary embodiment. FIG. 5A is an enlarged sectional view illustrating the display panel DP according to an exemplary embodiment. FIG. 5B is an enlarged sectional view illustrating the upper insulating layer TFL according to an exemplary embodiment. The display panel DP of FIG. 5A is illustrated to have the same structure as that of FIG. 3A.

As shown in FIG. 4, the display panel DP may include a driving circuit GDC, a plurality of signal lines SGL, a plurality of signal pads DP-PD, and a plurality of pixels PX.

The display region DP-DA may be defined as a region, on which the pixels PX are disposed. Each of the pixels PX may include an organic light emitting diode and a pixel driving circuit connected thereto. The driving circuit GDC, the signal lines SGL, the signal pads DP-PD, and the pixel driving circuit may be included in the circuit device layer DP-CL shown in FIGS. 3A and 3B.

The pixel PX may include a first thin film transistor TR1, a second thin film transistor TR2, a capacitor CP, and a light emitting element OLED. The driving circuit of the pixel PX may not be limited to the example structure shown in FIG. 4, as long as the driving circuit includes a switching transistor and a driving transistor.

The first thin film transistor TR1 may be connected to a scan line GL and a data line DL. The light emitting element OLED may receive a power voltage provided through a power line PL. The signal pads DP-PD, which are connected to signal lines SGL, such as the data line DL and the power line PL, may be disposed on the non-display region DP-NDA. The signal pads DP-PD and the signal line may constitute a single object, and in an exemplary embodiment, the signal pads DP-PD may be disposed on a layer different from a layer under the signal line and may be connected to an end portion of the signal line through a contact hole, which is formed to penetrate an insulating layer.

The driving circuit GDC may include a scan driving circuit. The scan driving circuit may generate a plurality of scan signals and sequentially output the scan signals to a plurality of the scan lines GL to be described below. The scan driving circuit may further output other control signals to the driving circuit of the pixels PX.

The scan driving circuit may include a plurality of thin-film transistors that are formed by the same process as that for the driving circuit of the pixels PX (e.g., by a low temperature polycrystalline silicon (LTPS) process or a low temperature polycrystalline oxide (LTPO) process).

The signal lines SGL may include the scan lines GL, the data lines DL, the power line PL, and a control signal line CSL. Each of the scan lines GL may be connected to corresponding ones of the pixels PX, and each of the data lines DL may be connected to corresponding ones of the pixels PX. The power line PL may be connected to the pixels PX. The control signal line CSL may provide the control signals to the scan driving circuit.

FIG. 5A illustrates a cross section of a portion of the display panel DP corresponding to the first and second thin film transistors TR1 and TR2 and the light emitting element OLED. The circuit device layer DP-CL disposed on the base layer BL may include at least one insulating layer and a circuit device. The circuit device may include signal lines, a driving circuit of pixel, and so forth. The formation of the circuit device layer DP-CL may include forming an insulating layer, a semiconductor layer, and a conductive layer using a coating or deposition process and patterning the insulating layer, the semiconductor layer, and the conductive layer using a photolithography and etching process.

In the exemplary embodiment, the circuit device layer DP-CL may include a buffer layer BFL, a first inorganic layer IL1 and a second inorganic layer IL2, which are formed of inorganic materials, and an organic layer IL3. The buffer layer BFL may include a plurality of stacked inorganic layers. FIG. 5A illustrates an example of relative positions of some elements (e.g., a first semiconductor pattern OSP1, a second semiconductor pattern OSP2, a first control electrode GE1, a second control electrode GE2, a first input electrode DE1, a first output electrode SE1, a second input electrode DE2, and a second output electrode SE2) constituting the first thin film transistor TR1 and the second thin film transistor TR2. The first to fourth penetration holes CH1 to CH4 may also be exemplarily illustrated in FIG. 5A.

The light emitting element OLED may include an organic light emitting diode. The display element layer DP-OLED may include a pixel definition layer PDL. For example, the pixel definition layer PDL may be an organic layer A first electrode AE may be disposed on the organic layer IL3. The first electrode AE may be connected to the second output electrode SE2 through a fifth penetration hole CH5, which is formed to penetrate the organic layer IL3. An opening OP may be defined in the pixel definition layer PDL. The opening OP of the pixel definition layer PDL may expose at least a portion of the first electrode AE. The opening OP of the pixel definition layer PDL will be referred to as a light-emitting opening, for distinction of other openings.

As shown in FIG. 5A, the display region DP-DA may include an emission region PXA and a non-emission region NPXA adjacent to the emission region PXA. The non-emission region NPXA may enclose the emission region PXA. In the exemplary embodiment, the emission region PXA may be defined to correspond to a portion of the first electrode AE exposed by the light-emitting opening OP.

A hole control layer HCL may be disposed in both of the emission region PXA and the non-emission region NPXA. The hole control layer HCL may include a hole transport layer and, in an exemplary embodiment, the hole control layer HCL may further include a hole injection layer. An emission layer EML may be disposed on the hole control layer HCL. The emission layer EML may be disposed on a region corresponding to the light-emitting opening OP. In other words, the emission layer EML may include a plurality of isolated patterns, each of which is provided for a corresponding one of the pixels. The emission layer EML may include an organic material and/or an inorganic material. The emission layer EML may generate light of specific color.

An electron control layer ECL may be disposed on the emission layer EML. The electron control layer ECL may include an electron transport layer, and in an exemplary embodiment, the electron control layer ECL may further include an electron injection layer. The hole control layer HCL and the electron control layer ECL may be formed in common on a plurality of pixels PX or formed to a plurality of isolation patterns corresponding respectively to the plurality of pixels PX using an open mask. A second electrode CE may be disposed on the electron control layer ECL. The second electrode CE may be a single structure, which is disposed in common on the plurality of pixels.

As shown in FIGS. 5A and 5B, the upper insulating layer TFL may be disposed on the second electrode CE. The upper insulating layer TFL may include a plurality of thin films. In the exemplary embodiment, the upper insulating layer TFL may include a capping layer CPL and a thin encapsulation layer TFE. The thin encapsulation layer TFE may include a first inorganic layer IOL1, an organic layer OL, and a second inorganic layer IOL2.

The capping layer CPL may be disposed over the second electrode CE and may be in contact with the second electrode CE. The capping layer CPL may include an organic material. The first inorganic layer IOL1 may be disposed on the capping layer CPL and may be in contact with the capping layer CPL. The organic layer OL may be disposed on the first inorganic layer IOL1 and may be in contact with the first inorganic layer TOLL The second inorganic layer IOL2 may be disposed on the organic layer OL and may be in contact with the organic layer OL.

The capping layer CPL may protect the second electrode CE from a subsequent process (e.g., a sputtering process) and may improve a light emission efficiency of the light emitting element OLED. The capping layer CPL may have a refractive index that is higher than is the first inorganic layer IOL1.

The first inorganic layer IOL1 and the second inorganic layer IOL2 may protect the display element layer DP-OLED from moisture or oxygen, and the organic layer OL may protect the display element layer DP-OLED from a contamination material, such as particles or dust. Each of the first inorganic layer IOL1 and the second inorganic layer IOL2 may be one of a silicon nitride layer, a silicon oxynitride layer, and a silicon oxide layer. In an exemplary embodiment, the first inorganic layer IOL1 and the second inorganic layer IOL2 may include a titanium oxide layer or an aluminum oxide layer. The organic layer OL may include an acrylic organic layer, but the exemplary embodiments are not limited thereto.

In an exemplary embodiment, an inorganic layer (e.g., LiF layer) may be further disposed between the capping layer CPL and the first inorganic layer TOLL The LiF layer may improve a light emission efficiency of the light emitting element OLED.

Figure 6A:
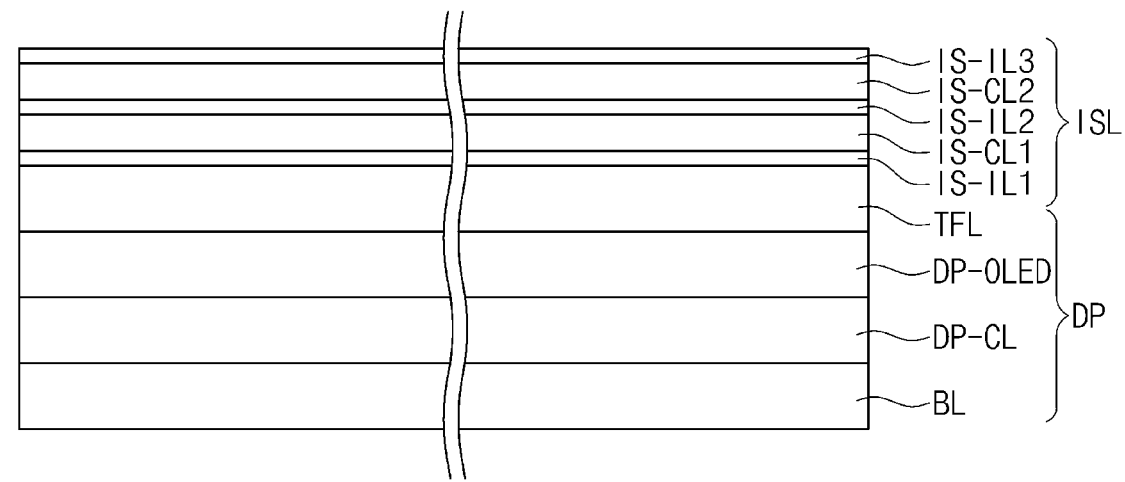
FIG. 6A is a sectional view illustrating an input sensing layer according to an exemplary embodiment.
Figure 6B:
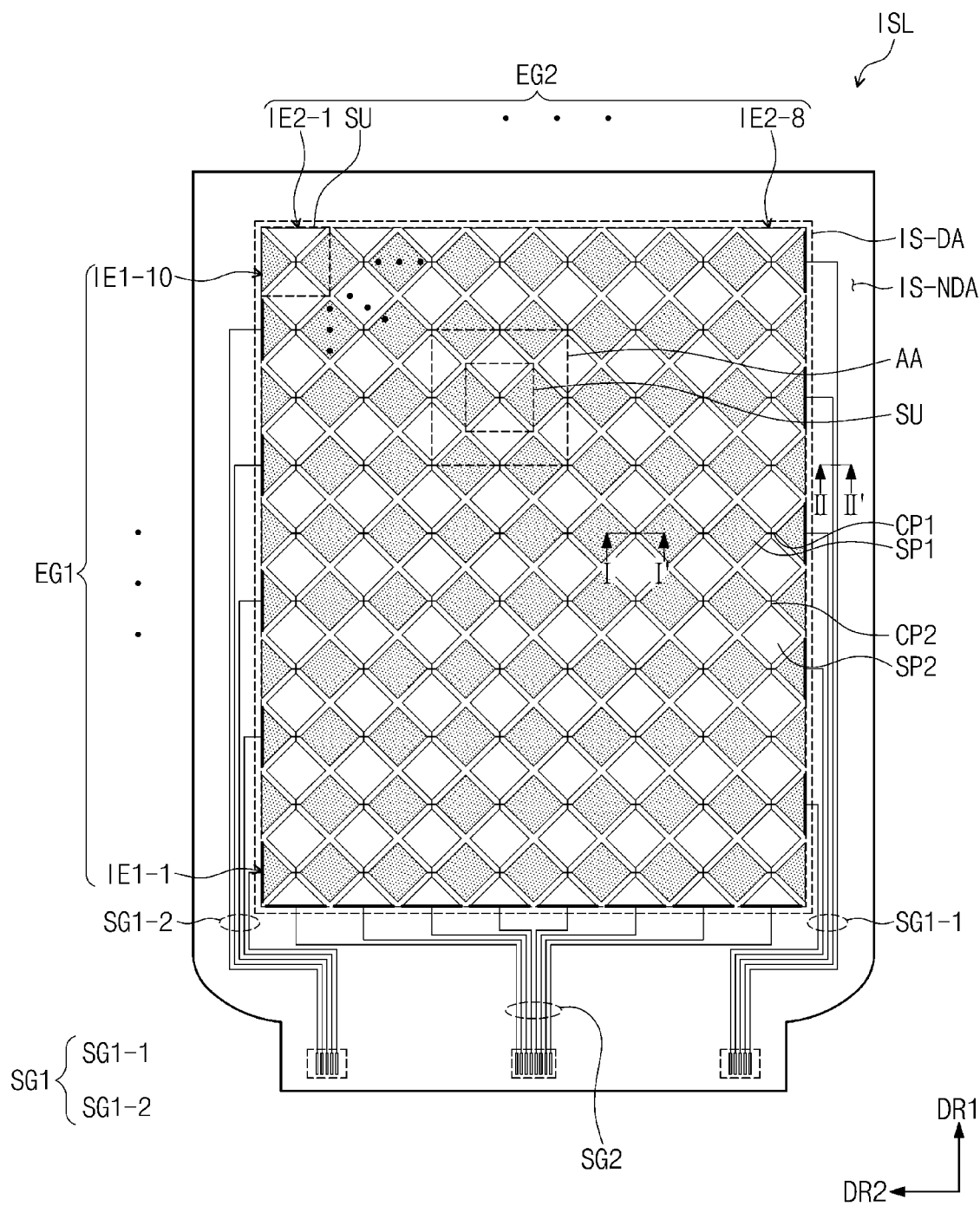
FIG. 6B is a plan view illustrating an input sensing layer according to an exemplary embodiment.
Figure 6C:
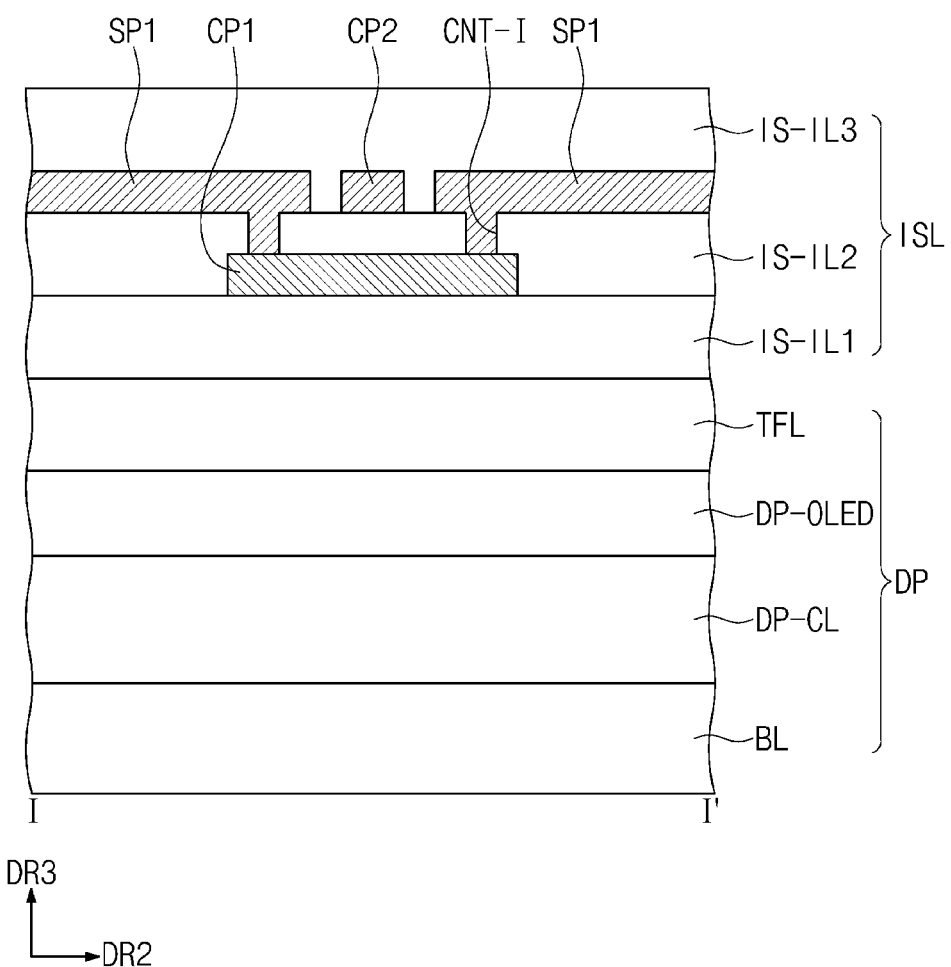
FIGS. 6C and 6D are sectional views each illustrating a portion of an input sensing layer according to an exemplary embodiment.
Figure 6D:
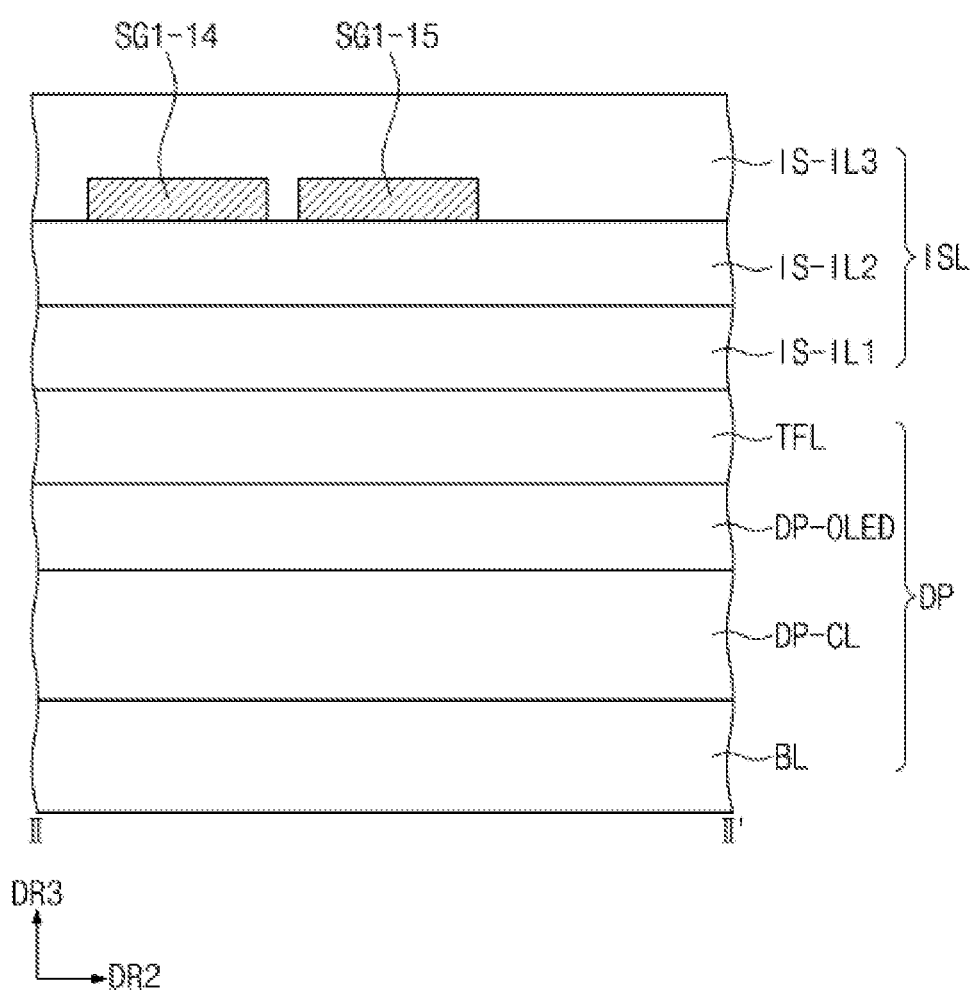

FIG. 6A is a sectional view illustrating the input sensing layer ISL according to an exemplary embodiment. FIG. 6B is a plan view illustrating the input sensing layer ISL according to an exemplary embodiment. FIGS. 6C and 6D are sectional views each illustrating a portion of the input sensing layer ISL according to an exemplary embodiment.

As shown in FIG. 6A, the input sensing layer ISL may include a first insulating layer IS-IL1, a first conductive layer IS-CL1, a second insulating layer IS-IL2, a second conductive layer IS-CL2, and a third insulating layer IS-IL3. The first insulating layer IS-IL1 may be directly disposed on the upper insulating layer TFL. In an exemplary embodiment, the first insulating layer IS-IL1 may be omitted.

Each of the first and second conductive layers IS-CL1 and IS-CL2 may have a single-layered structure or a multi-layered structure including a plurality of layers stacked along the third direction axis DR3. The multi-layered structure of the conductive layers may include at least two layers of transparent conductive layers and metal layers. The multi-layered structure of the conductive layers may include metal layers containing different metallic elements. The transparent conductive layers may include at least one of indium tin oxide (ITO), indium zinc oxide (IZO), zinc oxide (ZnO), indium tin zinc oxide (ITZO), PEDOT, metal nano wire, or graphene. The metal layer may include at least one of molybdenum, silver, titanium, copper, aluminum, or alloys thereof. For example, each of the first and second conductive layers IS-CL1 and IS-CL2 may have a triple metal layer structure (e.g., of titanium/aluminum/titanium). A metal layer with relatively high durability and low reflectance may be used as an outer layer, and a metal layer with high electric conductivity may be used as an inner layer.

Each of the first and second conductive layers IS-CL1 and IS-CL2 may include a plurality of conductive patterns. Hereinafter, the first conductive layer IS-CL1 will be described to include first conductive patterns, and the second conductive layer IS-CL2 will be described to include second conductive patterns. Each of the first and second conductive patterns may include sensing electrodes and signal lines connected thereto.

Each of the first to third insulating layers IS-IL1 to IS-IL3 may include an inorganic layer or an organic layer. In the exemplary embodiment, each of the first and second insulating layers IS-IL1 and IS-IL2 may be an inorganic layer. The inorganic layer may include at least one of aluminum oxide, titanium oxide, silicon oxide, silicon oxynitride, zirconium oxide, or hafnium oxide. The third insulating layer IS-IL3 may include an organic layer. The organic layer may include at least one of acrylic resins, methacryl resins, polyisoprene resins, vinyl resins, epoxy resins, urethane resins, cellulose resins, siloxane resins, polyimide resins, polyamide resins, or perylene resins.

In the exemplary embodiment, the second insulating layer IS-IL2 may cover a sensing region IS-DA (see FIG. 6B) to be described below. In other words, the second insulating layer IS-IL2 may be fully overlapped with the sensing region IS-DA. Although not shown, in an exemplary embodiment, the second insulating layer IS-IL2 may include a plurality of insulating patterns. The plurality of insulating patterns may be disposed at every crossing region of sensing units SU to electrically separate first sensing electrodes IE1-1 to IE1-10 from second sensing electrodes IE2-1 to IE2-8.

As shown in FIG. 6B, the input sensing layer ISL may include a first electrode group EG1, a second electrode group EG2, and signal line groups connected to the electrode groups EG1 and EG2. In the exemplary embodiment, the input sensing layer ISL including two signal line groups SG1 and SG2 is exemplarily illustrated. The input sensing layer ISL may include the sensing region IS-DA and a wiring region IS-NDA, which correspond to the display region DP-DA and the non-display region DP-NDA, respectively, of the display panel DP. The sensing region IS-DA may be defined as a region, on which the first electrode group EG1, the second electrode group EG2 are disposed. A first signal line group SG1 and a second signal line group SG2 may be disposed on the wiring region IS-NDA.

In the exemplary embodiment, the input sensing layer ISL may be a capacitive touch sensor. One of the first and second electrode groups EG1 and EG2 may receive a driving signal, and the other may output an amount of change in electrostatic capacitance between the first and second electrode groups EG1 and EG2 as a sensing signal. The driving period of the operation may be divided into at least two driving periods (e.g., first and second driving periods), where the operation may be executed in the afore-described manner during the first driving period and may be executed in a manner opposite to the afore-described manner during the second driving period.

The first electrode group EG1 may include a plurality of the first sensing electrodes IE1-1 to IE1-10. The first electrode group EG1 including ten first sensing electrodes IE1-1 to IE1-10 is exemplarily illustrated. The first sensing electrodes IE1-1 to IE1-10 may have a shape extending in the second direction DR2. The second electrode group EG2 may include a plurality of the second sensing electrodes IE2-1 to IE2-8. The second electrode group EG2 including eight second sensing electrodes IE2-1 to IE2-8 is exemplarily illustrated. The second sensing electrodes IE2-1 to IE2-8 may have a shape extending in the first direction DR1. The second sensing electrodes IE2-1 to IE2-8 may be longer than the first sensing electrodes IE1-1 to IE1-10.

The first signal line group SG1 may include first signal lines, whose number is the same as that of the first sensing electrodes IE1-1 to IE1-10. The first signal lines may be connected to one end of ends of the first sensing electrodes IE1-1 to IE1-10. In an exemplary embodiment, all of ends of the first sensing electrodes IE1-1 to IE1-10 may be connected to signal lines.

The second signal line group SG2 may include second signal lines, whose number is the same as that of the second sensing electrodes IE2-1 to IE2-8. The second signal lines are connected to one-side ends of opposite ends of the second sensing electrodes IE2-1 to IE2-8. In the exemplary embodiment, eight signal lines of the second signal line group SG2 are respectively illustrated to be connected to bottom-side ends of the second sensing electrodes IE2-1 to IE2-8.

In the exemplary embodiment, the first signal lines may be divided into two groups. One group may be a one-side signal line group SG1-1, and the other may be an opposite-side signal line group SG1-2. The one-side signal line group SG1-1 may be connected to some of the first sensing electrodes IE1-1 to IE1-10, and the opposite-side signal line group SG1-2 may be connected to others of the first sensing electrodes IE1-1 to IE1-10. The one-side signal line group SG1-1 and the opposite-side signal line group SG1-2 may be spaced apart from each other, in the second direction DR2, with the sensing region IS-DA interposed therebetween. Since the first signal lines are disposed in two separate groups, a width of the wiring region IS-NDA may be decreased.

The one-side signal line group SG1-1 may be electrically connected to odd- or even-numbered sensing electrodes of the first sensing electrodes IE1-1 to IE1-10. The opposite-side signal line group SG1-2 may be connected to sensing electrodes, to which the one-side signal line group SG1-1 is not connected. In the exemplary embodiment, five signal lines of the one-side signal line group SG1-1 are illustrated to be respectively connected to right-side ends of even-numbered ones of the first sensing electrodes.

Each of the first sensing electrodes IE1-1 to IE1-10 may include a plurality of first sensor units SP1 and a plurality of first connection portions CP1. The first sensor units SP1 may be arranged in the second direction DR2. Each of the first connection portions CP1 may connect two adjacent ones of the first sensor units SP1 to each other.

Each of the second sensing electrodes IE2-1 to IE2-8 may include a plurality of second sensor units SP2 and a plurality of second connection portions CP2. The second sensor units SP2 may be arranged in the first direction DR1. Each of the second connection portions CP2 may connect two adjacent ones of the second sensor units SP2 to each other.

Referring to FIG. 6B, the sensing region IS-DA may be divided into a plurality of the sensing units SU. The plurality of the sensing units SU may have the same area. Each of the sensing units SU may include crossing region, which correspond to the crossing regions between the first sensing electrodes IE1-1 to IE1-10 and the second sensing electrodes IE2-1 to IE2-8. The crossing region may be a region, on which a bridge pattern is disposed.

In an exemplary embodiment, the plurality of the sensing units SU may include mesh patterns of the same shape. In the present specification, the mesh pattern may be a pattern, which is formed by the mesh line of the sensing electrode or is formed by the mesh lines crossing each other. In an exemplary embodiment, depending on the shape of the mesh patterns disposed in the sensing units SU, the plurality of the sensing units SU may be divided into a plurality of groups. The sensing units SU in each group may include mesh patterns of the same shape.

FIG. 6C illustrates a cross section corresponding to a sectional line I-I' of FIG. 6B. FIG. 6C illustrates an exemplary embodiment, in which the first connection portion CP1 and the second connection portion CP2 are disposed to cross each other. In the exemplary embodiment, the first connection portion CP1 may correspond to the bridge pattern. In an exemplary embodiment, the second connection portion CP2 may be the bridge pattern.

Referring to FIGS. 6B and 6C, the plurality of the first connection portions CP1 may be formed from the first conductive layer IS-CL1, and the plurality of the first sensor units SP1, the plurality of the second sensor units SP2, and the plurality of the second connection portions CP2 may be formed from the second conductive layer IS-CL2. The first sensor units SP1 and the first connection portion CP1 may be coupled to each other through contact holes CNT-I, which are formed to penetrate the second insulating layer IS-IL2.

In the exemplary embodiment, the plurality of the first connection portions CP1 and the plurality of the second connection portions CP2 are illustrated to cross each other, but the exemplary embodiments are not limited thereto. For example, each of the first connection portions CP1 may be deformed to have a bent shape, such as a letter 'V'- or 'A'-like shape, such that it is not overlapped with the second connection portions CP2. The first connection portions CP1 with the 'V'- or 'A'-like bent shape may be overlapped with the second sensor units SP2, when viewed in a plan view.

In an exemplary embodiment, the signal lines of the first signal line group SG1 and the second signal line group SG2 may include at least one of a portion, which is disposed on the same layer as the first sensing electrodes IE1-1 to IE1-10, and a portion, which is disposed on the same layer as the second sensing electrodes IE2-1 to IE2-8.

FIG. 6D illustrates a cross section corresponding to a sectional line of FIG. 6B. Fourth and fifth signal lines SG1-14 and SG1-15 of the one-side signal line group SG1-1 are exemplarily illustrated in FIG. 6D. The signal lines of the first signal line group SG1 and the second signal line group SG2 may include at least a portion, which is disposed on the same layer as the second sensing electrodes IE2-1 to IE2-8. The signal lines of the first signal line group SG1 and the second signal line group SG2 may be formed from the second conductive layer IS-CL2 (e.g., see FIG. 6A).

The signal lines of the first signal line group SG1 and the second signal line group SG2 may further include a portion, which is formed from the first conductive layer IS-CL1 (e.g., see FIG. 6A). The portions, which are formed from the second conductive layer IS-CL2 and the first conductive layer IS-CL1, may be connected to each other through contact holes, which are formed to penetrate the second insulating layer IS-IL2. The signal line of this double-layered structure may have low resistance.

Figure 7A:
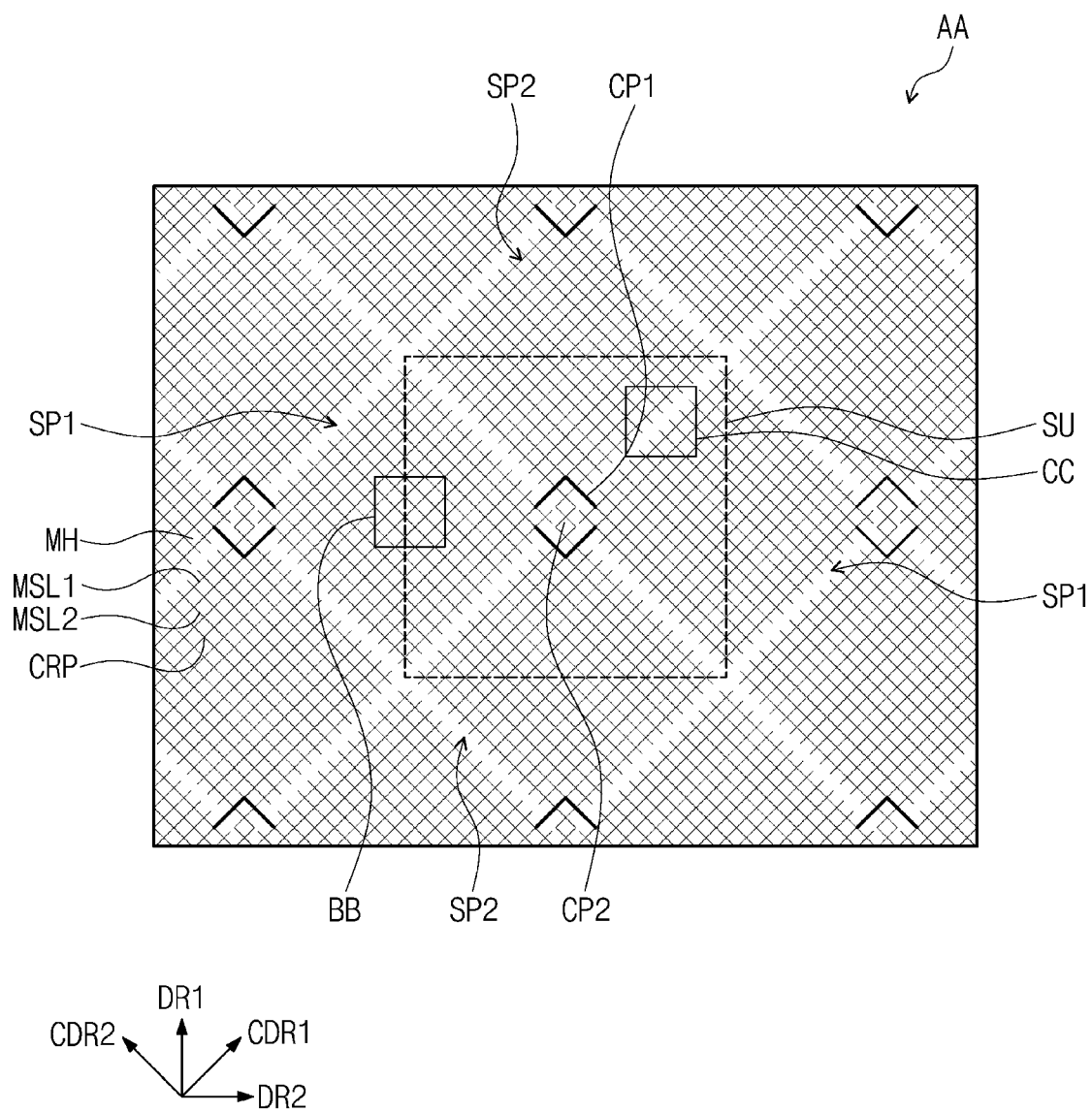
FIG. 7A is an enlarged plan view illustrating a region 'AA' of FIG. 6B.
Figure 7B:
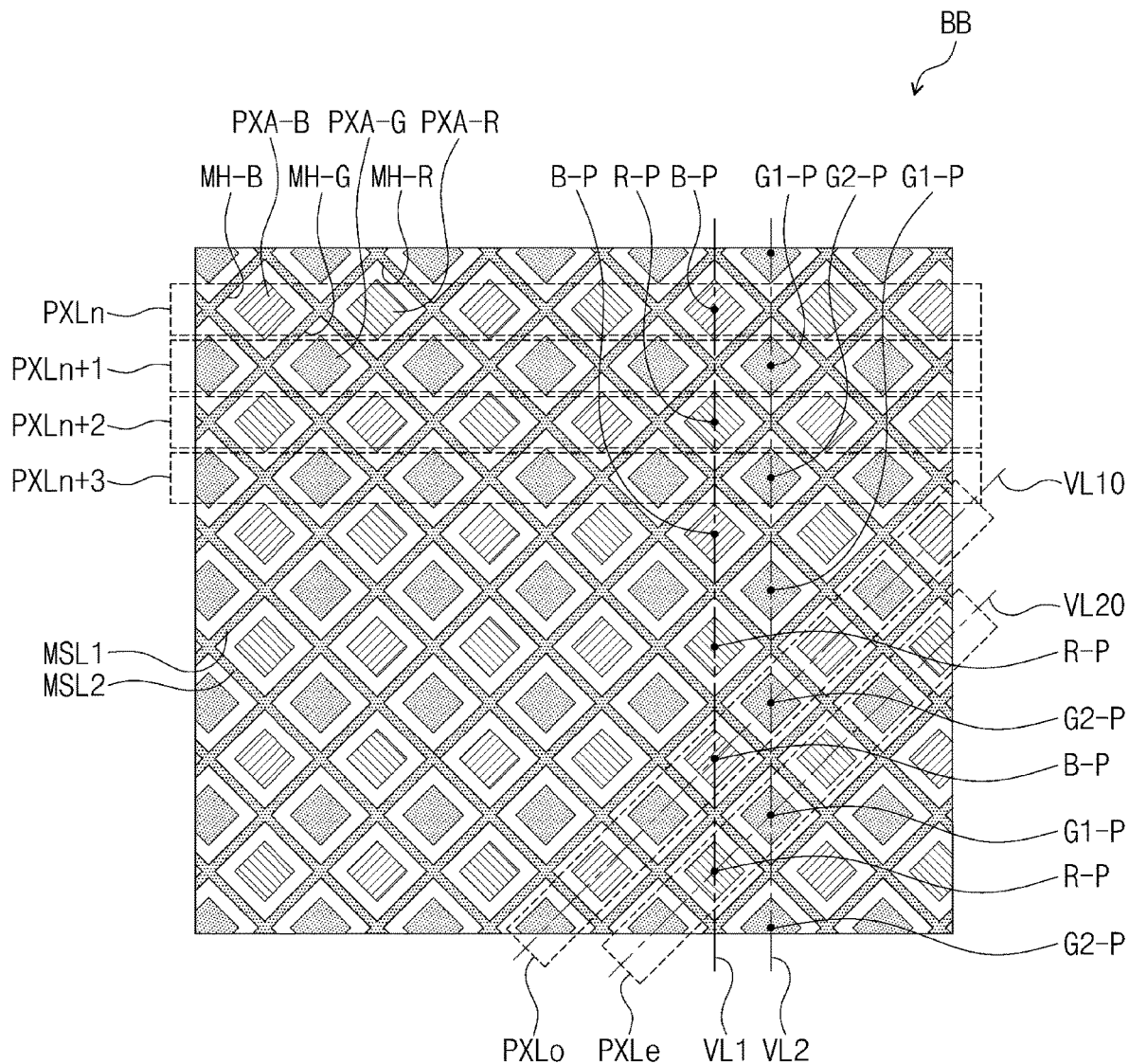
FIG. 7B is an enlarged plan view illustrating a region 'BB' of FIG. 7A.
Figure 7C:
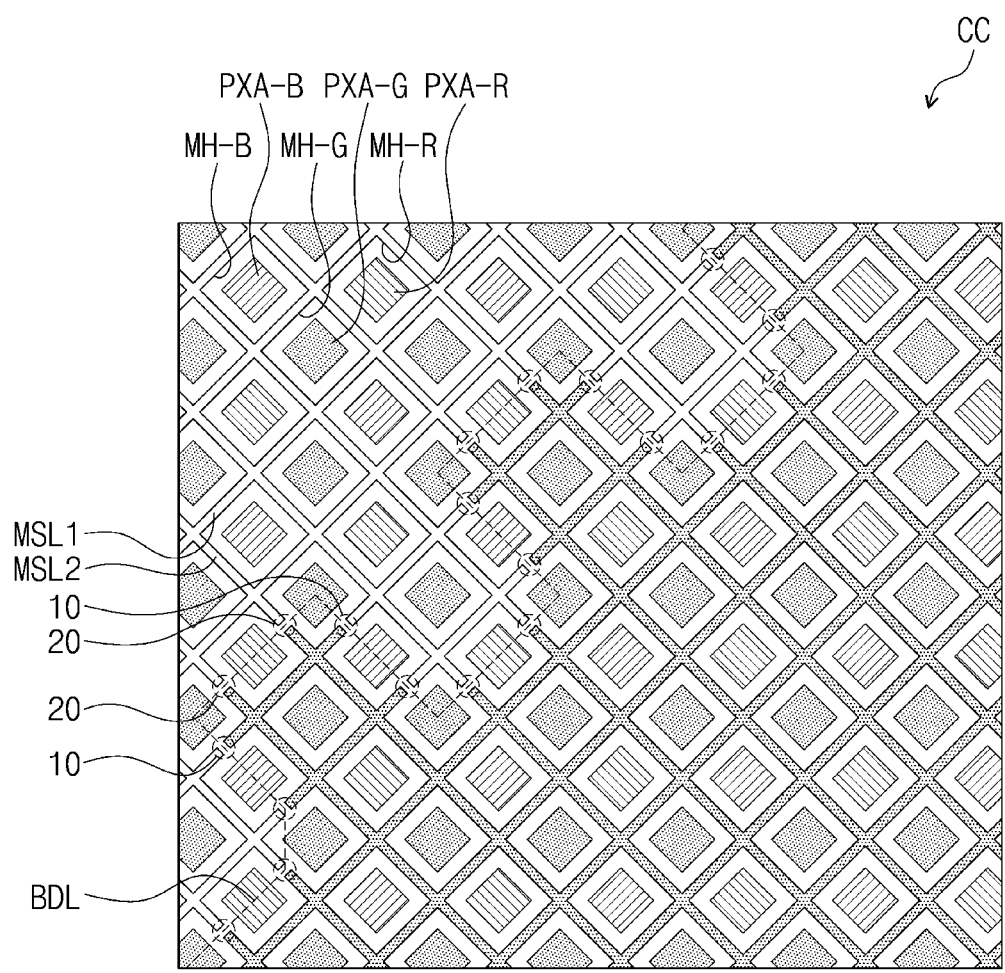
FIG. 7C is an enlarged plan view illustrating a region 'CC' of FIG. 7A.

FIG. 7A is an enlarged plan view illustrating a region 'AA' of FIG. 6B. FIG. 7B is an enlarged plan view illustrating a region 'BB' of FIG. 7A. FIG. 7C is an enlarged plan view illustrating a region 'CC' of FIG. 7A.

The first sensing electrodes IE1-1 to IE1-10 and the second sensing electrodes IE2-1 to IE2-8 described with reference to FIG. 6B may have a mesh shape. The arrangement of a unit region UA and cutting points to be described below may be applied to all of the first sensing electrodes IE1-1 to IE1-10 and the second sensing electrodes IE2-1 to IE2-8 in the same manner.

The sensing electrode will be described with reference to FIG. 7A, based on two first sensor unit SP1, two first connection portion CP1, two second sensor units SP2, and one second connection portion CP2 constituting a single crossing region. The first connection portion CP1, which has a bent shape in a plan view, is exemplarily illustrated in FIG. 7A. In the exemplary embodiment, two first sensor units SP1, two second sensor units SP2, and one second connection portion CP2 may be disposed on a plane provided by the second insulating layer IS-IL2 (e.g., see FIG. 6C). The first connection portion CP1 may be connected to two first sensor units SP1 through the contact holes CNT-I (e.g., see FIG. 6C) penetrating the second insulating layer IS-IL2.

The sensing electrode may include mesh lines MSL1 and MSL2. The mesh lines MSL1 and MSL2 may include first mesh lines MSL1, which extend in a first crossing direction CDR1 or a fourth direction crossing the first and second directions DR1 and DR2, and second mesh lines MSL2, which extend in a second crossing direction CDR2 or a fifth direction crossing the first and second directions DR1 and DR2 and the first crossing direction CDR1. An angle between the first and second crossing directions CDR1 and CDR2 may be equal to or less than 90°.

The first and second mesh lines MSL1 and MSL2 may cross each other at a plurality of cross points CRP and may define a plurality of mesh openings MH. The first and second mesh lines MSL1 and MSL2 having a linear shape are exemplarily illustrated in FIG. 7A, but the exemplary embodiments are not limited thereto. The first and second mesh lines MSL1 and MSL2 may constitute a single object. The first and second mesh lines MSL1 and MSL2 may share the cross points CRP.

Each of the first and second mesh lines MSL1 and MSL2 may include a plurality of inflection points. Each of the first and second mesh lines MSL1 and MSL2 may include a plurality of portions. Each of the plurality of portions connects two most adjacent points of the cross points CRP. FIG. 7A illustrates a plurality of the mesh openings MH which have the same area and the same shape, but the exemplary embodiments are not limited thereto. The plurality of the mesh openings MH may include a plurality of groups, which are classified depending on their area or shape. This will be described with reference to FIGS. 10A and 10B.

The sensing unit SU of FIG. 7A may correspond to the sensing unit SU shown in FIG. 6B. The sensing unit SU may include a half of the first sensor unit SP1 and another half of the first sensor unit SP1, which is disposed with the first connection portion CP1 interposed therebetween. The sensing unit SU may include a half of the second sensor unit SP2 and another half of the second sensor unit SP2, which is disposed with the second connection portion CP2 interposed therebetween.

FIG. 7B illustrates an enlarged shape of a mesh-shaped portion of the first sensor unit SP1. Three groups of mesh openings MH-B, MH-R, and MH-G are defined in the first sensor unit SP1. The three groups of the mesh openings MH-B, MH-R, and MH-G may correspond to three groups of emission regions PXA-B, PXA-R, and PXA-G. Each of the three groups of the emission regions PXA-B, PXA-R, and PXA-G may be defined in the same manner as the emission region PXA described with reference to FIG. 5A.

The three groups of the emission regions PXA-B, PXA-R, and PXA-G may be classified depending on color of a source light emitted from the light emitting element OLED (e.g., see FIG. 5A), and the emission regions PXA-B, PXA-R, and PXA-G may include first, second, and third color emission regions PXA-B, PXA-R, and PXA-G, which have the same area and emit lights of first, second and third colors, respectively. However, the exemplary embodiments are not limited thereto, and in an exemplary embodiment, the first color emission region PXA-B, the second color emission region PXA-R, and the third color emission region PXA-G may have different areas from each other. In the exemplary embodiment, the first, second and third colors may be blue, red, and green, respectively. In certain embodiments, the first, second and third colors may be three different colors of yellow, magenta, and cyan, respectively.

Referring to FIG. 7B, the plurality of the emission regions PXA-B, PXA-R, and PXA-G may define a plurality of emission rows arranged in the first direction DR1. The emission rows may include an n-th emission row PXLn, an (n+1)-th emission row PXLn+1, a (n+2)-th emission row PXLn+2, and an (n+3)-th emission row PXLn+3, where n is a natural number. The four emission rows PXLn, PXLn+1, PXLn+2, and PXLn+3 may be repeatedly arranged in the first direction DR1. The four emission rows PXLn, PXLn+1, PXLn+2, and PXLn+3 may extend in the second direction DR2.

The n-th emission row PXLn may include first color emission regions PXA-B and second color emission regions PXA-R, which are alternately arranged in the second direction DR2. The (n+2)-th emission row PXLn+2 may include the first color emission regions PXA-B and the second color emission regions PXA-R, which are alternately arranged in the second direction DR2.

The emission regions of the n-th emission row PXLn may differ from the emission regions of the (n+2)-th emission row PXLn+2 in terms of their disposition order. The first color emission regions PXA-B and the second color emission regions PXA-R of the n-th emission row PXLn may be disposed in a staggered manner with respect to the first color emission regions PXA-B and the second color emission regions PXA-R of the (n+2)-th emission row PXLn+2. The emission regions of the n-th emission row PXLn may be shifted from the emission regions of the (n+2)-th emission row PXLn+2, in the second direction DR2, by a length of a single emission region.

The third color emission regions PXA-G may be disposed in each of the (n+1)-th emission row PXLn+1 and the (n+3)-th emission row PXLn+3. The emission regions of the n-th emission row PXLn and the emission regions of the (n+1)-th emission row PXLn+1 may be disposed in a staggered manner with respect to each other. The emission regions of the (n+2)-th emission row PXLn+2 and the emission regions of the (n+3)-th emission row PXLn+3 may be disposed in a staggered manner with respect to each other.

The emission regions of the n-th emission row PXLn and the emission regions of the (n+2)-th emission row PXLn+2 may be disposed to correspond to each other. A virtual line VL1 connecting center points B-P of the emission regions, which constitute a specific one column in the n-th emission rows PXLn, e.g. a first emission row and a fifth emission row, may be the same as a virtual line VL1 connecting center points R-P of the emission regions, which constitute the specific column in the (n+2)-th emission row PXLn+2 e.g. a third emission row and a seventh emission row. The emission regions of the (n+1)-th emission row PXLn+1 and the emission regions of the (n+3)-th emission row PXLn+3 may be disposed to correspond to each other. A virtual line VL2 connecting center points G1-P of the emission regions, which constitute a specific column in the (n+1)-th emission row PXLn+1, may be the same as a virtual line VL2 connecting center points G2-P of the emission regions, which constitute the specific column in the (n+3)-th emission row PXLn+3.

As a result, one of the third color emission regions PXA-G, which is included in each of the (n+1)-th emission row PXLn+1 and the (n+3)-th emission row PXLn+3, may be enclosed by two first color emission regions PXA-B and two second color emission regions PXA-R. Each of the emission regions PXA-B and PXA-R, which are included in each of the n-th emission row PXLn and the (n+2)-th emission row PXLn+2, may be enclosed by four third color emission region PXA-G.

First mesh openings MH-B may be disposed to correspond to the first color emission regions PXA-B, second mesh openings MH-R may be disposed to correspond to the second color emission regions PXA-R, and third mesh openings MH-G may be disposed to correspond to the third color emission regions PXA-G.

As described above, the plurality of the emission regions PXA-B, PXA-R, and PXA-G may be classified into a plurality of emission rows PXLn, PXLn+1, PXLn+2, and PXLn+3, based on the first and second directions DR1 and DR2. The plurality of the emission regions PXA-B, PXA-R, and PXA-G may be classified into a plurality of emission rows PXLo and PXLe, based on the first crossing direction CDR1 and the second crossing direction CDR2. The emission rows PXLo and PXLe may include odd-numbered emission rows PXLo and even-numbered emission rows PXLe.

The odd-numbered emission rows PXLo may have the same arrangement of the emission regions, and the even-numbered emission rows PXLe may have the same arrangement of the emission regions. One group of the odd-numbered emission rows PXLo and the even-numbered emission rows PXLe may include the first color emission regions PXA-B and the third color emission regions PXA-G, which are alternately arranged in the first crossing direction CDR1. Another group of the odd-numbered emission rows PXLo and the even-numbered emission rows PXLe may include the second color emission regions PXA-R and the third color emission regions PXA-G, which are alternately arranged in the first crossing direction CDR1. The third color emission regions PXA-G of the odd-numbered emission rows PXLo and the third color emission regions PXA-G of the even-numbered emission rows PXLe may be disposed in a staggered manner with respect to each other in the first crossing direction CDR1 or the second crossing direction CDR2.

A virtual line VL10 connecting center points B-P and G2-P (or G1-P) of the emission regions of the odd-numbered emission rows PXLo may be parallel to a virtual line VL20 connecting center points R-P and G1-P (or G1-P) of the emission regions of the even-numbered emission rows PXLe. The virtual line VL10 and the virtual line VL20 may be extended in a direction that is same as an extension direction of the first mesh lines MSL1.

A border region between the first sensor unit SP1 and the second sensor unit SP2 is illustrated in FIG. 7C. A border line BDL may be an imaginary line, which is illustrated to indicate a border between the first sensor unit SP1 and the second sensor unit SP2. The mesh lines MSL1 and MSL2 may be formed on a plane provided by the second insulating layer IS-IL2, and then, the mesh lines MSL1 and MSL2 may be partially removed to form the first sensor unit SP1, the second sensor unit SP2, and the second connection portion CP2. In an exemplary embodiment, cutting points 10 and 20, along with the three groups of mesh openings and may be formed through a process of etching a conductive layer, and the mesh pattern may be formed as a result of the process.

Each of the cutting points of the first mesh lines MSL1 is illustrated as a first border point 10, and each of the cutting points of the second mesh lines MSL2 is illustrated as a second border point 20. A virtual line connecting the first border points 10 and the second border points 20 may correspond to the border line BDL. The first border points 10 and the second border points 20 may have a high reflectance to a source light, compared with other regions of the mesh lines MSL1 and MSL2.

The border line BDL may be substantially extended in the first crossing direction CDR1 or the second crossing direction CDR2. An extension direction of the border line BDL may vary depending on where the border line BDL is formed among the first sensor unit SP1 and the second sensor unit SP2. FIG. 7C illustrates an example, in which the border line BDL is deformed to have a zigzag shape or a serpentine shape. In an exemplary embodiment, the border line BDL may be a line shape extending in the first crossing direction CDR1 or the second crossing direction CDR2.

Figure 8A:
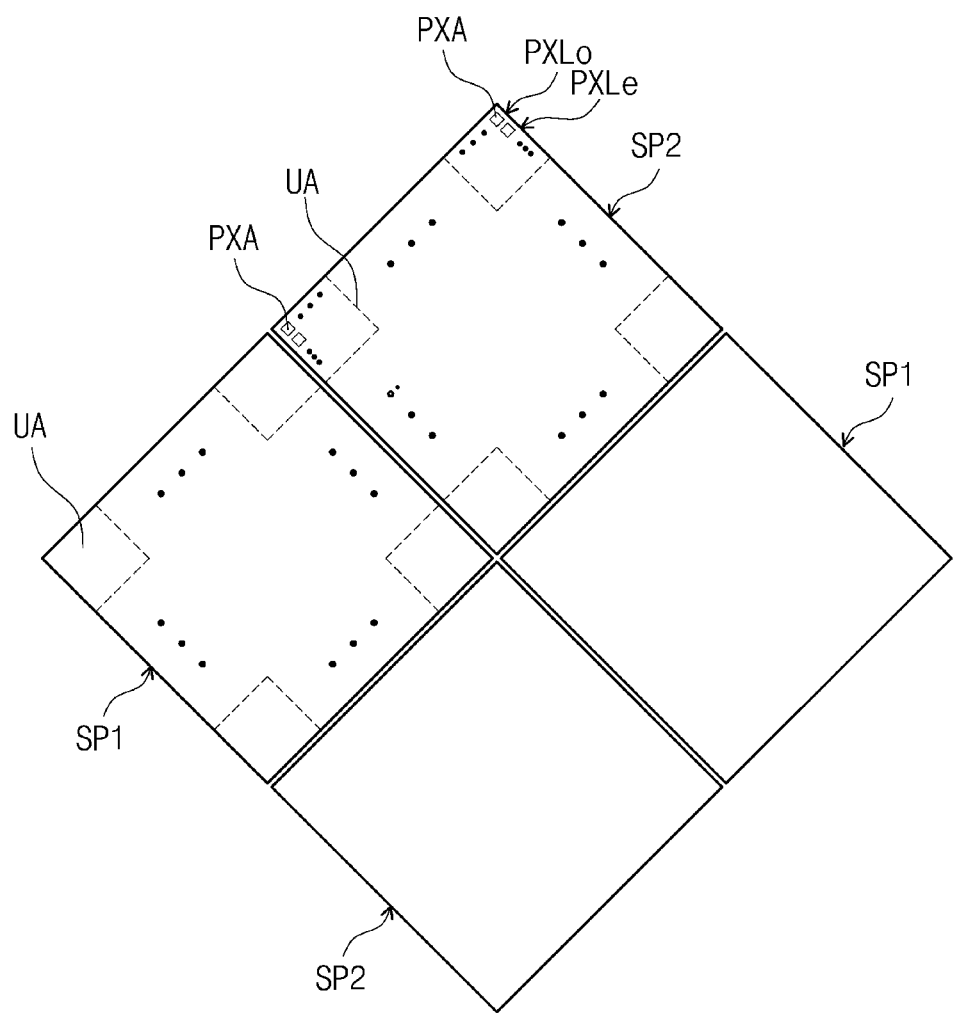
FIGS. 8A and 8B are plan views each illustrating disposition of unit regions relative to sensor units.
Figure 8A:
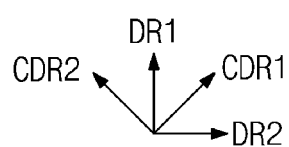
Figure 8B:
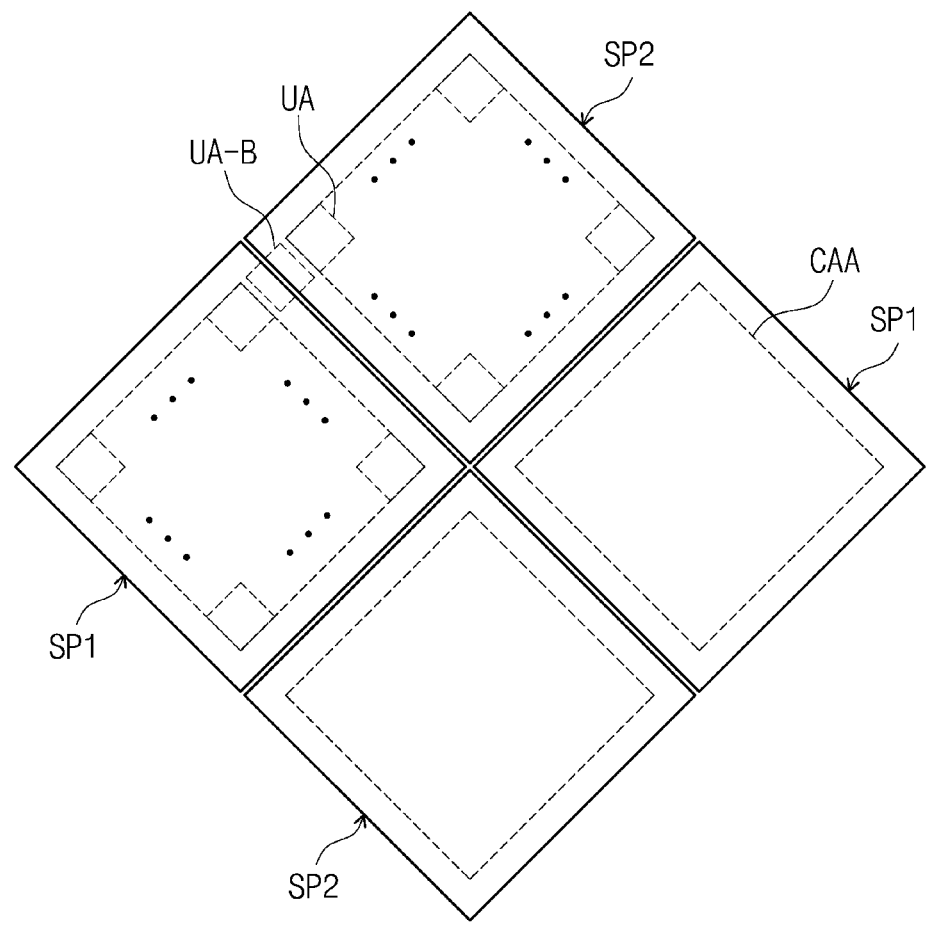

FIGS. 8A and 8B are plan views each illustrating disposition of the unit region UA relative to sensor units SP1 and SP2. FIGS. 8C, 8D, 8E, and 8F are plan views each illustrating the unit region UA according to an exemplary embodiment.

FIGS. 8A and 8B briefly illustrate two first sensor units SP1 and two second sensor units SP2 which are disposed around a single crossing region. In the following description of FIGS. 8A and 8B, the connection portions CP1 and CP2 will be neglected. Since the first connection portion CP1 is disposed on a plane different from the first sensor unit SP1 and the second sensor unit SP2 and the second connection portion CP2 has a relatively small area, the connection portions CP1 and CP2 may not affect the arrangement of the cutting points in the unit region UA. Therefore, the following description will be focused on a single second sensor unit SP2.

The second sensor unit SP2 may include a plurality of the unit regions UA. The unit region UA may be a region, in which cutting points to be described below are arranged according to a specific rule. As shown in FIG. 8A, the second sensor unit SP2 may be divided into a plurality of the unit regions UA.

As shown in FIG. 8A, a plurality of emission regions PXA may be disposed in the unit region UA. The emission regions PXA may be arranged to form a p-by-p matrix in the second sensor unit SP2. The emission regions PXA may be arranged to form a q-by-q matrix in the unit region UA. Here, p is a natural number, and q is a natural number less than p. The q may be a divisor of p. The p-by-p matrix and the q-by-q matrix may be defined based on the first and second crossing directions CDR1 and CDR2.

However, the exemplary embodiments are not limited thereto, and in an exemplary embodiment, the plurality of the unit regions UA may be disposed in only a center region CAA of the second sensor unit SP2, as shown in FIG. 8B. In this case, the number q may not be a divisor of p. In addition, a border unit region UA-B may be defined in a border region between the first sensor units SP1 and second sensor units SP2. In addition, the border unit region UA-B may be defined in a region, which is positioned between different electrodes (e.g., see FIG. 12B), and in which a border line (e.g., the border line BDL of FIG. 7C) can be defined besides the border region between the first sensor units SP1 and second sensor units SP2.

The border unit region UA-B may be a region, in which the cutting points are arranged in a manner similar to those in the unit region UA. The border unit region UA-B may include the same cutting points as those of the unit region UA and may further include the first border points 10 and the second border points 20 shown in FIG. 7C. Some of the first and second border points 10 and 20 may replace the cutting points of the unit region UA.

An example of the input sensor including the first and second electrode groups EG1 and EG2 have been described with reference to FIGS. 6A, 6B, 6C, 6D, 7A, 7B, 7C, 8A, and 8B, but the exemplary embodiments are not limited thereto. In an exemplary embodiment, the input sensor may include only one group of electrodes. The input sensor may include a touch sensor sensing an external input in a self-capacitance manner.

The first sensor unit SP1 and the second sensor unit SP2 shown in FIG. 8B may be included in one group of electrodes. The first sensor unit SP1 and the second sensor unit SP2 may be electrode spaced apart from each other. A signal line is connected to each of the first sensor unit SP1 and the second sensor unit SP2. Here, unlike that shown in FIG. 6A, the input sensor including only one group of electrodes may include only one conductive layer.

Figure 8C:
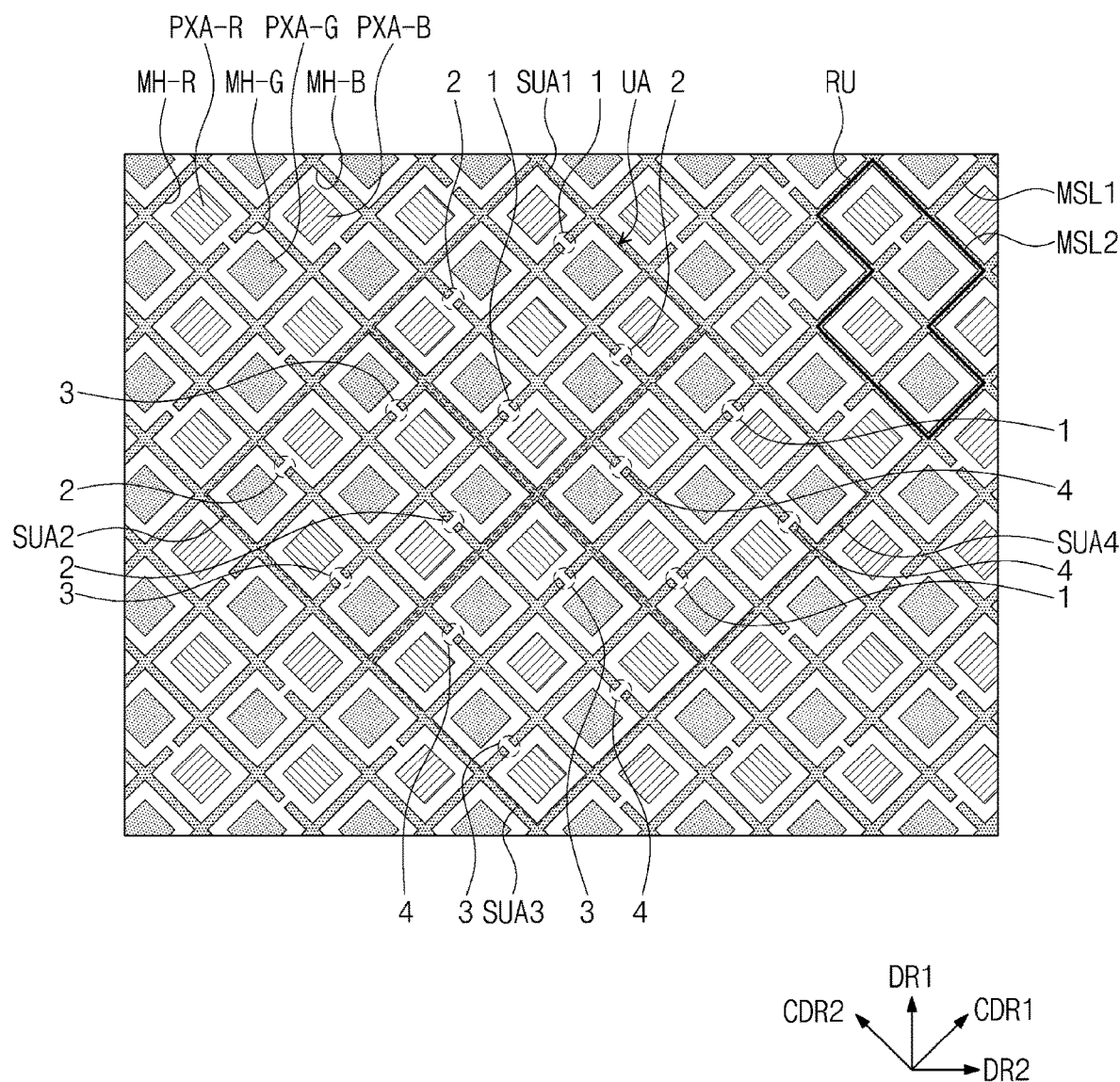
FIGS. 8C, 8D, 8E, and 8F are plan views each illustrating a unit region according to an exemplary embodiment.

Referring to FIG. 8C, a plurality of cutting points 1, 2, 3, and 4 disposed in the unit region UA are illustrated. In the above description of the sensing electrode with reference to FIGS. 7A, 7B, and 7C, the cutting points 1, 2, 3, and 4 are not shown, but a plurality of the cutting points 1, 2, 3, and 4 may be defined in the mesh lines MSL1 and MSL2 of the sensing electrode according to an exemplary embodiment. In the case where, as shown in FIGS. 7A, 7B, and 70, the cutting points 1, 2, 3, and 4 are not disposed, reflectance of a source light reflected from the mesh lines MSL1 and MSL2 may be substantially the same, regardless of a viewing angle.

The plurality of the cutting points 1, 2, 3, and 4 in the unit region UA may be disposed such that the mesh lines MSL1 and MSL2 are connected to each other to form a single electrode. That is, the mesh lines MSL1 and MSL2 may be cut by the cutting points 1, 2, 3, and 4, but the mesh lines MSL1 and MSL2 constituting at least one sensor unit SP1 or SP2 (e.g., see FIG. 7A) may be connected to each other.

The plurality of the cutting points 1, 2, 3, and 4 may include first cutting points 1 and 2, which are disposed between the first color emission regions PXA-B and the third color emission regions PXA-G, and second cutting points 3 and 4, which are disposed between the second color emission regions PXA-R and the third color emission regions PXA-G. The first cutting points 1 and 2 may be treated as being disposed between the first mesh opening MH-B and the third mesh opening MH-G, and the second cutting points 3 and 4 may be treated as being disposed between the second mesh opening MH-R and the third mesh opening MH-G.

In the unit region UA, the first cutting points 1 and 2 may be defined in the first and second mesh lines MSL1 and MSL2, respectively, and the second cutting points 3 and 4 may be defined in the first and second mesh lines MSL1 and MSL2, respectively. Hereinafter, the first cutting point of the first mesh lines MSL1 may be defined as a first point 1, the first cutting point of the second mesh lines MSL2 may be defined as a second point 2, the second cutting point of the first mesh lines MSL1 may be defined as a third point 3, and the second cutting point of the second mesh lines MSL2 may be defined as a fourth point 4.

Since the first to fourth points 1 to 4 are disposed in the unit region UA, a difference in visibility of the mesh lines MSL1 and MSL2 may be reduced, compared with the case that the cutting points are randomly disposed. The first to fourth points 1 to 4 may have high reflectance to a source light, compared with other regions of the mesh line. Brightness seen by a user may be high in a direction or viewing angle, in which relatively more cutting points are disposed. Since the cutting points are not concentrated in a specific direction, it may be possible to reduce a difference in visibility of the mesh lines MSL1 and MSL2 according to a viewing angle.

Furthermore, reflectance may be relatively high at the first border point 10 and the second border point 20 described with reference to FIG. 7C, but since the first to fourth points 1 to 4 are disposed in the first sensor unit SP1 and the second sensor unit SP2, it may be possible to suppress or prevent the border line BDL (e.g., see FIG. 7C) from being recognized by a user. In other words, the first to fourth points 1 to 4 may allow an internal reflectance of the first and second sensor units SP1 and SP2 to be increased to a level that is similar to the reflectance of the border region shown in FIG. 7C.

Referring to FIG. 8C, in the unit region UA, the number of the first point 1 may be equal to the number of the second point 2. FIG. 8C illustrates an example, in which four first points 1 and four second points 2 are disposed. If, in the unit region UA, a source light is emitted from only the first color emission region PXA-B, reflectance of the source light of the first color, which is measured in the first crossing direction CDR1, may be substantially equal to reflectance of the source light of the first color, which is measured in the second crossing direction CDR2.

Furthermore, in the unit region UA, the number of the third point 3 may be equal to the number of the fourth point 4. As a result, the numbers of the first to fourth points 1 to 4 may be the same. Reflectance values of the source lights of the second and third colors may be the same, regardless of crossing direction.

Referring to FIG. 8C, the unit region UA may include a first sub-region SUA1, a second sub-region SUA2, a third sub-region SUA3, and a fourth sub-region SUA4. Each of the first, second, third, and fourth sub-regions SUA1, SUA2, SUA3, and SUA4 may include emission regions, which are arranged to form a k-by-k matrix. The k-by-k matrix may be set based on the first crossing direction CDR1 and the second crossing direction CDR2.

The number k is a natural number that is coprime to h. Here, h may be the number of repeated emission regions. In the exemplary embodiment, the emission regions may constitute a plurality of repeatedly-arranged emission groups, in each of which one first color emission region PXA-B, one second color emission region PXA-R, and two third color emission regions PXA-G are arranged in a specific arrangement. A repletion unit RU is separately illustrated in FIG. 8C. Thus, the number h in the exemplary embodiment is four. As shown in FIG. 8C, the number k in the exemplary embodiment is three. The number k may be a divisor of p, described with reference to FIG. 8A.

In an exemplary embodiment, the emission regions may constitute a plurality of repeatedly-arranged emission groups, in each of which one first color emission region PXA-B, one second color emission region PXA-R, one third color emission region PXA-G, and one fourth color emission region are arranged in a specific arrangement. One of the two third color emission regions PXA-G in FIG. 8C may be replaced with the fourth color emission region. The fourth color may be yellow or white.

The third color emission region PXA-G may be disposed at a center of each of two sub-regions of the first, second, third, and fourth sub-regions SUA1, SUA2, SUA3, and SUA4, the first color emission region PXA-B may be disposed at a center of other sub-region of the first, second, third, and fourth sub-regions SUA1, SUA2, SUA3, and SUA4, and the second color emission region PXA-R may be disposed at a center of the remaining sub-region of the first, second, third, and fourth sub-regions SUA1, SUA2, SUA3, and SUA4. Referring to FIG. 8C, the third color emission region PXA-G may be disposed at centers of the second and fourth sub-regions SUA2 and SUA4. The second and fourth sub-regions SUA2 and SUA4 may face each other in the second direction DR2.

The second and third points 2 and 3 may be disposed in the second sub-region SUA2, which is one sub-region of the two sub-regions. The first and fourth points 1 and 4 may be disposed in the fourth sub-region SUA4, which is the other sub-region of the two sub-regions. The first and second points 1 and 2 may be disposed in the first sub-region SUA1, which is the other sub-regions. The third and fourth points 3 and 4 may be disposed in the third sub-region SUA3, which is the remaining sub-region.

Figure 8D:
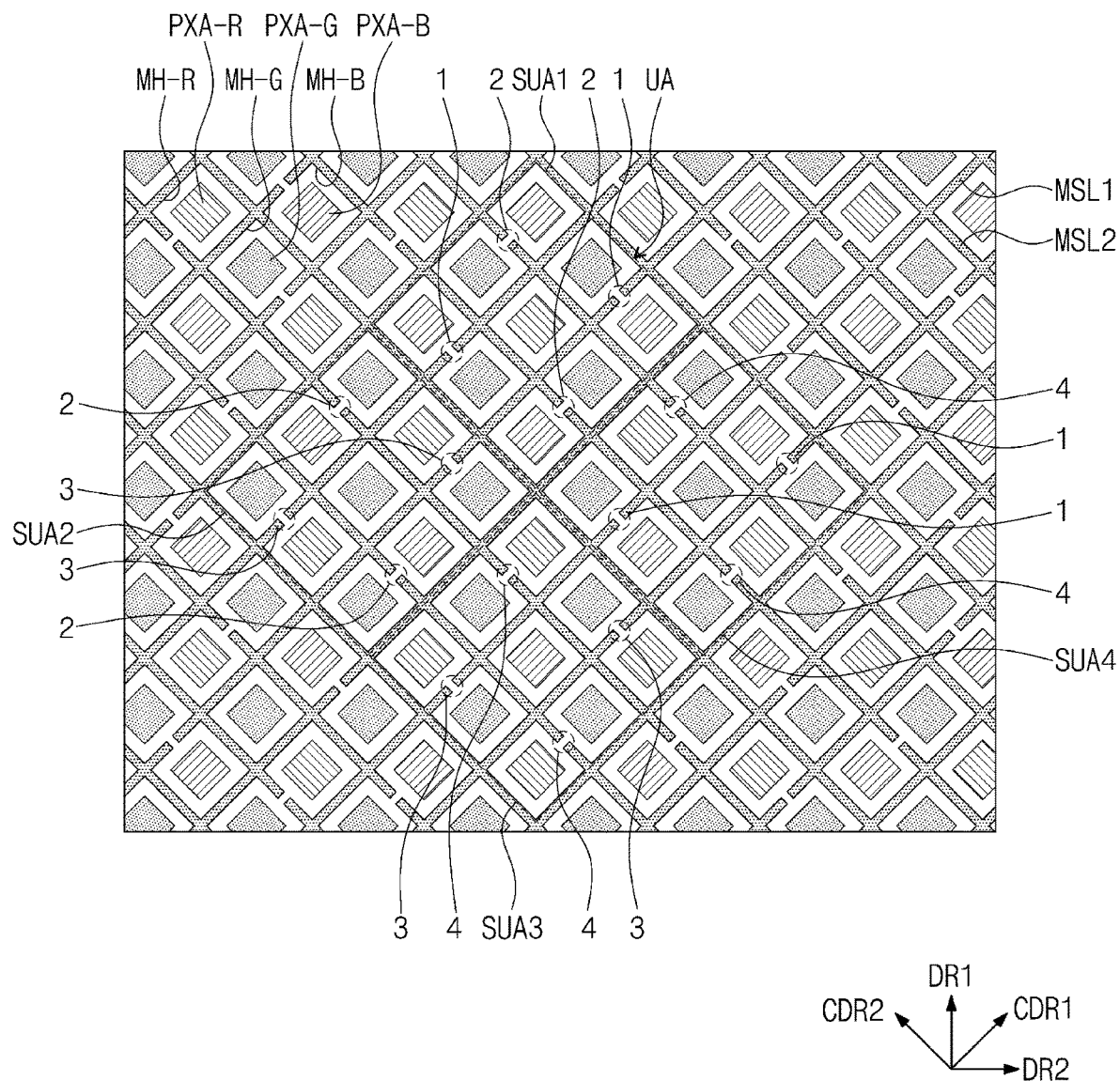

FIG. 8D illustrates the unit region UA (hereinafter, defined as a second embodiment), which is different from the unit region UA shown in FIG. 8C (hereinafter, defined as a first embodiment) in terms of the arrangement of the cutting points 1, 2, 3, and 4. The disposition or arrangement of the emission regions PXA-B, PXA-R, and PXA-G in the unit region UA of the second embodiment may be substantially the same as that of the emission regions PXA-B, PXA-R, and PXA-G in the unit region UA of the first embodiment.

The first to fourth points 1 to 4 of the second embodiment may be shifted in a clockwise direction, when compared with the first to fourth points 1 to 4 of the first embodiment. Referring to the first sub-region SUA1, in both of the first and second embodiments, two first points 1 and two second points 2 may be disposed in the first sub-region SUA1.

Referring to the unit region UA shown in FIG. 8E (hereinafter, defined as a third embodiment) and the unit region UA shown in FIG. 8F (hereinafter, defined as a fourth embodiment), the third color emission region PXA-G may be disposed at a center of each of the first sub-region SUA1 and the third sub-region SUA3.

Referring to the unit regions UA according to the third and fourth embodiments, the first points 1 and the fourth points 4 may be disposed in the first sub-region SUA1. The second points 2 and the third points 3 may be disposed in the third sub-region SUA3. The third points 3 and the fourth points 4 may be disposed in the second sub-region SUA2. The first points 1 and the second points 2 may be disposed in the fourth sub-region SUA4.

Figure 8E:
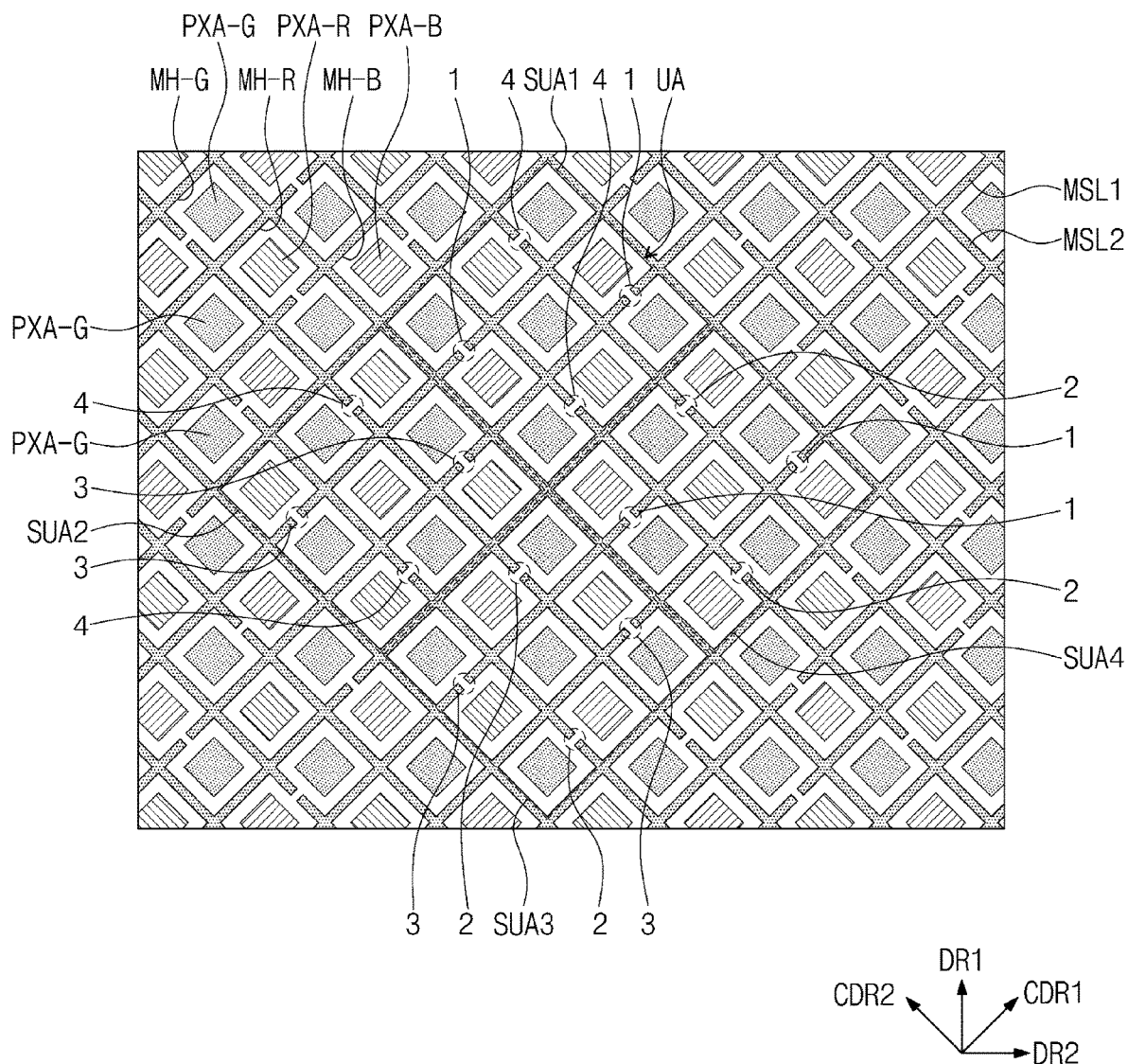
Figure 8F:
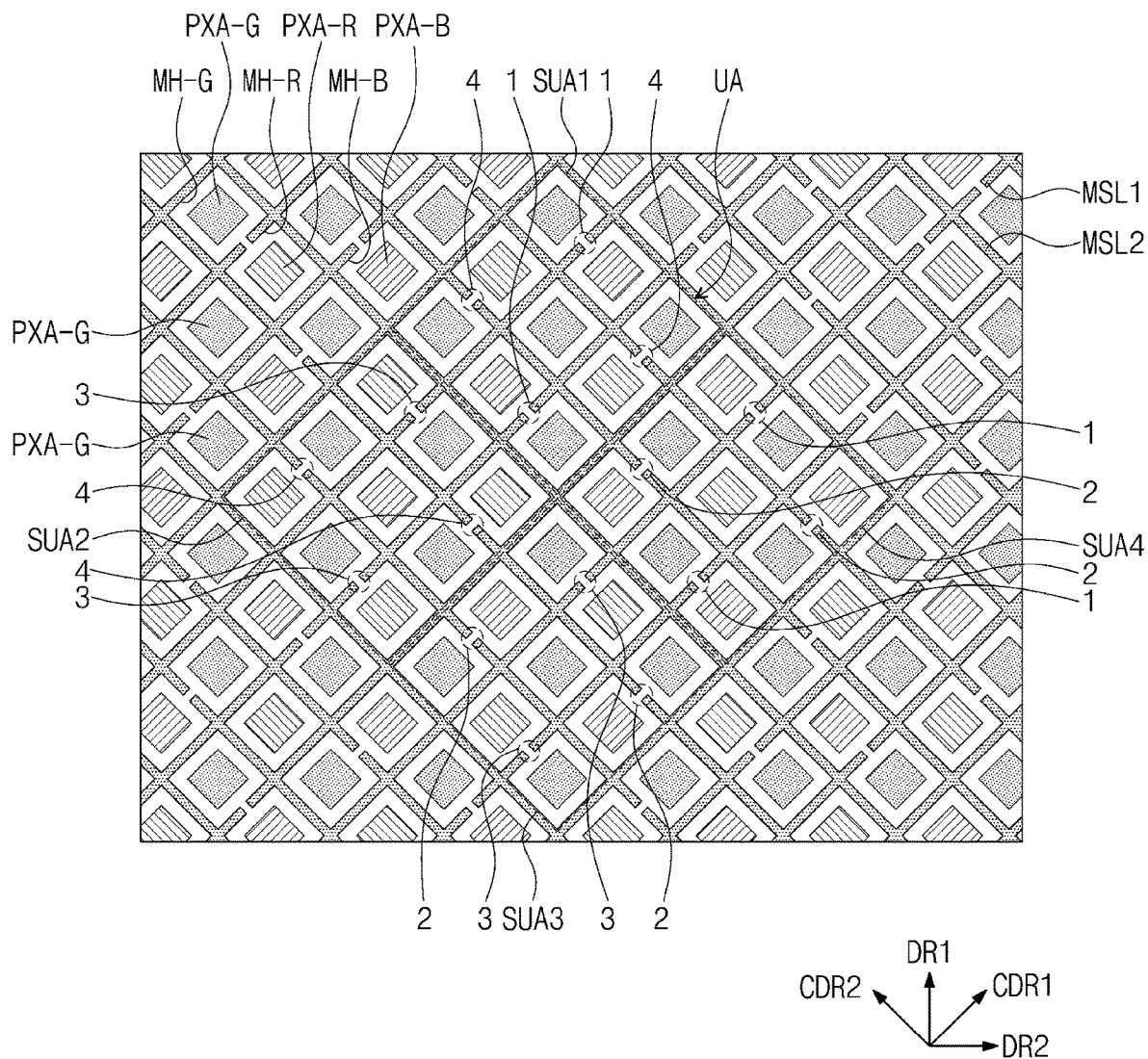

Referring to FIGS. 8E and 8F, in both of the third and fourth embodiments, two first points 1 and two fourth points 4 may be disposed in the first sub-region SUA1. The first to fourth points 1 to 4 of the fourth embodiment may be shifted in a counterclockwise direction, when compared with the first to fourth points 1 to 4 of the third embodiment.

FIGS. 9A, 9B, 9C, and 9D are plan views each illustrating the unit region UA according to an exemplary embodiment. Hereinafter, for concise description, an element previously described with reference to FIGS. 7A, 7B, 7C, 8A, 8B, 8C, 8D, 8E, and 8F may be identified by the same reference number without repeating an overlapping description thereof.

Referring to FIGS. 9A, 9B, 9C, and 9D, the emission regions PXA may be disposed to form a q-by-q matrix in the unit region UA. The unit region UA may include the first, second, third, and fourth sub-regions SUA1, SUA2, SUA3, and SUA4. Each of the first, second, third, and fourth sub-regions SUA1, SUA2, SUA3, and SUA4 may include emission regions, which are arranged to form a k-by-k matrix. The number k is a natural number that is coprime to h, and in the exemplary embodiment, the number k is five. In the exemplary embodiment, the number k may not be a divisor of p, described with reference to FIG. 8A.

Figure 9A:
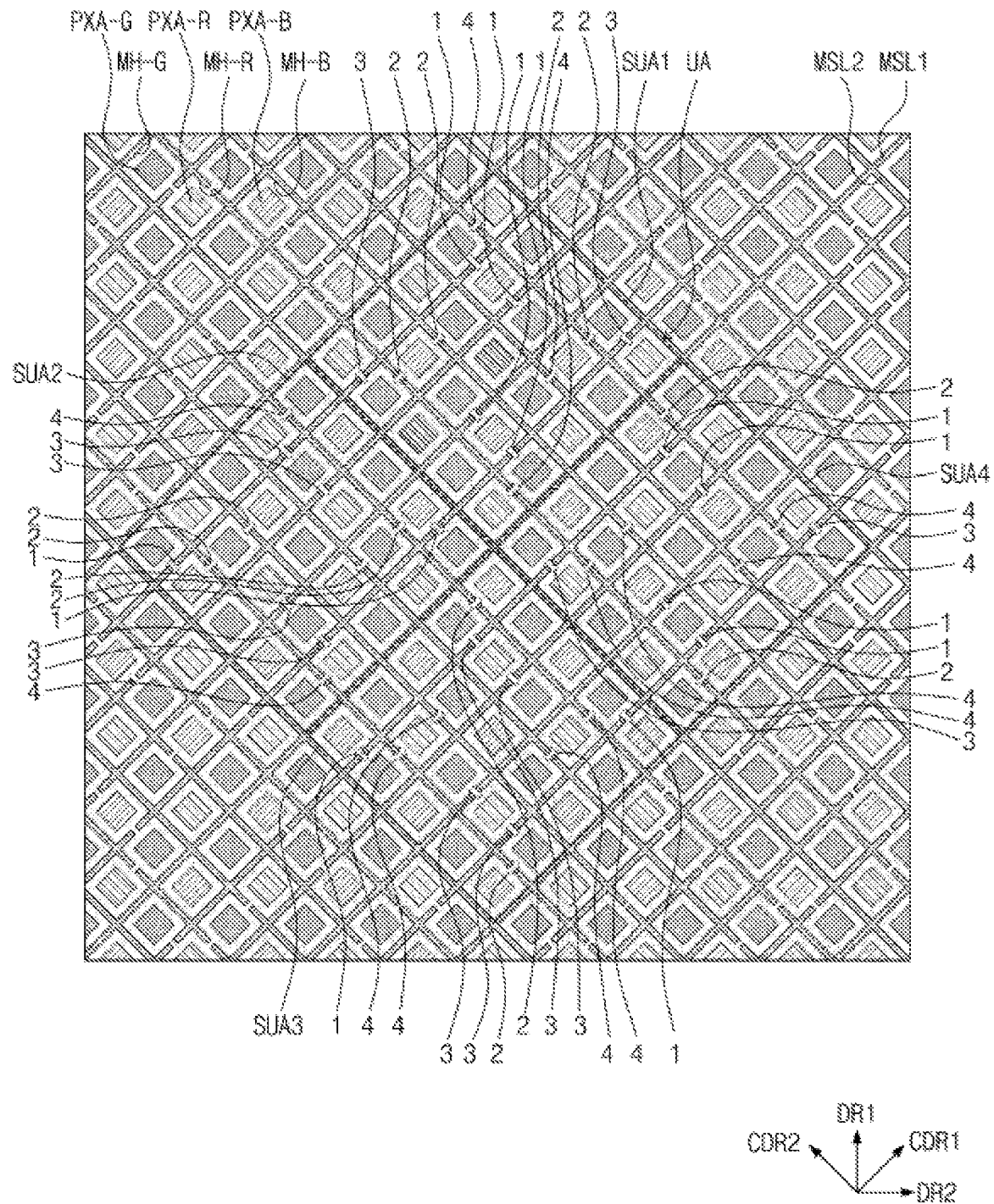
FIGS. 9A, 9B, 9C, and 9D are plan views each illustrating a unit region according to an exemplary embodiment.
Figure 9B:
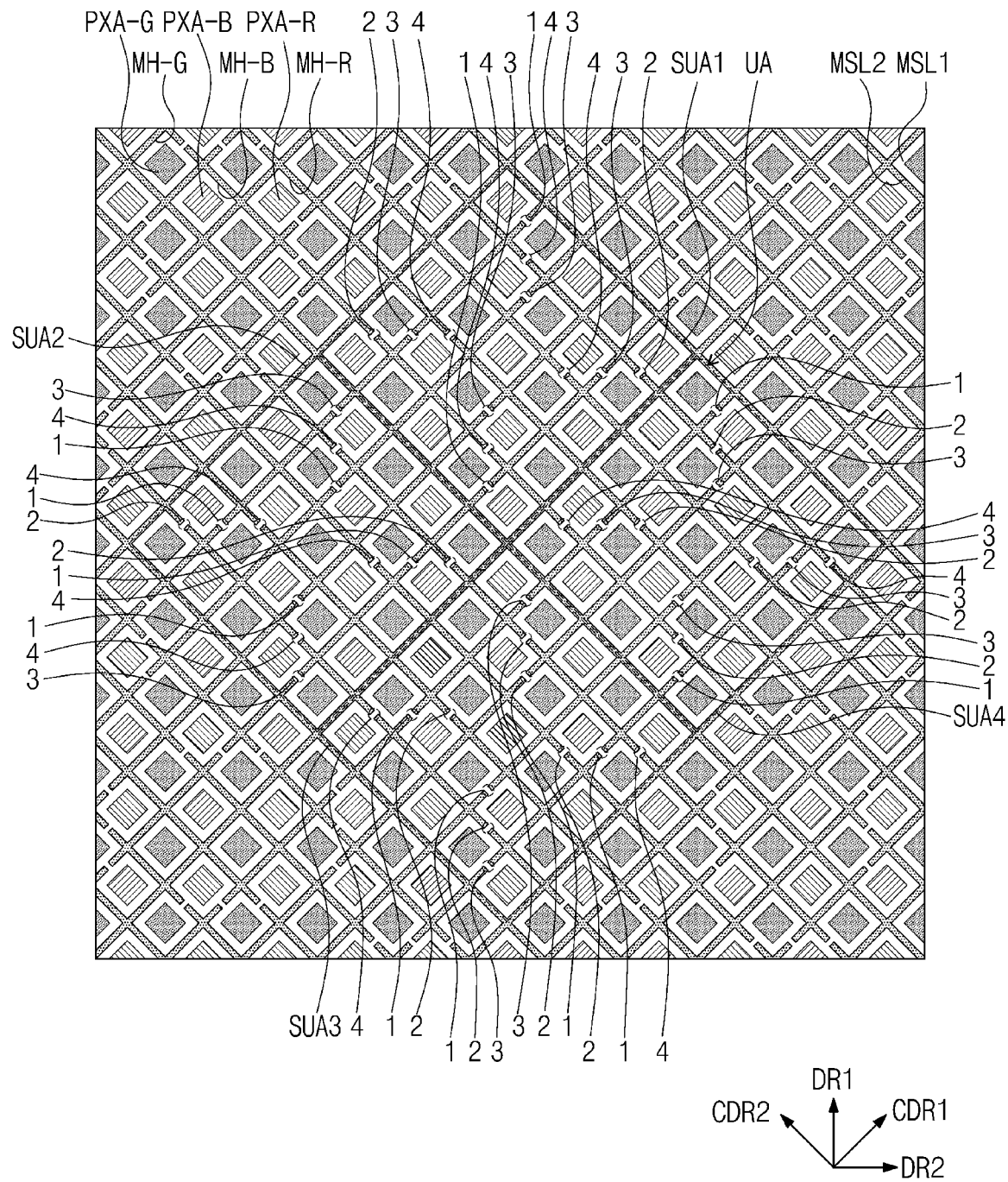

Referring to FIGS. 9A and 9B, the third color emission region PXA-G may be disposed at each of centers of the second and fourth sub-regions SUA2 and SUA4. Referring to FIG. 9A, the second color emission region PXA-R and the first color emission region PXA-B may be disposed at centers of the first sub-region SUA1 and the third sub-region SUA3, respectively. Referring to FIG. 9B, the first color emission region PXA-B and the second color emission region PXA-R may be disposed at centers of the first sub-region SUA1 and the third sub-region SUA3, respectively. Twelve cutting points 1, 2, 3, and 4 may be disposed in each of the first, second, third, and fourth sub-regions SUA1, SUA2, SUA3, and SUA4. In the unit region UA, the number of the first to fourth points 1 to 4 may the same (i.e., 12).

Figure 9C:
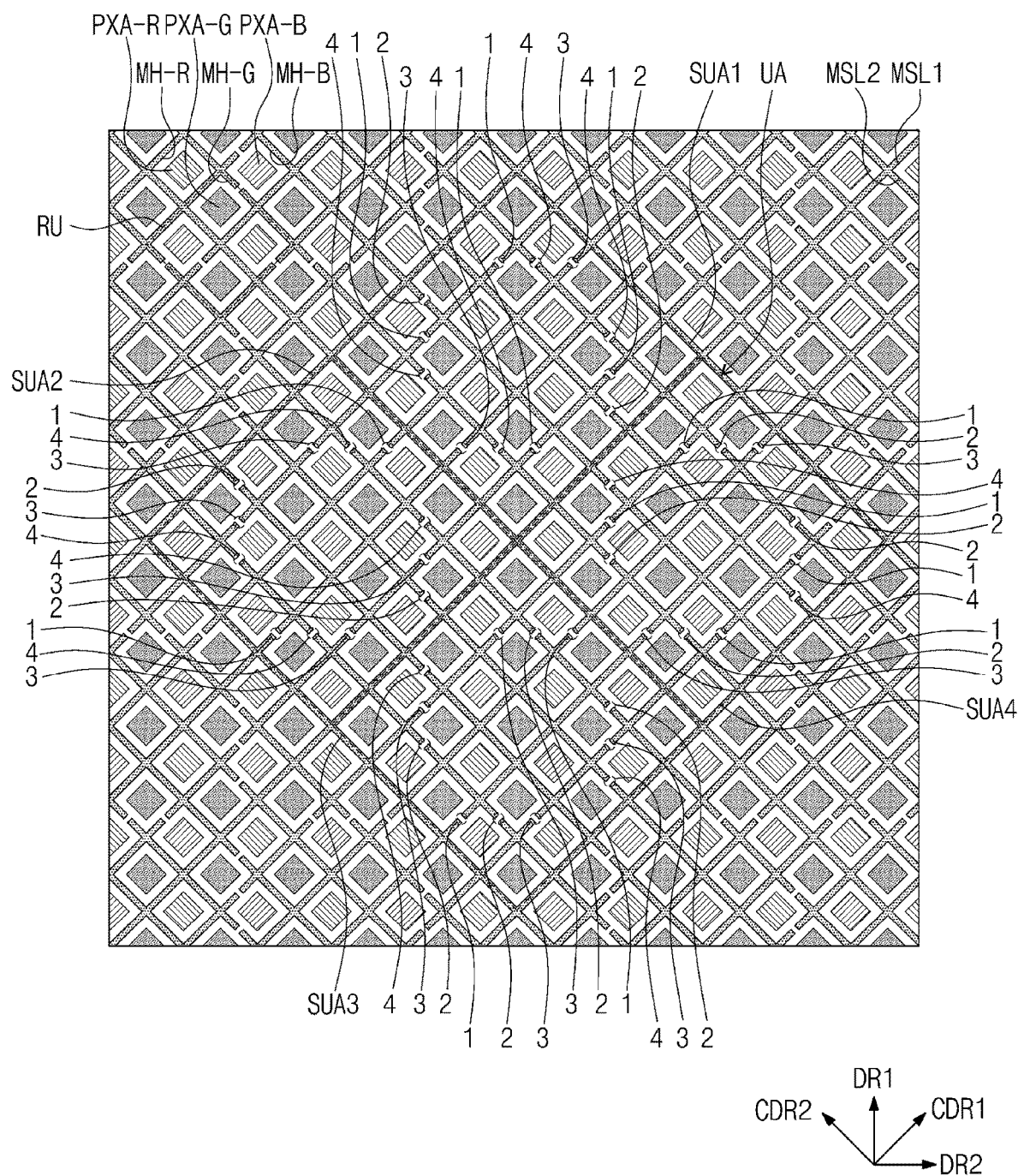
Figure 9D:
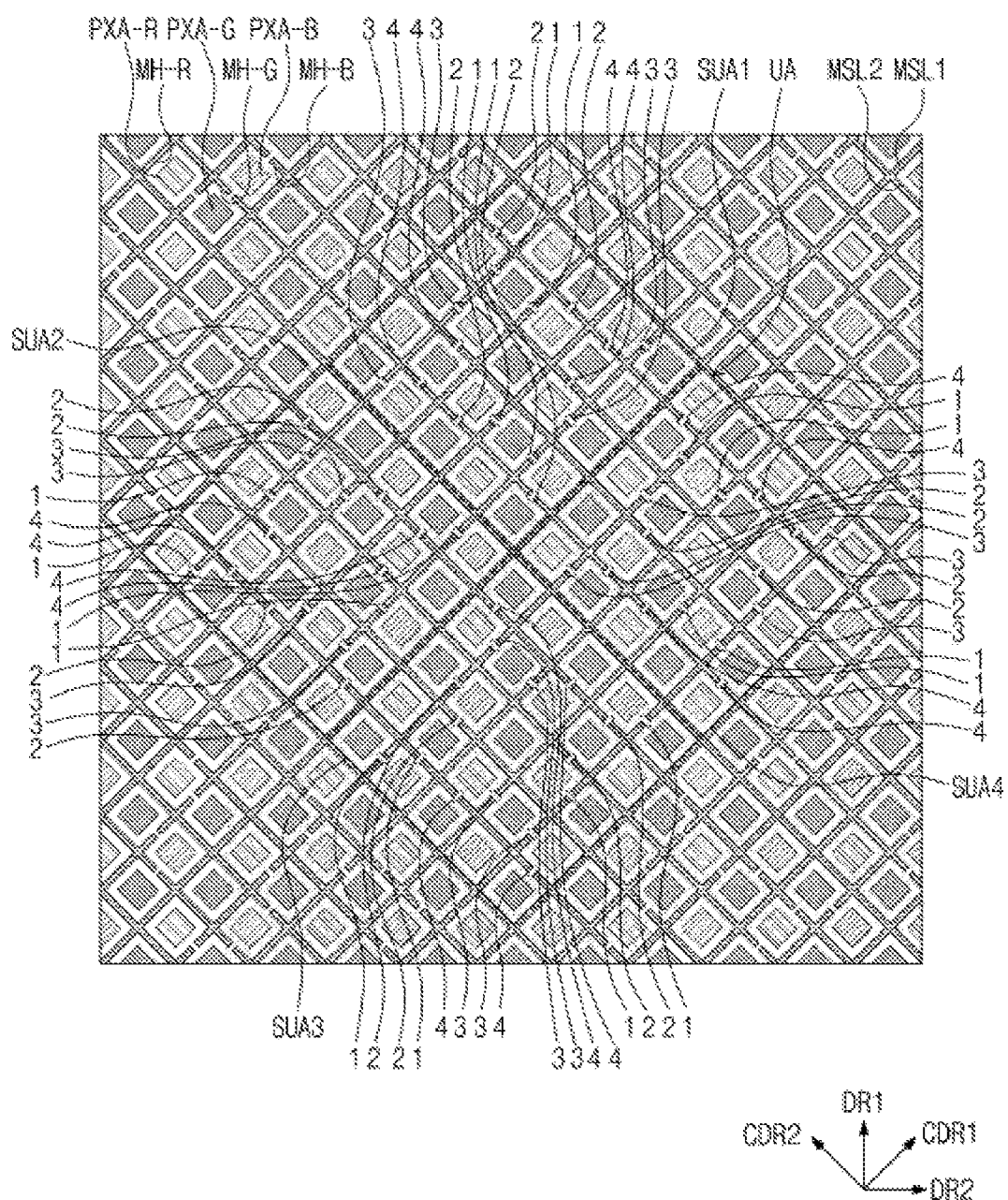

Referring to FIGS. 9C and 9D, the third color emission region PXA-G may be disposed at each of centers of the first sub-region SUA1 and the third sub-region SUA3. Referring to FIG. 9C, the first color emission region PXA-B and the second color emission region PXA-R may be disposed at centers of the second and fourth sub-regions SUA2 and SUA4, respectively. Twelve cutting points 1, 2, 3, and 4 may be disposed in each of the first, second, third, and fourth sub-regions SUA1, SUA2, SUA3, and SUA4. In the unit region UA, the numbers of the first to fourth points 1 to 4 may the same (i.e., 12).

Referring to FIG. 9D, the first color emission region PXA-B and the second color emission region PXA-R may be disposed at centers of the second and fourth sub-regions SUA2 and SUA4, respectively. Sixteen cutting points 1, 2, 3, and 4 may be disposed in each of the first, second, third, and fourth sub-regions SUA1, SUA2; SUA3, and SUA4. Each of the first to fourth points 1 to 4 may be disposed by sixteen in the unit region UA. Each of the first to fourth points 1 to 4 may be disposed by four in each of the first, second, third, and fourth sub-regions SUA1, SUA2, SUA3, and SUA4.

Figure 10A:
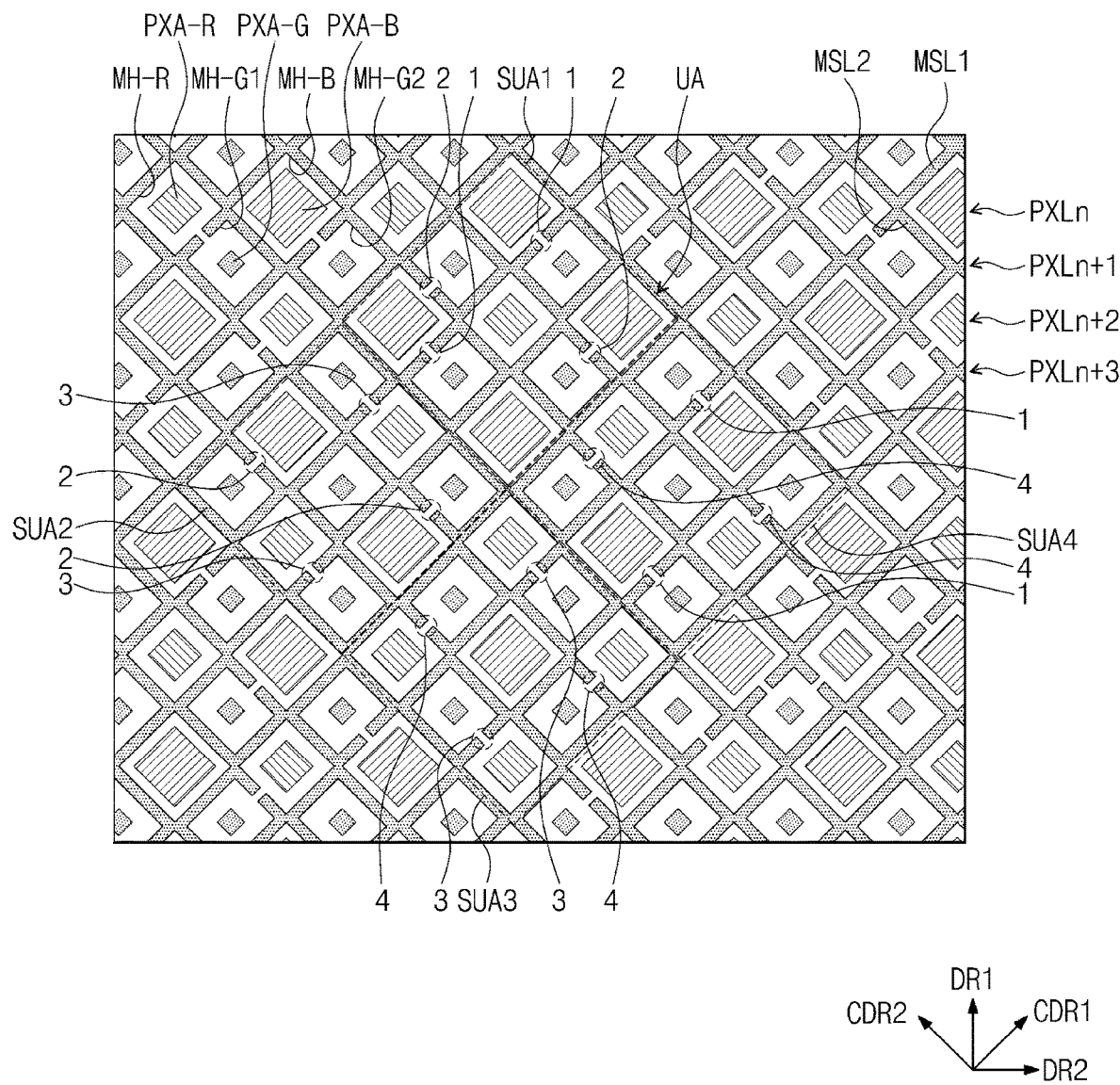
FIGS. 10A and 10B are plan views each illustrating a unit region according to an exemplary embodiment.
Figure 10B:
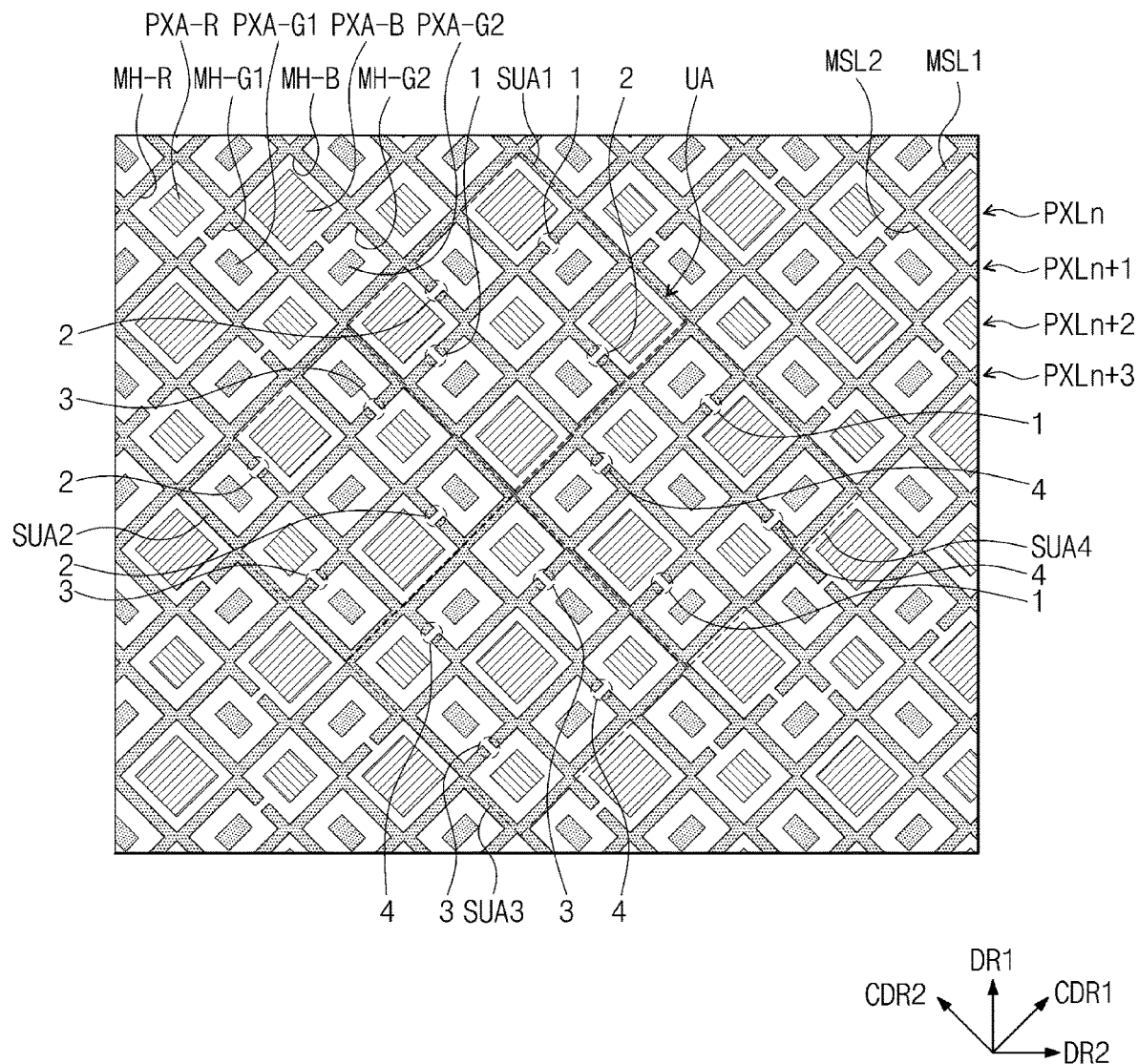

FIGS. 10A and 10B are plan views each illustrating the unit region UA according to an exemplary embodiment. Hereinafter, for concise description, an element previously described with reference to FIGS. 7A, 7B, 7C, 8A, 8B, 8C, 8D, 8E, 8F, 9A, 9B, 9C, and 9D may be identified by the same reference number without repeating an overlapping description thereof.

FIG. 10A illustrates the unit region UA, which corresponds to the unit region UA of FIG. 8C. In the exemplary embodiment, the first color emission region PXA-B, the second color emission region PXA-R, and the third color emission region PXA-G may have different areas from each other. The first color emission regions PXA-B may have an area larger than those of the second color emission regions PXA-R and the third color emission regions PXA-G, and the second color emission regions PXA-R may have an area larger than that of the third color emission regions PXA-G.

The first mesh opening MH-B, the second mesh opening MH-R, and the third mesh opening MH-G may have different areas from each other. The first mesh openings MH-B may have an area larger than those of the second mesh openings MH-R and the third mesh openings MH-G, and the second mesh openings may have an area larger than that of the third mesh openings MH-G. The third mesh openings MH-G may include mesh openings MH-G1, each of which has a first shape, and mesh openings MH-G2, each of which has a second shape different from the first shape of the mesh openings MH-G1. The areas and shapes of the mesh openings MH-B, MH-R, MH-G1, and MH-G2 will be compared below. The areas and shapes of the mesh openings MH-B, MH-R, MH-G1, and MH-G2 will be compared under the assumption that the cutting points 1, 2, 3, and 4 are filled with the mesh line.

The mesh lines MSL1 and MSL2 may include a plurality of portions, and in this case, the mesh openings MH-B, MH-R, MH-G1, and MH-G2 may have at least two different areas. Each of the mesh lines MSL1 and MSL2 may include first portions and second portions, which are alternately disposed along its extension direction. This may be similar to a structure, in which the first portion and the second portion of the first mesh line MSL1 and the first portion and the second portion of the second mesh line MSL2 are connected to each other at the cross point CRP. This may be similar to a structure, in which the four portion extend in different directions around the cross point CRP.

As shown in FIG. 10B, the third color emission regions PXA-G may include first-shaped emission regions PXA-G1 and second-shaped emission regions PXA-G2, which have a shape different from the first-shaped emission regions PXA-G1.

The first-shaped emission regions PXA-G1 and the second-shaped emission regions PXA-G2 may have a symmetric shape about the first direction DR1. The first-shaped emission regions PXA-G1 and the second-shaped emission regions PXA-G2 may have substantially the same area.

In the (n+1)-th emission row PXLn+1, the first-shaped emission regions PXA-G1 and the second-shaped emission regions PXA-G2 may be alternately disposed in the second direction DR2, and in the (n+3)-th emission row PXLn+3, the first-shaped emission regions PXA-G1 and the second-shaped emission regions PXA-G2 may be alternately disposed in the second direction DR2. A disposition order of the emission regions of the (n+1)-th emission row PXLn+1 may differ from a disposition order of the emission regions of the (n+3)-th emission row PXLn+3.

Although not shown, the first color emission region PXA-B, the second color emission region PXA-R, the third color emission region PXA-G, PXA-G1, or PXA-G2, the first mesh opening MH-B, the second mesh opening MH-R, and the third mesh opening MH-G1 or MH-G2 shown in FIGS. 10A and 10B may also be applied to the unit region UA shown in FIGS. 8D, 8E, 8F, 9A, 9B, 9C, and 9D.

Figure 11A:
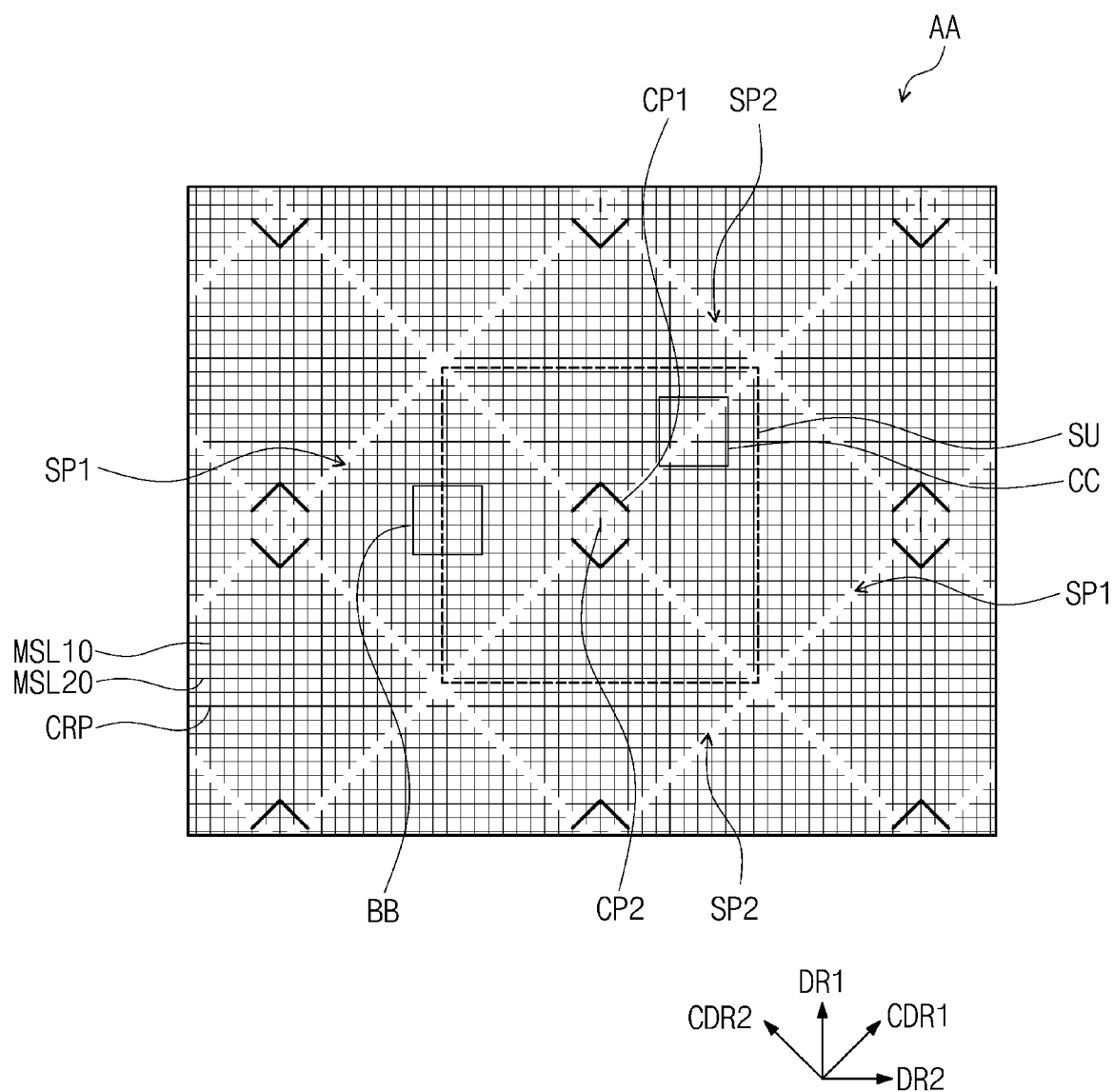
FIG. 11A is an enlarged plan view illustrating a region 'AA' of FIG. 6B.
Figure 11B:
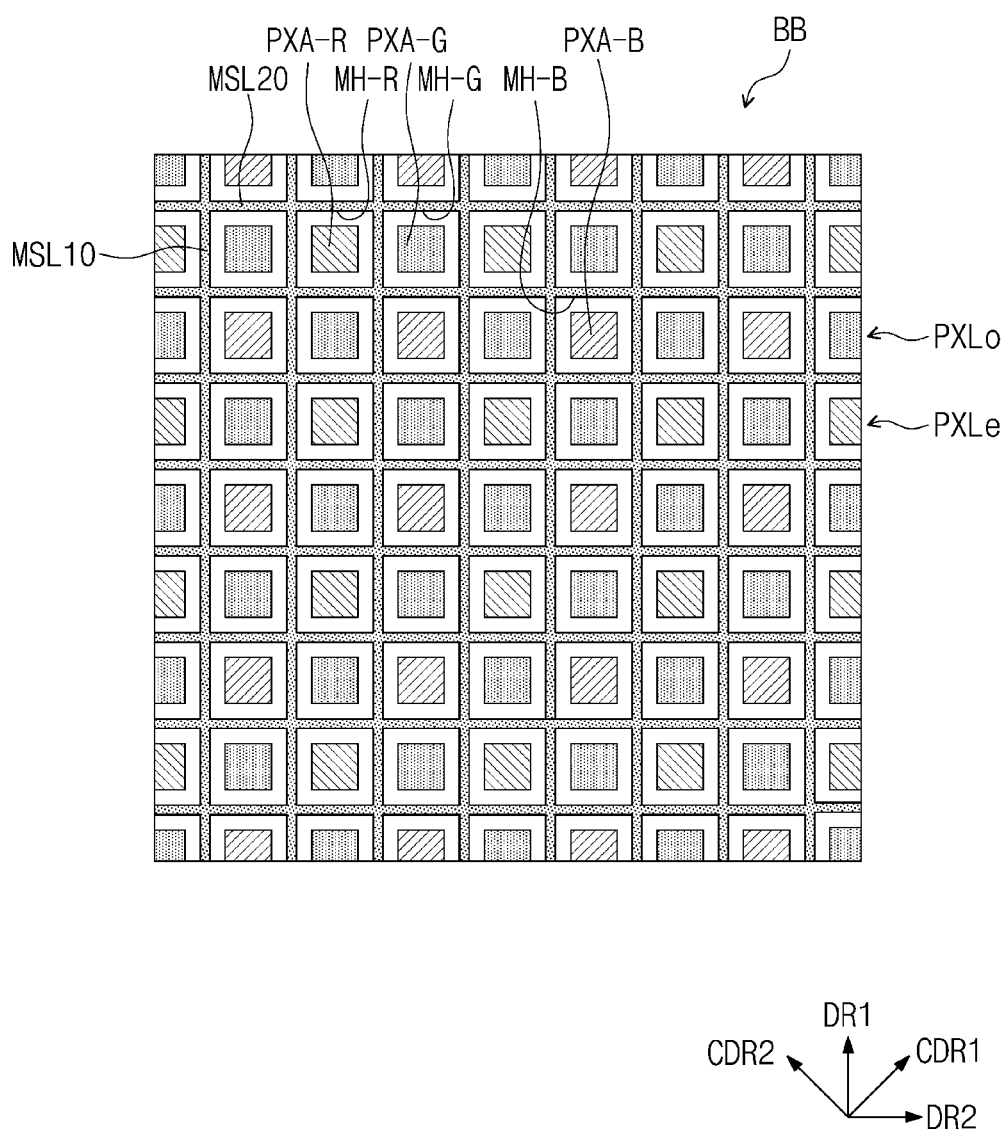
FIG. 11B is an enlarged plan view illustrating a region 'BB' of FIG. 11A.
Figure 11C:
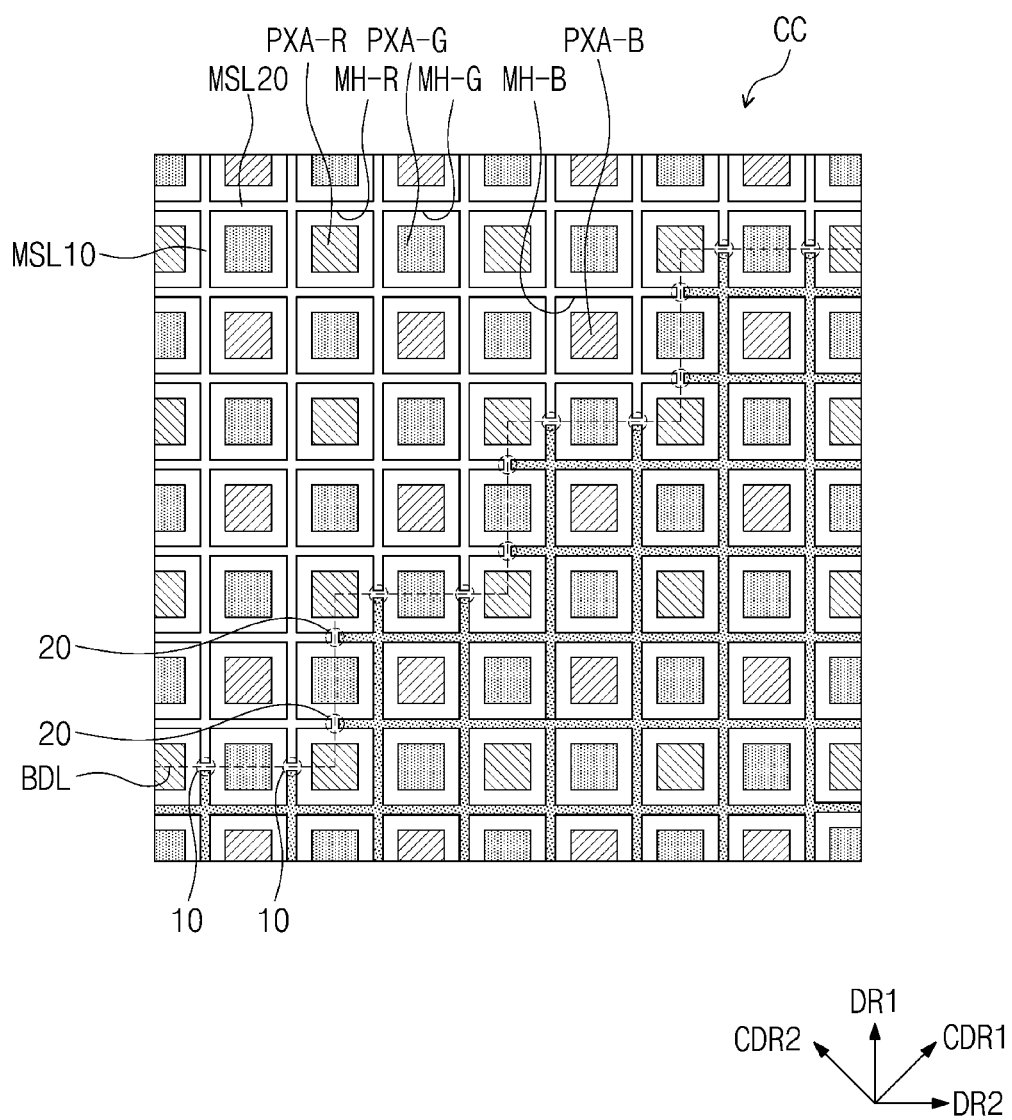
FIG. 11C is an enlarged plan view illustrating a region 'CC' of FIG. 11A.
Figure 11D:
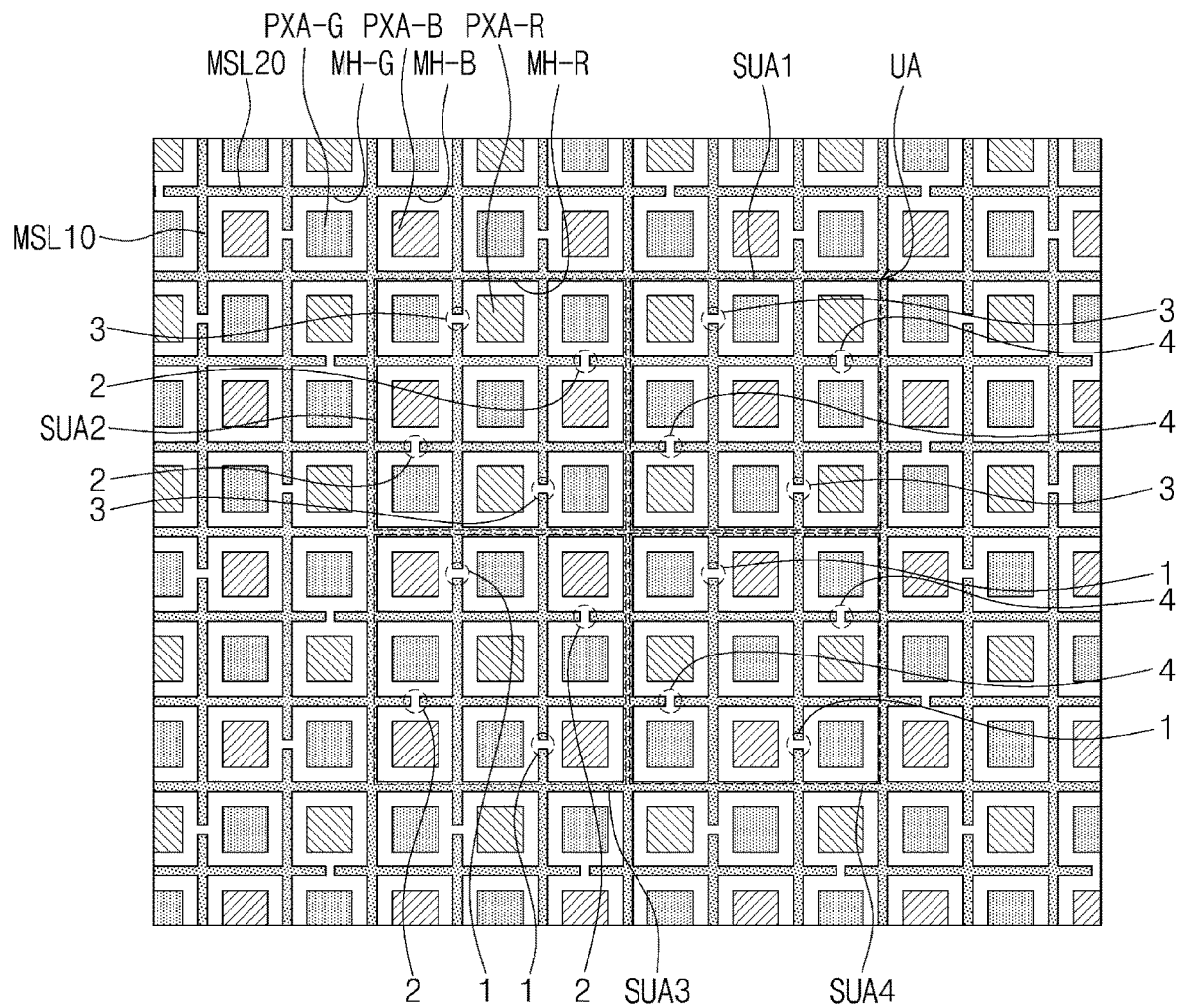
FIG. 11D is a plan view illustrating a unit region according to an exemplary embodiment.
Figure 11D:
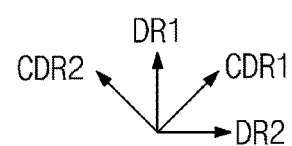

FIG. 11A is an enlarged plan view illustrating a region 'AA' of FIG. 6B. FIG. 11B is an enlarged plan view illustrating a region 'BB' of FIG. 11A. FIG. 11C is an enlarged plan view illustrating a region 'CC' of FIG. 11A. FIG. 11D is a plan view illustrating the unit region UA according to an exemplary embodiment.

FIGS. 11A, 11B, and 11C correspond to FIGS. 7A, 7B, and 7C, respectively, and FIG. 11D corresponds to FIG. 8C. In the exemplary embodiment, mesh lines MSL10 and MSL20 may include first mesh lines MSL10 extending in the first direction DR1 and second mesh lines MSL20 extending in the second direction DR2. The first mesh lines MSL10 may extend in the same direction as an extension direction of the second electrode group EG2 (e.g., see FIG. 6B), and the second mesh lines MSL20 may extend in the same direction as an extension direction of the first electrode group EG1 (e.g., see FIG. 6B).

Referring to FIG. 11B, the plurality of the emission regions PXA-B, PXA-R, and PXA-G may be classified into a plurality of the emission rows PXLo and PXLe, based on the first and second directions DR1 and DR2. The emission rows PXLo and PXLe may include the odd-numbered emission rows PXLo and the even-numbered emission rows PXLe. The odd-numbered emission rows PXLo may have the same arrangement of the emission regions, and the even-numbered emission rows PXLe may have the same arrangement of the emission regions. One group of the odd-numbered emission rows PXLo and the even-numbered emission rows PXLe may include the first color emission regions PXA-B and the third color emission regions PXA-G, which are alternately arranged in the second direction DR2. Another group of the odd-numbered emission rows PXLo and the even-numbered emission rows PXLe may include the second color emission regions PXA-R and the third color emission regions PXA-G, which are alternately arranged in the second direction DR2. The third color emission regions PXA-G of the odd-numbered emission rows PXLo and the third color emission regions PXA-G of the even-numbered emission rows PXLe may be disposed in a staggered manner with respect to each other.

Referring to FIG. 11C, each of the cutting points of the first mesh lines MSL10 is illustrated as the first border point 10, and each of the cutting points of the second mesh lines MSL20 is illustrated as the second border point 20. A virtual line connecting the first border points 10 and the second border points 20 may correspond to the border line BDL. The border line BDL may extend in a direction substantially crossing the first and second directions DR1 and DR2.

Referring to FIG. 11D, a plurality of the cutting points 1, 2, 3, and 4 disposed in the unit region UA are illustrated. The unit region UA may include the first, second, third, and fourth sub-regions SUA1, SUA2, SUA3, and SUA4. Each of the first, second, third, and fourth sub-regions SUA1, SUA2, SUA3, and SUA4 may include emission regions, which are arranged to form a k-by-k matrix. The k-by-k matrix may be set based on the first and second directions DR1 and DR2. In the exemplary embodiment, the number k may be three.

The third color emission region PXA-G may be disposed at centers of the second and fourth sub-regions SUA2 and SUA4, the first color emission region PXA-B may be disposed at a center of the first sub-region SUA1, and the second color emission region PXA-R may be disposed at a center of the third sub-region SUA3. The second points 2 and the third points 3 may be disposed in the second sub-region SUA2. The first points 1 and the fourth points 4 may be disposed in the fourth sub-region SUA4. The first points 1 and the second points 2 may be disposed in the third sub-region SUA3. In the unit region UA, the numbers of the first to fourth points 1 to 4 may be the same.

Although not shown, in the case where the first mesh lines MSL10 extending in the first direction DR1 and the second mesh lines MSL20 extending in the second direction DR2 are used to realize the first and second electrode groups EG1 and EG2 (e.g., see FIG. 6B), the disposition of the cutting points 1, 2, 3, and 4 in the unit region UA may be changed with reference to the disposition of the cutting points 1, 2, 3, and 4 shown in FIGS. 8D, 8E, 8F, 9A, 9B, 9C, and 9D. Such a change may be achieved in consideration of a relationship between the disposition of the cutting points 1, 2, 3, and 4 of FIG. 8C and the disposition of the cutting points 1, 2, 3, and 4 of FIG. 11D, and thus, a detailed description thereof will be omitted.

Figure 12A:
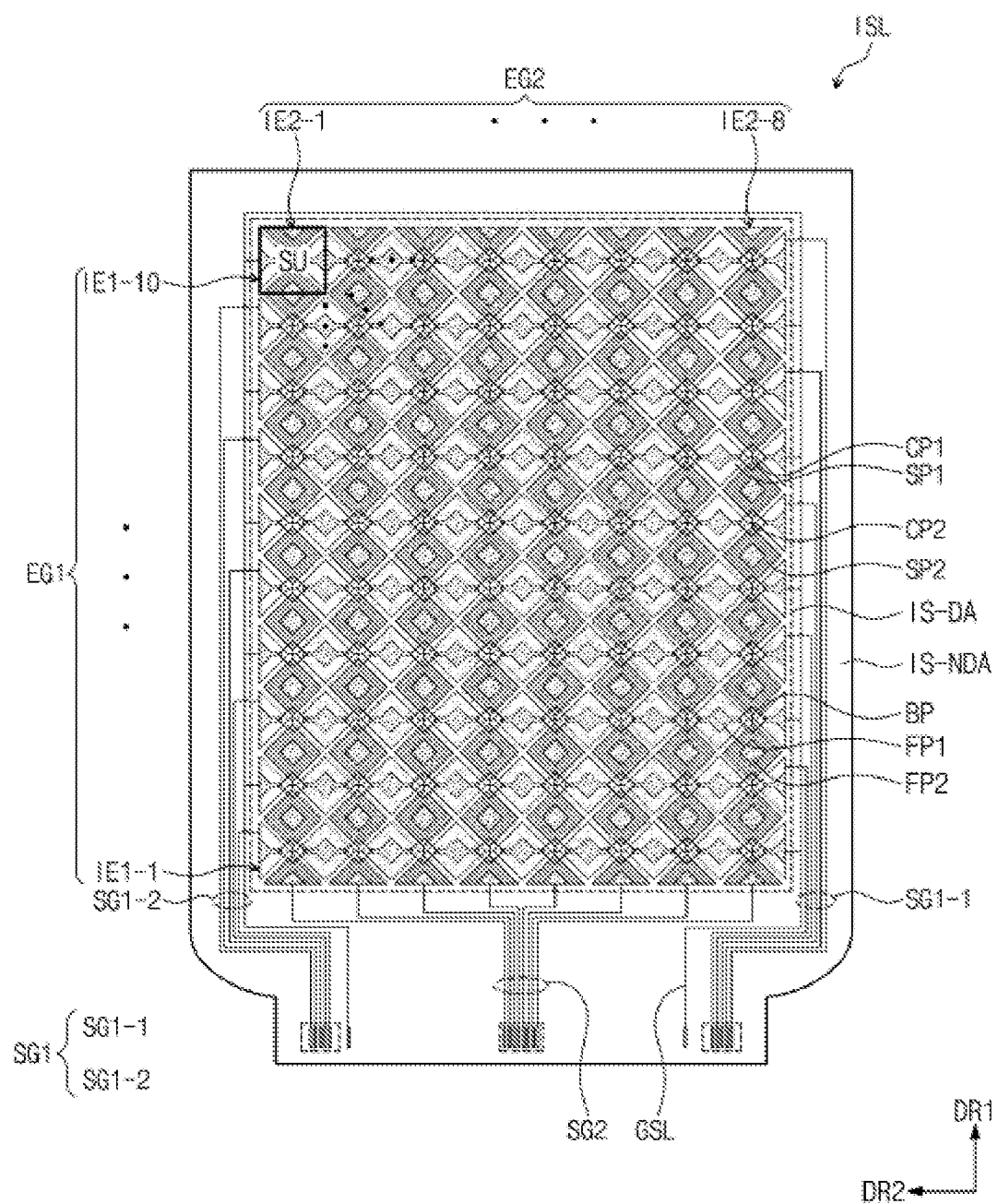
FIG. 12A is a plan view illustrating an input sensing layer according to an exemplary embodiment.
Figure 12B:
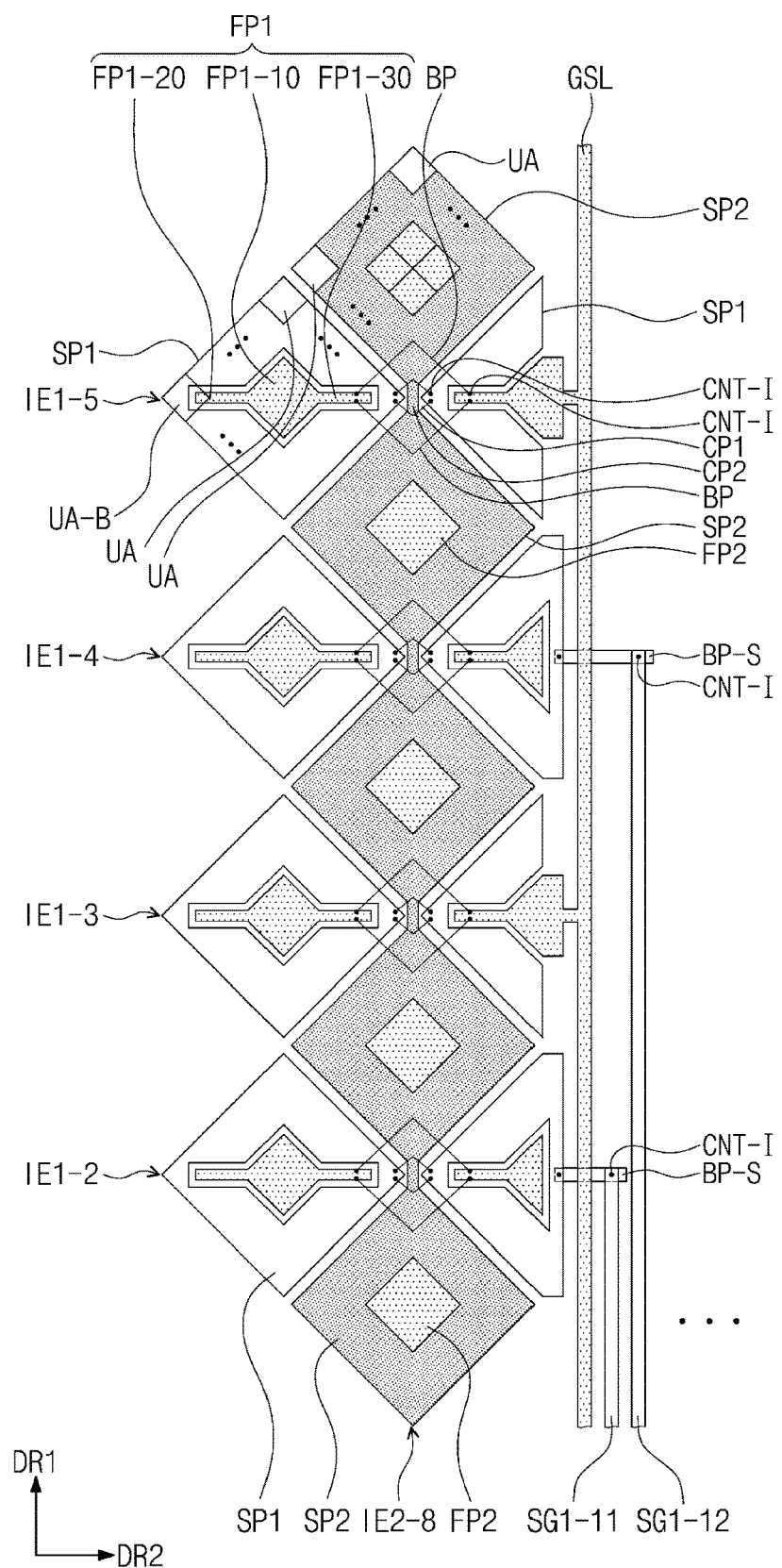
FIG. 12B is an enlarged plan view illustrating a region of FIG. 12A.
Figure 12C:
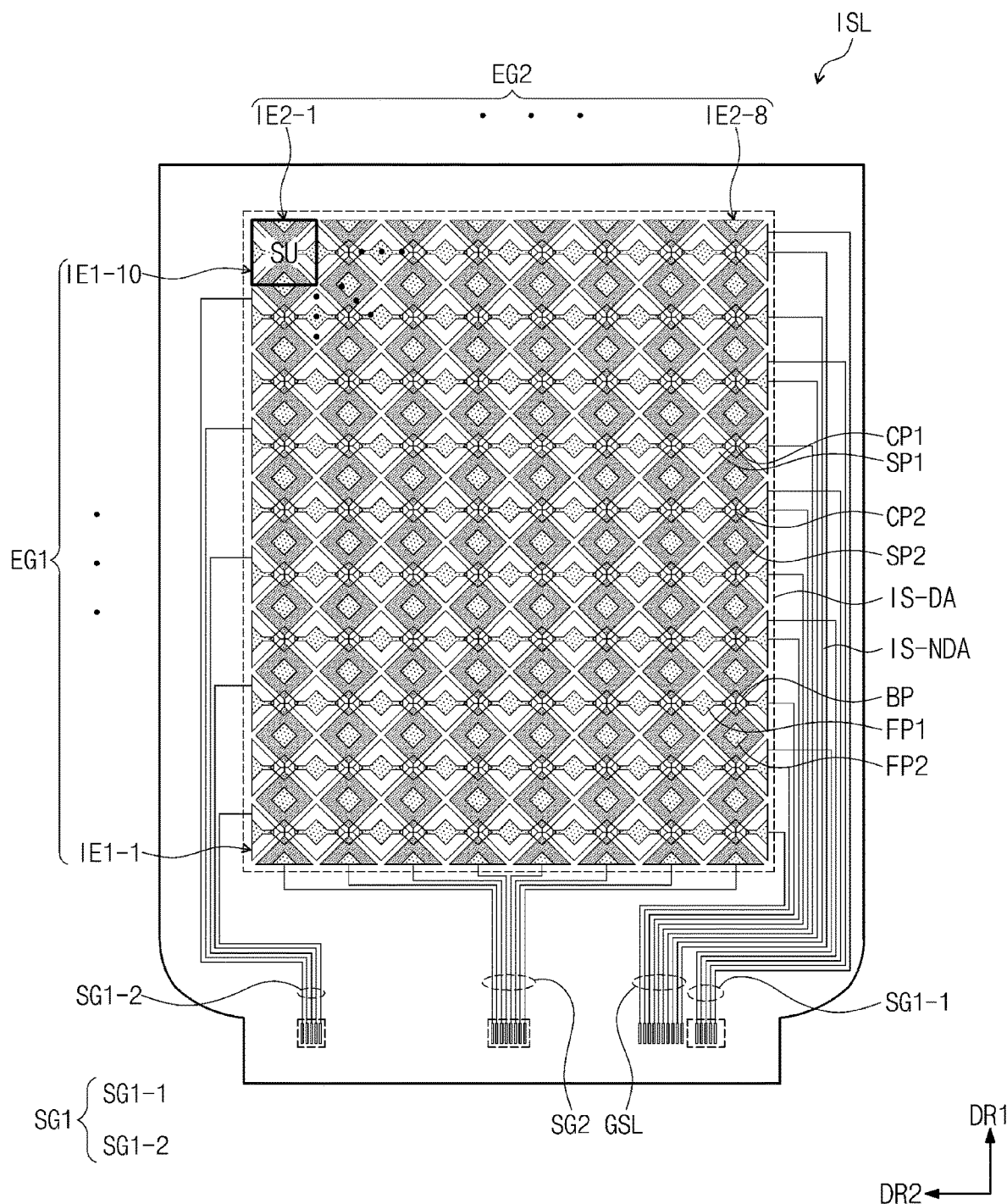
FIG. 12C is a plan view illustrating an input sensing layer according to an exemplary embodiment.

FIG. 12A is a plan view illustrating the input sensing layer ISL according to an exemplary embodiment. FIG. 12B is an enlarged plan view illustrating a region of FIG. 12A. FIG. 12C is a plan view illustrating the input sensing layer ISL according to an exemplary embodiment. Hereinafter, for concise description, an element previously described with reference to FIGS. 1, 2A, 2B, 2C, 2D, 3A, 3B, 4, 5A, 5B, 6A, 6B, 6C, 6D, 7A, 7B, 7C, 8A, 8B, 8C, 8D, 8E, 8F, 9A, 9B, 9C, 9D, 10A, 10B, 11A, 11B, 11C, and 11D may be identified by the same reference number without repeating an overlapping description thereof.

As shown in FIGS. 12A and 12B, the input sensing layer ISL may further include an auxiliary electrode, which is disposed inside the sensing electrode and is electrically disconnected from the sensing electrode. The sensing electrode may include the first sensing electrodes IE1-1 to IE1-10 and the second sensing electrodes IE2-1 to IE2-8. The auxiliary electrode may include at least one of a first auxiliary electrode FP1, which is associated with the first sensing electrodes IE1-1 to IE1-10, and a second auxiliary electrode FP2, which is associated with the second sensing electrodes IE2-1 to IE2-8.

The first auxiliary electrode FP1 may be disposed inside the first sensor units SP1, and the second auxiliary electrode FP2 may be disposed inside the second sensor units SP2. Since the first auxiliary electrode FP1 and the second auxiliary electrode FP2 are electrically disconnected from the sensor units SP1 and SP2, it may be possible to reduce a parasitic capacitance between the first sensing electrodes IE1-1 to IE1-10 and/or the second sensing electrodes IE2-1 to IE2-8 and the display panel (e.g., see FIG. 6A). In an exemplary embodiment, the first auxiliary electrode FP1 and the second auxiliary electrode FP2 may be floating electrodes.

The input sensing layer ISL may further include auxiliary connection portions BP connecting the first auxiliary electrodes FP1. The auxiliary connection portions BP may be formed from the first conductive layer IS-CL1 shown in FIG. 6A. The auxiliary connection portions BP may be overlapped with the second sensor unit SP2.

As shown in FIGS. 12A and 12B, the input sensing layer ISL may further include a dummy signal line GSL. The dummy signal line GSL may receive a bias voltage of a specific level (e.g., ground voltage). The dummy signal line GSL may be connected to the first auxiliary electrode FP1. In an exemplary embodiment, the dummy signal line GSL may receive electrical signals, which are provided to sense a noise in the sensing region IS-DA. The dummy signal line GSL may be formed from the second conductive layer IS-CL2 of FIG. 6A.

FIG. 12B is an enlarged view illustrating a region, in which four first sensing electrodes IE1-2 to IE1-5 and the rightmost second sensing electrode IE2-8 are disposed. The dummy signal line GSL may be directly connected to the first auxiliary electrode FP1, which is disposed inside each of the odd-numbered first sensing electrodes IE1-3 and IE1-5. The even-numbered first sensing electrodes IE1-2 and IE1-4 may be connected to corresponding signal lines SG1-11 and SG1-12 through signal line connection portions BP-S. The signal line connection portion BP-S may be formed from the first conductive layer IS-CL1 shown in FIG. 6A.

As shown in FIG. 12B, at least one of the first auxiliary electrodes FP1 may include a center portion FP1-10 and extended portions FP1-20 and FP1-30, which are disposed at both sides of the center portion FP1-10 in the second direction DR2. Each of the extended portions FP1-20 and FP1-30 may be connected to a corresponding one of the auxiliary connection portions BP.

Referring to FIG. 12B, the second sensor unit SP2 may include a plurality of the unit regions UA. The second auxiliary electrode FP2 may correspond to several (e.g., four) unit regions UA. The first sensor unit SP1 may also include a plurality of the unit regions UA. The border unit region UA-B may be defined on a border between the first sensor unit SP1 and the first auxiliary electrode FP1.

A plurality of the dummy signal lines GSL may be provided, as shown in FIG. 12C. The number of the dummy signal lines GSL may be the same as the number of the electrodes constituting the first electrode group EG1. Each of the dummy signal lines GSL may be connected to a corresponding one of the first auxiliary electrodes FP1, which are disposed inside the first sensing electrodes.

Figure 13A:
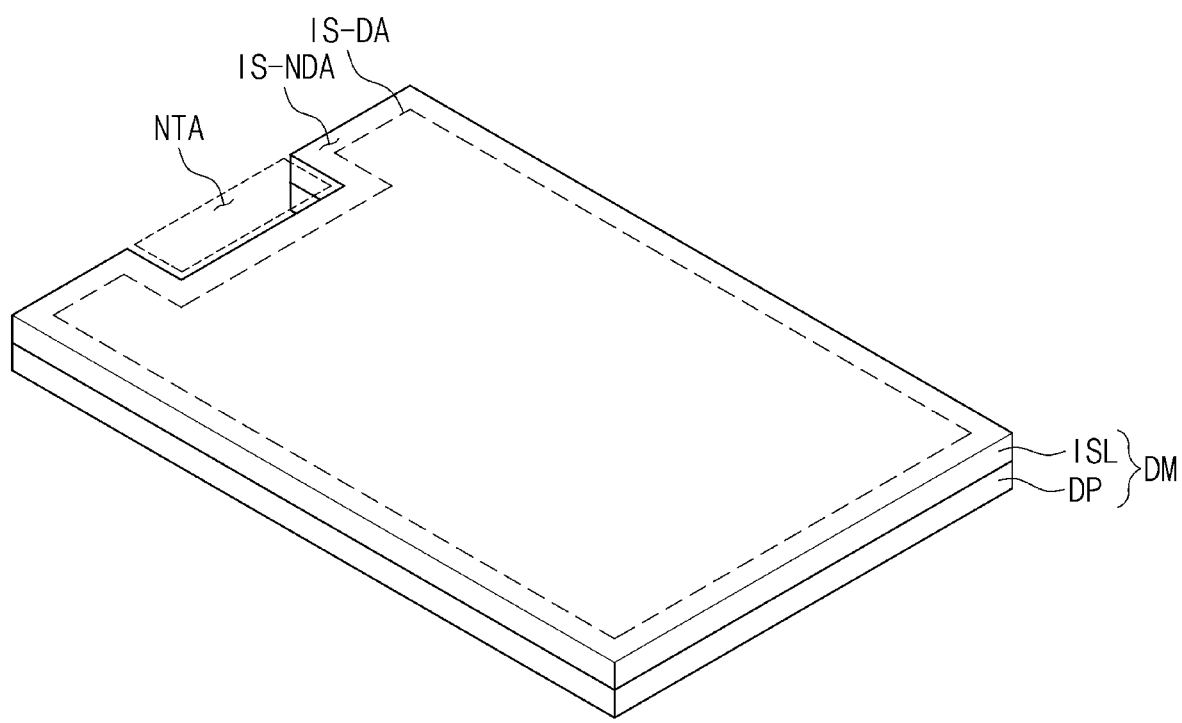
FIG. 13A is a perspective view illustrating a display module according to an exemplary embodiment.
Figure 13B:
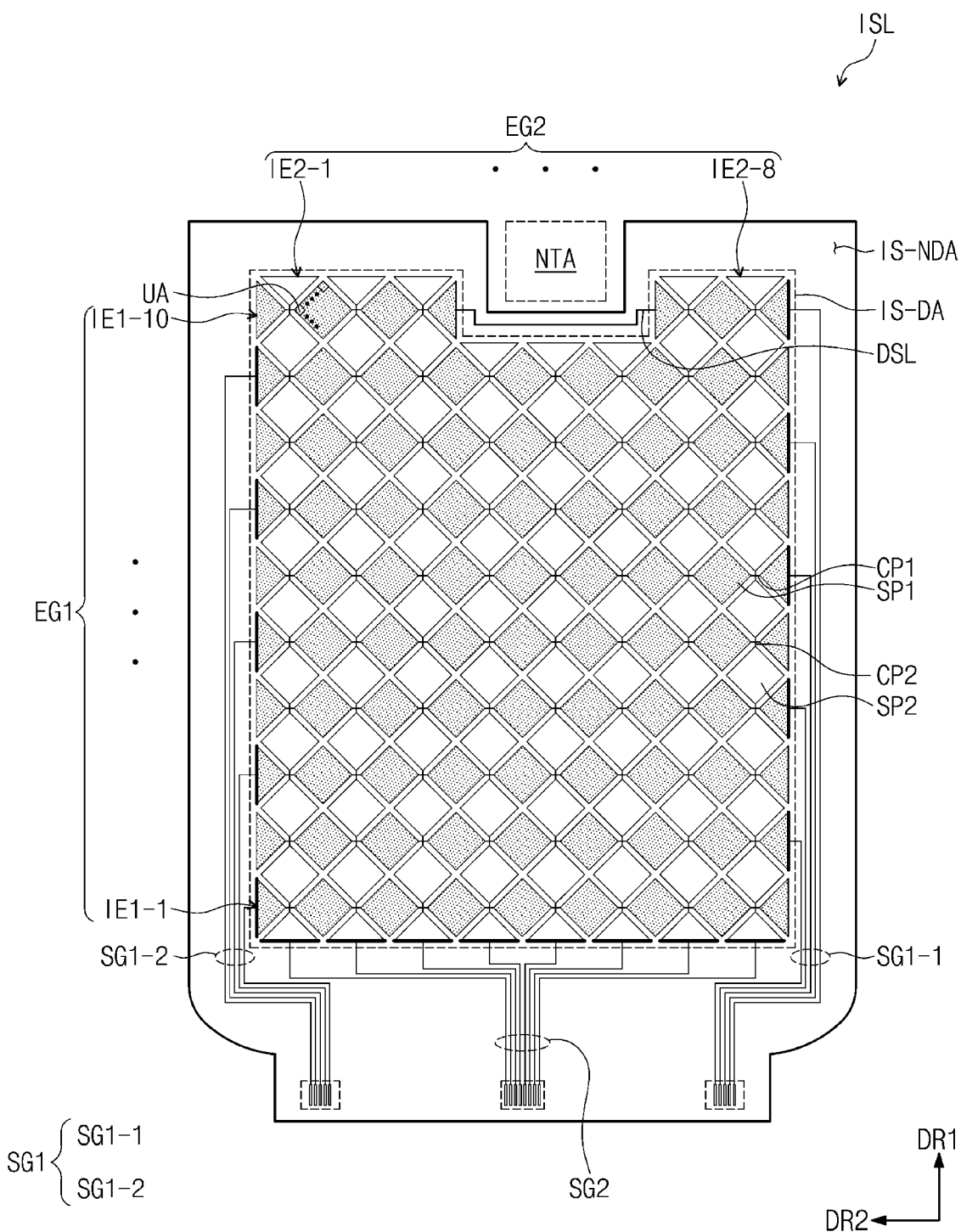
FIG. 13B is a plan view illustrating an input sensing layer according to an exemplary embodiment.
Figure 14A:
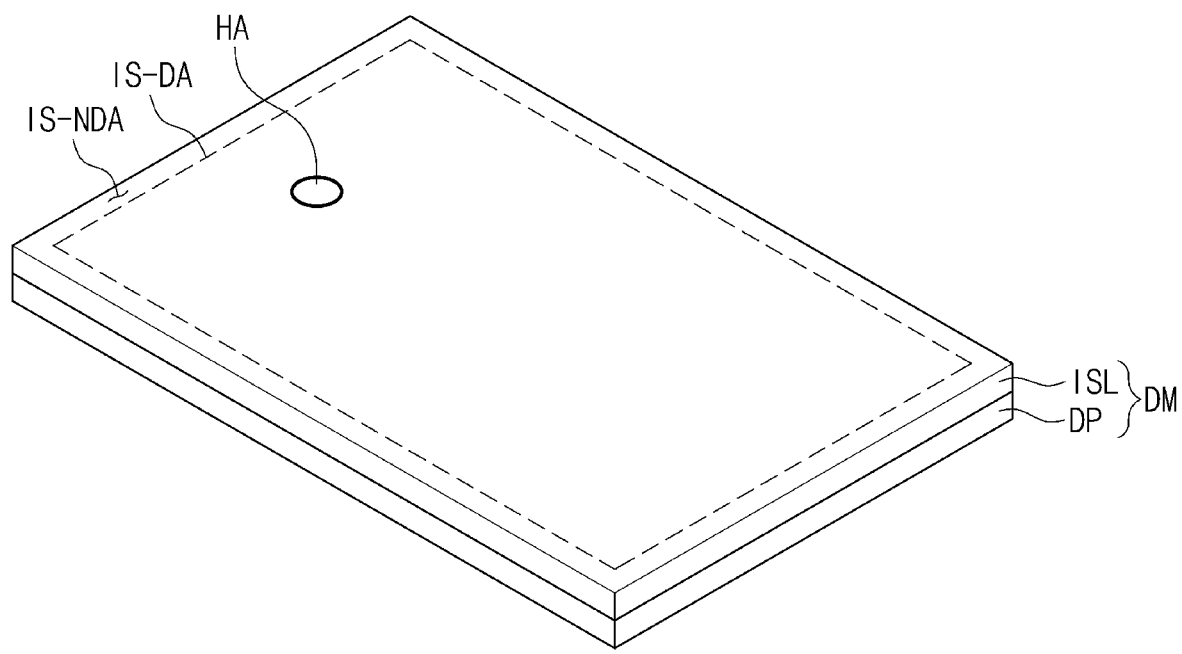
FIG. 14A is a perspective view illustrating a display module according to an exemplary embodiment.
Figure 14B:
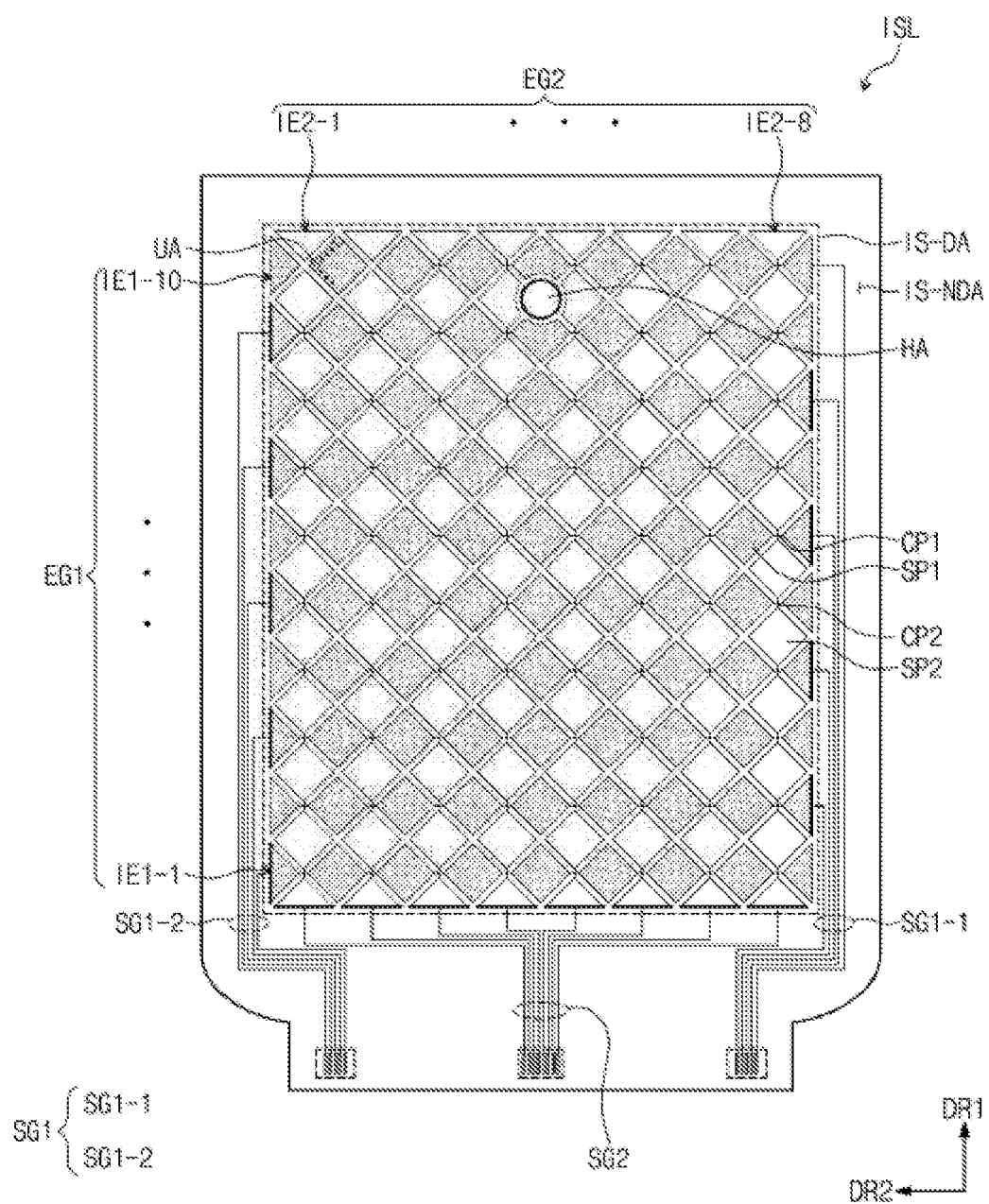
FIG. 14B is a plan view illustrating an input sensing layer according to an exemplary embodiment.

FIG. 13A is a perspective view illustrating the display module DM according to an exemplary embodiment. FIG. 13B is a plan view illustrating the input sensing layer ISL according to an exemplary embodiment. FIG. 14A is a perspective view illustrating the display module DM according to an exemplary embodiment. FIG. 14B is a plan view illustrating the input sensing layer ISL according to an exemplary embodiment. Hereinafter, for concise description, an element previously described with reference to FIGS. 1, 2A, 2B, 2C, 2D, 3A, 3B, 4, 5A, 5B, 6A, 6B, 6C, 6D, 7A, 7B, 7C, 8A, 8B, 8C, 8D, 8E, 8F, 9A, 9B, 9C, 9D, 10A, 10B, 11A, 11B, 11C, 11D, 12A, 12B, and 12C may be identified by the same reference number without repeating an overlapping description thereof.

As shown in FIG. 13A, when viewed in a plan view, a notch region NTA having an inward concave shape may be defined in the display module DM. The notch region NTA may be defined in each of the display panel DP and the input sensing layer ISL, but it is unnecessary for such notch regions NTA to have the same. The notch region NTA may be defined near an intermediate region in the second direction DR2. However, it is unnecessary for the notch region NTA to be disposed at the middle point.

As shown in FIG. 13B, the presence of the notch region NTA may lead to a change in shape of the first and second electrode groups EG1 and EG2. The disposition and arrangement of the first signal line group SG1 and the second signal line group SG2 may be substantially the same as those in the input sensing layer ISL of FIG. 6B.

Since the notch region NTA is formed, the tenth electrode IE1-10 may be divided into two portions, as shown in FIG. 13B. The two portions of the tenth electrode IE1-10 may be connected to each other through a dummy connection line DSL. The fourth to sixth electrode IE2-4 to IE2-6 of the second electrode group EG2 may have a length shorter than that of other electrodes.

As shown in FIG. 14A, when viewed in a plan view, a signal transmission region HA may be defined in the display module DM. The signal transmission region HA may be defined by partially or fully removing a partial region of each of the display panel DP and the input sensing layer ISL. It is unnecessary for the signal transmission regions HA in the display panel DP and the input sensing layer ISL to be the same. The signal transmission region HA may be a path, through which an optical signal passes. A plurality of the signal transmission regions HA may be defined in the display module DM.

The signal transmission region HA of the display panel DP may be formed by removing at least a portion of the base layer BL and the circuit device layer DP-CL, the display element layer DP-OLED, and the upper insulating layer TFL, which are disposed on the base layer BL. The signal transmission region HA of the input sensing layer ISL may be a region, from which the sensor units SP1 and SP2 are removed.

As shown in FIG. 14B, the presence of the signal transmission region HA may lead to a change in shape of the first and second electrode groups EG1 and EG2. The disposition and arrangement of the first signal line group SG1 and the second signal line group SG2 may be substantially the same as those in the input sensing layer ISL of FIG. 6B.

The signal transmission region HA of the input sensing layer ISL may be disposed in a crossing region of the first and second electrode groups EG1 and EG2. Here, a dummy connection line may be disposed near the signal transmission region HA of the input sensing layer ISL. For example, the dummy connection line may form a detour near the signal transmission region HA, thereby connecting the disconnected electrodes of the first and second electrode groups EG1 and EG2 to each other.

The unit region UA described with reference to FIGS. 7A, 7B, 7C, 8A, 8B, 8C, 8D, 8E, 8F, 9A, 9B, 9C, 9D, 10A, and 10B may be applied to the sensing electrode of the first and second electrode groups EG1 and EG2 shown in FIGS. 13A, 13B, 14A, and 14B.

According to an exemplary embodiment, a mesh line has cutting points, which are respectively disposed in a first direction and a second direction with respect to an emission region. Thus, it may be possible to reduce a variation in visibility of the mesh line. The cutting points of the mesh line may have high reflectance to a source light, compared with other regions of the mesh line, and the brightness recognized by a user may increase in a direction or viewing angle, along which the cutting points are relatively more arranged. The cutting points may be disposed such that they are not concentrated in a specific direction, and thus, it may be possible to reduce a dependence of visibility of the mesh line on a viewing angle.

Border points may be formed on a border between electrodes, and such points may result in a relatively high reflectance issue. Since the cutting points are disposed in the electrode, the border between the electrodes may be hardly recognized. This is because an inner region of the electrode has reflectance similar to that of the border region.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:
1. A display device, comprising:
a display panel comprising a plurality of emission regions comprising first color emission regions, second color emission regions, and third color emission regions; and
an input sensor disposed on the display panel, the input sensor comprising a first sensing electrode and a second sensing electrode insulated from the first sensing electrode,
wherein each of the first and second sensing electrodes comprise mesh lines defining a plurality of mesh openings, the mesh lines comprising:
first mesh lines extending in a first direction;
second mesh lines extending in a second direction crossing the first direction, the second mesh lines crossing the first mesh lines at a plurality of cross points to be electrically connected to each other; and
a plurality of cutting points from which portions of the mesh lines are removed in each of the first and second sensing electrodes and between the first sensing electrode and second sensing electrode, the plurality of cutting points comprising:
first cutting points disposed between the first color emission regions and the third color emission regions in each of the first and second sensing electrodes; and
second cutting points disposed between the second color emission regions and the third color emission regions in each of the first and second sensing electrodes,
wherein the plurality of mesh openings comprise first mesh openings corresponding to the first color emission regions, second mesh openings corresponding to the second color emission regions, and third mesh openings corresponding to the third color emission regions, and
wherein a unit region is defined in each of the first and second sensing electrodes and
in the unit region of each of the first and second sensing electrodes, the first cutting points are defined in the first mesh lines and the second mesh lines and the second cutting points are defined in the first mesh lines and the second mesh lines,
wherein the unit region of each of the first and second sensing electrodes is divided into a first sub-region, a second sub-region, a third sub-region, and a fourth sub-region, and
a number of the cutting points disposed in each of the first sub-region, the second sub-region, the third sub-region, and the fourth sub-region is the same.

2. The display device of claim 1, wherein, in the unit region of each of the first and second sensing electrodes, a number of the first cutting points defined in the first mesh lines is equal to a number of the first cutting points defined in the second mesh lines.

3. The display device of claim 2, wherein, in the unit region of each of the first and second sensing electrodes, a number of the second cutting points defined in the first mesh lines is equal to a number of the second cutting points defined in the second mesh lines.

4. The display device of claim 1, wherein the plurality of emission regions comprise:
an n-th emission row; an (n+1)-th emission row; an (n+2)-th emission row; and an (n+3)-th emission row extending in a third direction, where n is a natural number,
wherein the n-th emission row, the (n+1)-th emission row, the (n+2)-th emission row, and the (n+3)-th emission row are arranged in a fourth direction crossing the third direction, wherein in the n-th emission row, the first color emission regions and the second color emission regions are alternately disposed in the third direction, in the (n+2)-th emission row, the first color emission regions and the second color emission regions are alternately disposed in the third direction, an order of the emission regions disposed in the n-th emission row is different from an order of the emission regions disposed in the (n+2)-th emission row, and the third color emission regions are disposed in each of the (n+1)-th emission row and the (n+3)-th emission row.

5. The display device of claim 4, wherein the emission regions of the n-th emission row and the emission regions of the (n+1)-th emission row are disposed in a staggered manner with respect to each other, the emission regions of the (n+2)-th emission row and the emission regions of the (n+3)-th emission row are disposed in a staggered manner with respect to each other, the emission regions of the n-th emission row and the emission regions of the (n+2)-th emission row are disposed in a staggered manner with respect to each other, and the emission regions of the (n+1)-th emission row and the emission regions of the (n+3)-th emission row are disposed to correspond to each other.

6. The display device of claim 4, wherein the third color emission regions comprise first-shaped emission regions and second-shaped emission regions, which have a shape different from the first-shaped emission regions, in the (n+1)-th emission row, the first-shaped emission regions and the second-shaped emission regions are alternately disposed in the third direction, in the (n+3)-th emission row, the first-shaped emission regions and the second-shaped emission regions are alternately disposed in the third direction, and a disposition order of the emission regions of the (n+1)-th emission row is different from a disposition order of the emission regions of the (n+3)-th emission row.

7. The display device of claim 4, wherein each of the first sub-region, the second sub-region, the third sub-region, and the fourth sub-region comprises emission regions, which are arranged to form a k-by-k matrix, wherein the k-by-k matrix is defined based on the first direction and the second direction, and wherein the k is a natural number coprime to 4.

8. The display device of claim 7, wherein one of the third color emission regions is disposed at a center of the first sub-region and the second sub-region, wherein one of the first color emission regions is disposed at a center of the third sub-region, and wherein one of the second color emission regions is disposed at a center of the fourth sub-region.

9. The display device of claim 8, wherein the first sub-region and the second sub-region are disposed to face each other in the third or fourth direction, wherein, in the first sub-region, the first cutting points are defined in the second mesh lines and the second cutting points are defined in the first mesh lines, and wherein, in the second sub-region, the first cutting points are defined in the first mesh lines and the second cutting points are defined in the second mesh lines.

10. The display device of claim 8, wherein, in the third sub-region, the first cutting points are defined in the first mesh lines and the second mesh lines, and wherein, in the fourth sub-region, the second cutting points are defined in the first mesh lines and the second mesh lines.

11. The display device of claim 7, wherein, the number k is 3, and wherein the number of the cutting points disposed in each of the first sub-region, the second sub-region, the third sub-region, and the fourth sub-region, is 4.

12. The display device of claim 7, wherein, the number k is 5, and wherein number of the cutting points defined in each of the first sub-region, the second sub-region, the third sub-region, and the fourth sub-region, is 12 or 16.

13. The display device of claim 1, wherein a first area of the first color emission regions is larger than a second area of the second color emission regions and a third area of the third color emission regions in plan view, and wherein the second area of the second color emission regions is larger than the third area of the third color emission regions in the plan view.

14. The display device of claim 1, wherein the input sensor further comprises an auxiliary electrode disposed inside the sensing electrode in a plan view, the auxiliary electrode being electrically disconnected to the sensing electrode.

15. The display device of claim 1, wherein the input sensor is disposed directly on the display panel.

16. A display device, comprising:

a display panel comprising a plurality of emission regions comprising first color emission regions, second color emission regions, and third color emission regions; and an input sensor disposed on the display panel, the input sensor comprising a sensing electrode comprising mesh lines defining a plurality of mesh openings, the mesh lines comprising:

first mesh lines extending in a first direction;

second mesh lines extending in a second direction crossing the first direction, the second mesh lines crossing the first mesh lines at a plurality of cross points; and a plurality of cutting points from which a portion of the mesh line is removed, the plurality of cutting points comprising:

first cutting points disposed between the first color emission regions and the third color emission regions; and second cutting points disposed between the second color emission regions and the third color emission regions, wherein the plurality of mesh openings comprise first mesh openings corresponding to the first color emission regions, second mesh openings corresponding to the second color emission regions, and third mesh openings corresponding to the third color emission regions, and wherein, in a unit region of the sensing electrode, the first cutting points are defined in the first mesh lines and the second mesh lines and the second cutting points are defined in the first mesh lines and the second mesh lines, wherein the third color emission regions comprise first-shaped emission regions and second-shaped emission regions, the second-shaped emission regions having a shape different from the first-shaped emission regions, wherein the first-shaped emission regions and the second-shaped emission regions have substantially the same area in a plan view, and wherein the first mesh openings have an area larger than the second mesh openings and the third mesh openings in the plan view, and the second mesh openings have an area larger than the third mesh openings in the plan view.

17. A display device, comprising:
a display panel comprising a plurality of emission rows extending in a first direction and arranged in a second direction crossing the first direction, the plurality of emission rows comprising:
  first color emission regions;
  second color emission regions; and
  third color emission regions; and
an input sensor disposed on the display panel, the input sensor comprising a first sensing electrode and a second sensing electrode insulated from the first sensing electrode,
wherein each of the first and second sensing electrodes comprises:
  first mesh lines extending in the first direction;
  second mesh lines extending in the second direction, the second mesh line crossing the first mesh lines at a plurality of cross points, defining a plurality of mesh openings; and
  a plurality of cutting points defined in the first and second mesh lines in each of the first and second sensing electrodes, the plurality of cutting points comprising:
    first cutting points disposed between the first color emission region and the third color emission regions in each of the first and second sensing electrodes; and
    second cutting points disposed between the second color emission region and the third color emission regions in each of the first and second sensing electrodes,
wherein the plurality of mesh openings comprises:
  first mesh openings corresponding to the first color emission regions;
  second mesh openings corresponding to the second color emission regions; and
  third mesh openings corresponding to the third color emission regions,
wherein each of the first and second sensing electrodes is divided into a plurality of unit regions,
wherein, in each of the plurality of unit regions, the first cutting points are defined in the first mesh lines and the second mesh lines and the second cutting points are defined in the first mesh lines and the second mesh lines, and
wherein the plurality of emission rows comprises: an odd-numbered emission row; and an even-numbered emission row,
in the odd-numbered emission row, the first color emission regions and the third color emission regions are alternately disposed, and
in the even-numbered emission row, the second color emission regions and the third color emission regions are alternately disposed,
wherein the each of the plurality of unit regions is divided into a first sub-region, a second sub-region, a third sub-region, and a fourth sub-region, and
a number of the cutting points disposed in each of the first sub-region, the second sub-region, the third sub-region, and the fourth sub-region is the same.

18. The display device of claim 17, wherein the third color emission regions of the odd-numbered emission row and the third color emission regions of the even-numbered emission row are disposed in a staggered manner with respect to each other.

19. The display device of claim 17, wherein the third color emission regions of the odd-numbered emission row and the third color emission regions of the even-numbered emission row have shapes different from each other.

20. The display device of claim 17, wherein the first sensing electrode extends in a third direction crossing the first direction and the second direction, and
the second sensing electrode extends in a fourth direction crossing the first direction and the second direction.

21. A display device, comprising:
a display panel; and
an input sensor disposed on the display panel, the input sensor comprising a first sensing electrode and a second sensing electrode insulated from the first sensing electrode,
wherein each of the first and second sensing electrodes comprise first mesh lines and second mesh lines respectively extending in a first direction and a second direction crossing the first direction,
wherein the first mesh lines and the second mesh lines crossing each other at a plurality of cross points to be electrically connected to each other, defining a plurality of mesh openings,
wherein the plurality of mesh openings comprises:
  first mesh openings;
  second mesh openings having areas different from the first mesh openings; and
  third mesh openings having areas different from the first mesh openings and the second mesh openings,
wherein the first mesh lines and the second mesh lines comprise a plurality of cutting points defined by removing a portion of the first or second mesh line in each of the first and second sensing electrodes,
wherein the plurality of cutting points comprises:
  first cutting points disposed between the first mesh openings and the third mesh openings in each of the first and second sensing electrodes; and
  second cutting points disposed between the second mesh openings and the third mesh openings in each of the first and second sensing electrodes, and
wherein a unit region is defined in each of the first and second sensing electrodes, and
in the unit region of each of the first and second sensing electrodes, the first cutting points are defined in the first mesh lines and the second mesh lines and the second cutting points are defined in the first mesh lines and the second mesh lines,
wherein the unit region of each of the first and second sensing electrodes is divided into a first sub-region, a second sub-region, a third sub-region, and a fourth sub-region, and
a number of the cutting points disposed in each of the first sub-region, the second sub-region, the third sub-region, and the fourth sub-region is the same.

22. A display device, comprising:
a display panel comprising a plurality of emission rows extending in a first direction and arranged in a second direction crossing the first direction, the plurality of emission rows comprising:
  first color emission regions;
  second color emission regions; and
  third color emission regions; and an input sensor disposed on the display panel, the input sensor comprising a first sensing electrode and a second sensing electrode insulated from the first sensing electrode,
  wherein each of the first and second sensing electrodes comprise:
  first mesh lines extending in the first direction;
  second mesh lines extending in the second direction, the second mesh lines crossing the first mesh lines at a plurality of cross points to be electrically connected to each other, defining a plurality of mesh openings; and
a plurality of cutting points defined in the first mesh lines and the second mesh lines in each of the first and second sensing electrodes, the plurality of cutting points comprising:
  first cutting points disposed between the first color emission region and the third color emission regions in each of the first and second sensing electrodes; and
  second cutting points disposed between the second color emission region and the third color emission regions in each of the first and second sensing electrodes,
wherein the plurality of mesh openings comprises:
  first mesh openings corresponding to the first color emission regions;
  second mesh openings corresponding to the second color emission regions; and
  third mesh openings corresponding to the third color emission regions,
wherein each of the first and second sensing electrodes comprises a first unit region and a second unit region, the first unit region and the second unit region having the same area in a plan view, and
wherein, in each of the first unit region and the second unit region, the first cutting points are defined in the first mesh lines and the second mesh lines, and the second cutting points are defined in the first mesh lines and the second mesh lines,
wherein each of the first unit region and the second unit region is divided into a first sub-region, a second sub-region, a third sub-region, and a fourth sub-region, and
a number of the cutting points disposed in each of the first sub-region, the second sub-region, the third sub-region, and the fourth sub-region is the same.

23. The display device of claim 22, wherein:
  the first sensing electrode extends in the first direction, and
  the second sensing electrodes extends in the second direction.

24. The display device of claim 22, wherein the first sensing electrode is provided in plural, and
  a border line between two adjacent sensing electrodes of the plurality of first sensing electrodes extends in a direction substantially crossing the first direction.

* * * * *